(12) United States Patent
Yamazaki et al.

(10) Patent No.: US 11,728,392 B2
(45) Date of Patent: Aug. 15, 2023

(54) COMPOSITE OXIDE SEMICONDUCTOR AND TRANSISTOR

(71) Applicant: Semiconductor Energy Laboratory Co., Ltd., Atsugi (JP)

(72) Inventors: Shunpei Yamazaki, Setagaya (JP); Yasuharu Hosaka, Tochigi (JP); Yukinori Shima, Tatebayashi (JP); Junichi Koezuka, Tochigi (JP); Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/725,643

(22) Filed: Apr. 21, 2022

(65) Prior Publication Data
US 2022/0246731 A1 Aug. 4, 2022

Related U.S. Application Data

(63) Continuation of application No. 16/926,861, filed on Jul. 13, 2020, now Pat. No. 11,316,016, which is a (Continued)

(30) Foreign Application Priority Data

May 19, 2016 (JP) .................. 2016-100939

(51) Int. Cl.
*H01L 29/24* (2006.01)
*H01L 29/423* (2006.01)
(Continued)

(52) U.S. Cl.
CPC .......... *H01L 29/24* (2013.01); *H01L 29/0692* (2013.01); *H01L 29/1037* (2013.01);
(Continued)

(58) Field of Classification Search
CPC . H01L 29/0692; H01L 29/1037; H01L 29/24; H01L 29/78648; H01L 29/78696;
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

CN 001930692 A 3/2007
CN 101740637 A 6/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Thanh T Nguyen
(74) *Attorney, Agent, or Firm* — Robinson Intellectual Property Law Office; Eric J. Robinson

(57) ABSTRACT

A novel material is provided. A composite oxide semiconductor includes a first region and a second region. The first region contains indium. The second region contains an element M (the element M is one or more of Ga, Al, Hf, Y, and Sn). The first region and the second region are arranged in a mosaic pattern. The composite oxide semiconductor further includes a third region. The element M is gallium. The first region contains indium oxide or indium zinc oxide. The second region contains gallium oxide or gallium zinc oxide. The third region contains zinc oxide.

18 Claims, 30 Drawing Sheets

Related U.S. Application Data continuation of application No. 15/592,712, filed on May 11, 2017, now Pat. No. 10,879,360.

(51) Int. Cl.
- *H01L 29/786* (2006.01)
- *H01L 29/49* (2006.01)
- *H01L 29/06* (2006.01)
- *H01L 29/10* (2006.01)

(52) U.S. Cl.
CPC .... *H01L 29/42384* (2013.01); *H01L 29/4908* (2013.01); *H01L 29/7869* (2013.01); *H01L 29/78648* (2013.01); *H01L 29/78696* (2013.01)

(58) Field of Classification Search
CPC ........... H01L 29/42384; H01L 29/4908; H01L 29/7869
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,049,258 B2 | 5/2006 | Ohsato et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,329,506 B2 | 12/2012 | Akimoto et al. | |
| 8,643,011 B2 | 2/2014 | Akimoto et al. | |
| 8,894,825 B2 | 11/2014 | Yamazaki | |
| 8,940,647 B2 | 1/2015 | Liu et al. | |
| 9,252,288 B2 | 2/2016 | Akimoto et al. | |
| 9,455,337 B2 | 9/2016 | Hodo et al. | |
| 9,472,682 B2 | 10/2016 | Yamazaki et al. | |
| 9,478,603 B2 | 10/2016 | Yamazaki et al. | |
| 9,478,664 B2 | 10/2016 | Yamazaki et al. | |
| 9,478,668 B2 | 10/2016 | Takahashi et al. | |
| 9,583,632 B2 | 2/2017 | Yamazaki | |
| 9,722,056 B2 | 8/2017 | Yamazaki et al. | |
| 9,893,200 B2 | 2/2018 | Akimoto et al. | |
| 10,050,132 B2 | 8/2018 | Yamazaki et al. | |
| 10,374,030 B2 * | 8/2019 | Yamazaki | H01L 29/26 |
| 10,403,763 B2 | 9/2019 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0242403 A1 | 12/2004 | Ohsato et al. | |
| 2005/0017302 A1 | 1/2005 | Hoffman | |
| 2005/0199879 A1 | 9/2005 | Hoffman et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Theiss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0250693 A1 * | 10/2009 | Jeong | H01L 29/7869 438/37 |
| 2009/0278122 A1 | 11/2009 | Hosono et al. | |
| 2009/0280600 A1 | 11/2009 | Hosono et al. | |
| 2010/0025676 A1 | 2/2010 | Yamazaki et al. | |
| 2010/0065844 A1 | 3/2010 | Tokunaga | |
| 2010/0084654 A1 | 4/2010 | Yamazaki et al. | |
| 2010/0092800 A1 | 4/2010 | Itagaki et al. | |
| 2010/0109002 A1 | 5/2010 | Itagaki et al. | |
| 2010/0123130 A1 | 5/2010 | Akimoto et al. | |
| 2012/0248432 A1 * | 10/2012 | Noda | H01L 29/66969 257/E29.296 |
| 2014/0001032 A1 | 1/2014 | Yamazaki | |
| 2014/0110700 A1 | 4/2014 | Hsu et al. | |
| 2014/0346500 A1 | 11/2014 | Yamazaki | |
| 2015/0084043 A1 | 3/2015 | Ishihara et al. | |
| 2015/0187575 A1 | 7/2015 | Yamazaki et al. | |
| 2015/0255029 A1 | 9/2015 | Niikura et al. | |
| 2015/0318171 A1 | 11/2015 | Yamazaki | |
| 2015/0318359 A1 | 11/2015 | Shimomura et al. | |

(56) References Cited

U.S. PATENT DOCUMENTS

| | | | |
|---|---|---|---|
| 2015/0372022 A1* | 12/2015 | Okazaki | H01L 27/1225 257/43 |
| 2016/0118254 A1 | 4/2016 | Yamazaki | |
| 2016/0190346 A1 | 6/2016 | Kawata et al. | |
| 2016/0225620 A1 | 8/2016 | Yamazaki | |
| 2016/0247902 A1 | 8/2016 | Yamazaki | |
| 2017/0033205 A1 | 2/2017 | Yamazaki et al. | |
| 2017/0250077 A1 | 8/2017 | Yamazaki | |
| 2017/0350002 A1* | 12/2017 | Yamazaki | C01G 19/02 |
| 2018/0350798 A1* | 12/2018 | Dewey | H01L 29/7851 |

FOREIGN PATENT DOCUMENTS

| | | |
|---|---|---|
| EP | 1733433 A | 12/2006 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-529117 | 10/2007 |
| JP | 2010-027808 A | 2/2010 |
| JP | 2010-153802 A | 7/2010 |
| JP | 2010-199307 A | 9/2010 |
| JP | 2013-084735 A | 5/2013 |
| JP | 2014-030000 A | 2/2014 |
| JP | 2014-175446 A | 9/2014 |
| JP | 2015-038980 A | 2/2015 |
| JP | 2015-144259 A | 8/2015 |
| JP | 2015-188118 A | 10/2015 |
| JP | 2015-189631 A | 11/2015 |
| JP | 201 6-021562 A | 2/2016 |
| JP | 2016-056446 A | 4/2016 |
| JP | 2016-066046 A | 4/2016 |
| JP | 2016-066776 A | 4/2016 |
| KR | 2007-0006770 A | 1/2007 |
| KR | 2010-0056970 A | 5/2010 |
| KR | 2015-0125555 A | 11/2015 |
| KR | 2015-0126272 A | 11/2015 |
| TW | 200534367 | 10/2005 |
| TW | 201036160 | 10/2010 |
| WO | WO-2004/114391 | 12/2004 |
| WO | WO-2005/093847 | 10/2005 |
| WO | WO-2014/112376 | 7/2014 |
| WO | WO-2015/097586 | 7/2015 |

OTHER PUBLICATIONS

Asaoka.Y et al., "29.1 :Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

CHO.D et al., "21,2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous ln—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the IN2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, p. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 DIGEST, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Wager.J, "Oxide TFTs: A Progress Report", Information Display, 2016, vol. 32, No. 1, pp. 16-21.

International Search Report (Application No. PCT/IB2017/052714) dated Aug. 22, 2017.

Written Opinion (Application No. PCT/IB2017/052714) dated Aug. 22, 2017.

Kamiya.T et al., "Electron-Beam-Induced Crystallization of Amorphous In—Ga—Zn—O Thin Films Fabricated by UHV Sputtering", IDW '13 : Proceedings of the 20th International Display Workshops, Dec. 4, 2013, pp. 280-281.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Yamazaki.S et al., "Back-channel-etched thin-film transistor using c-axis-aligned crystal In—Ga—Zn oxide", J. Soc. Inf. Display (Journal of the Society for Information Display), 2014, vol. 22, No. 1, pp. 55-67.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Hosemann.R, "Crystalline and Paracrystalline Order in High Polymers", J. Appl. Phys. (Journal of Applied Physics) , 1963, vol. 34, No. 1, pp. 25-41.

* cited by examiner

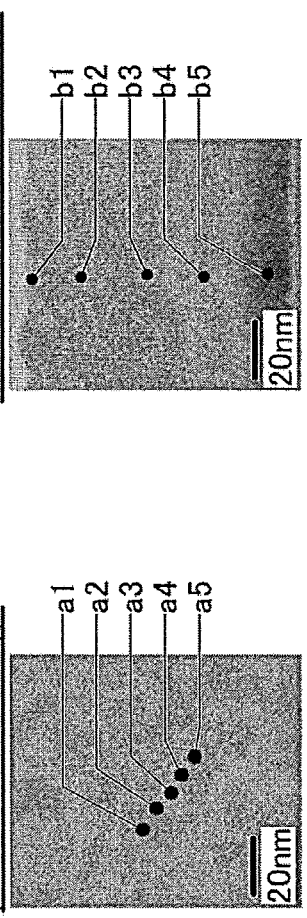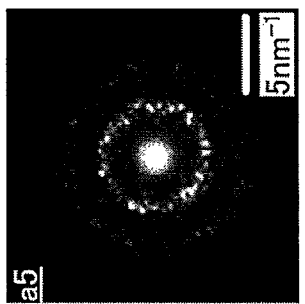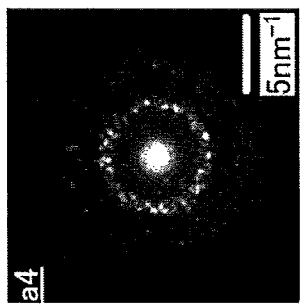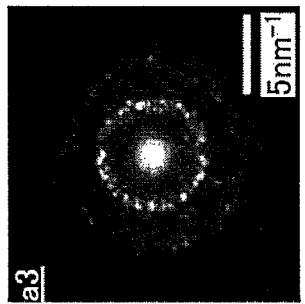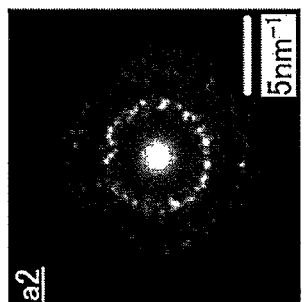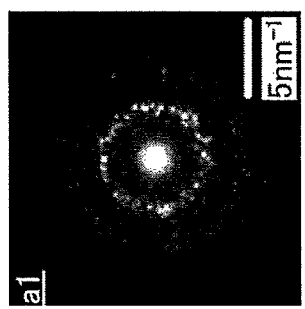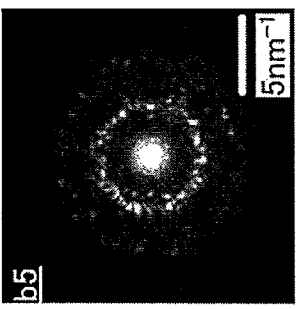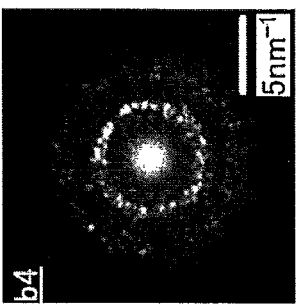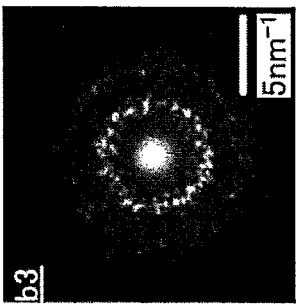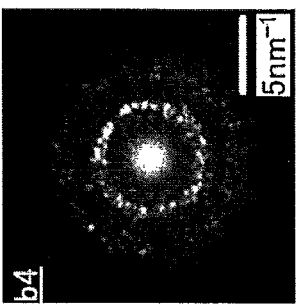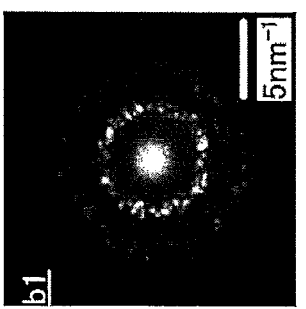

FIG. 19A
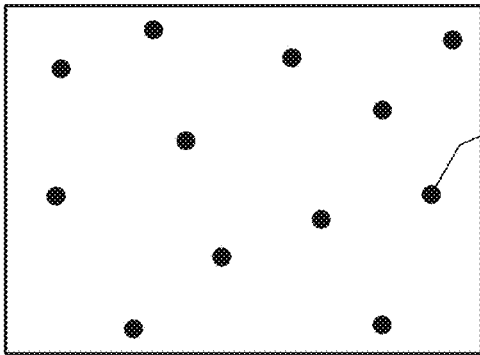
lattice point
FIG. 19B
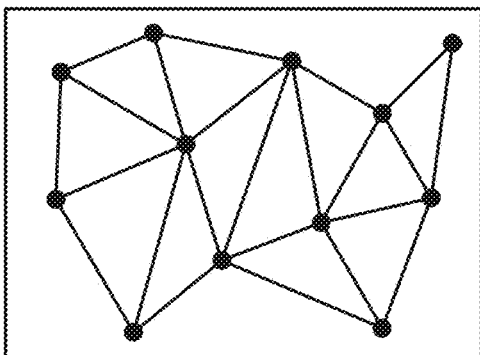
FIG. 19C
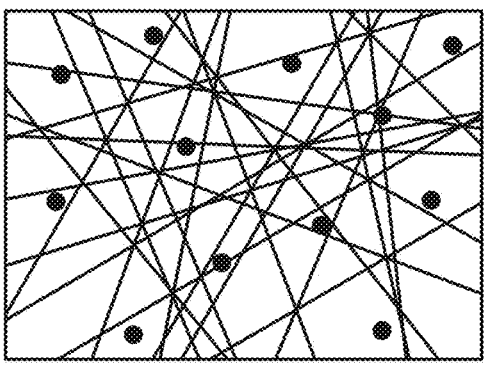
FIG. 19D
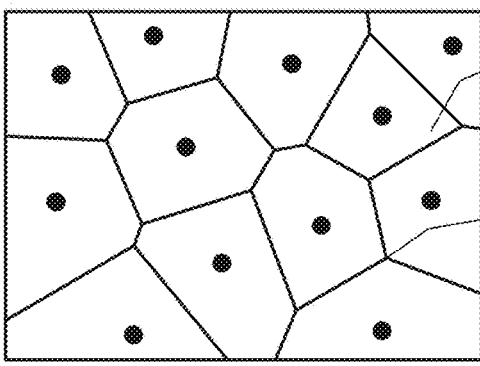
Voronoi region
Voronoi point
FIG. 19E
Start
↓
S111 Extract lattice point group
↓
S112 Connect adjacent lattice points with segments
↓
S113 Draw perpendicular bisectors of segments
↓
S114 Extract points (Voronoi points) where three perpendicular bisectors intersect
↓
S115 Connect adjacent Voronoi points with segments to form polygonal Voronoi regions
↓
End

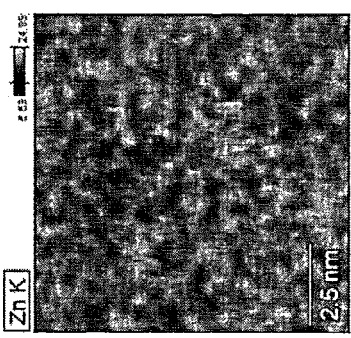
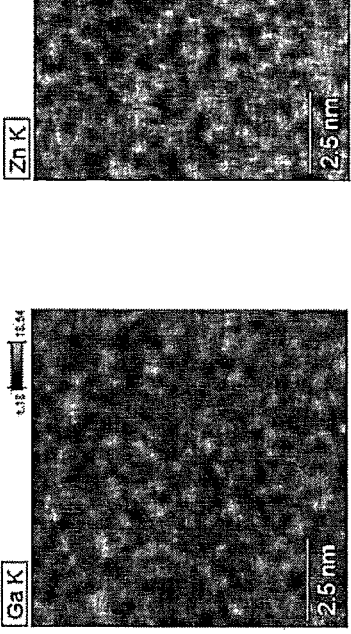
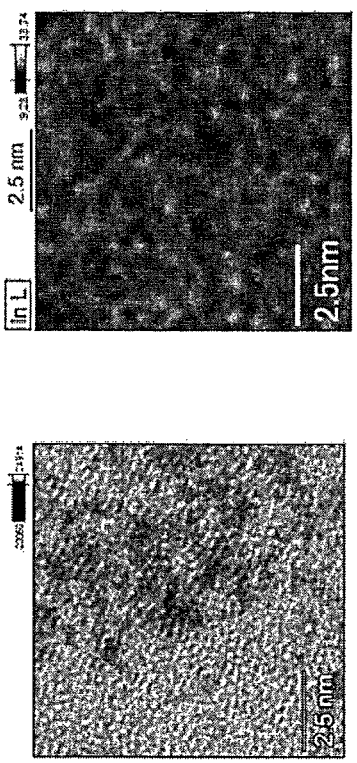
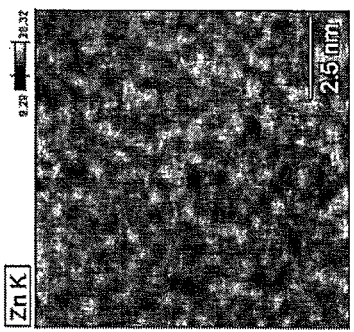
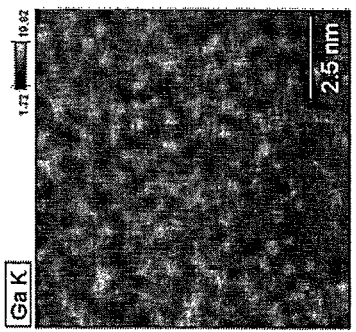
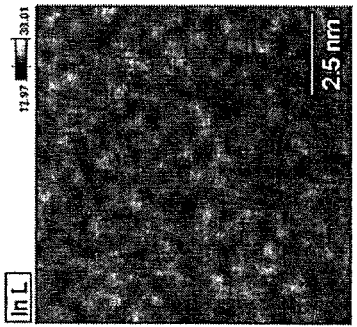
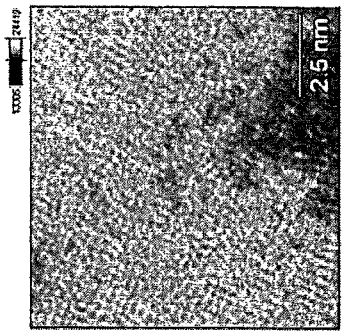
FIG. 21A FIG. 21B FIG. 21C FIG. 21D FIG. 21E FIG. 21F FIG. 21G FIG. 21H 10 nm 10 nm 10 nm 10 nm 10 nm 10 nm

COMPOSITE OXIDE SEMICONDUCTOR AND TRANSISTOR

TECHNICAL FIELD

The present invention relates to an object, a method, or a manufacturing method. The present invention relates to a process, a machine, manufacture, or a composition of matter. One embodiment of the present invention particularly relates to an oxide semiconductor or a manufacturing method of the oxide semiconductor. One embodiment of the present invention relates to a semiconductor device, a display device, a liquid crystal display device, a light-emitting device, a power storage device, a memory device, a method for driving them, or a method for manufacturing them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

BACKGROUND ART

Non-Patent Document 1 discloses a solid solution range in the $In_2O_3$—$Ga_2ZnO_4$—ZnO system.

Furthermore, a technique in which a transistor is fabricated using an In—Ga—Zn-based oxide semiconductor is disclosed (for example, see Patent Document 1).

Non-Patent Document 2 discusses a structure where an oxide semiconductor consisting of a dual-layer stack of indium zinc oxide and IGZO is used as an active layer of a transistor.

REFERENCE

Patent Document

[Patent Document 1] Japanese Published Patent Application No. 2007-96055

Non-Patent Documents

[Non-Patent Document 1] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315.

[Non-Patent Document 2] John F. Wager, "Oxide TFTs: A Progress Report", Information Display 1/16, SID 2016, January/February 2016, Vol. 32, No. 1, pp. 16-21.

DISCLOSURE OF INVENTION

In Non-Patent Document 2, a channel-protective bottom-gate transistor achieves high field-effect mobility ($\mu$=62 $cm^2V^{-1}s^{-1}$). An active layer of the transistor is a dual-layer stack of indium zinc oxide and IGZO, and the thickness of the indium zinc oxide where a channel is formed is 10 nm. However, the S value (the subthreshold swing (SS)), which is one of transistor characteristics, is as large as 0.41 V/decade. Moreover, the threshold voltage ($V_{th}$), which is also one of transistor characteristics, is −2.9 V, which means that the transistor has a normally-on characteristic.

In view of the above problem, an object of one embodiment of the present invention is to provide a novel oxide semiconductor. Another object is to give favorable electrical characteristics to a semiconductor device. Another object of the present invention is to provide a highly reliable semiconductor device. Another object is to provide a semiconductor device with a novel structure. Another object is to provide a display device with a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a composite oxide semiconductor including a first region and a second region. The first region contains indium. The second region contains an element M (the element M is one or more of Ga, Al, Hf, Y, and Sn). The first region and the second region are arranged in a mosaic pattern.

The composite oxide semiconductor having the above composition further includes a third region. The element M is gallium. The first region contains indium oxide or indium zinc oxide. The second region contains gallium oxide or gallium zinc oxide. The third region contains zinc oxide.

In the above composition, the first region, the second region, or the third region has a blurred periphery and a cloud-like composition.

In the composite oxide semiconductor having the above composition, a diameter of the second region is greater than or equal to 0.5 nm and less than or equal to 10 nm, or a neighborhood thereof.

In the composite oxide semiconductor having the above composition, a diameter of the second region is greater than or equal to 1 nm and less than or equal to 2 nm, or a neighborhood thereof.

In the composite oxide semiconductor having the above composition, an atomic ratio of the indium to the gallium and the zinc is 4:2:3 or a neighborhood thereof.

In the composite oxide semiconductor having the above composition, an atomic ratio of the indium to the gallium and the zinc is 5:1:6 or a neighborhood thereof.

In the composite oxide semiconductor having the above composition, an atomic ratio of the indium to the gallium and the zinc is 1:1:1 or a neighborhood thereof.

Another embodiment of the present invention is a transistor including the composite oxide semiconductor having the above composition.

According to one embodiment of the present invention, a novel oxide semiconductor can be provided. According to one embodiment of the present invention, a semiconductor device can be provided with favorable electrical characteristics. A highly reliable semiconductor device can be provided. A semiconductor device with a novel structure can be provided. A display device with a novel structure can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 16A to 16L show a plan-view TEM image, a cross-sectional TEM image, and electron diffraction patterns of a sample of Example;

FIGS. 19A to 19E illustrate a method for forming a Voronoi diagram;

FIGS. 21A to 21H show a plan-view TEM image, a cross-sectional TEM image, and EDX mapping images of a sample of Example;

BEST MODE FOR CARRYING OUT THE INVENTION

Figure 1:
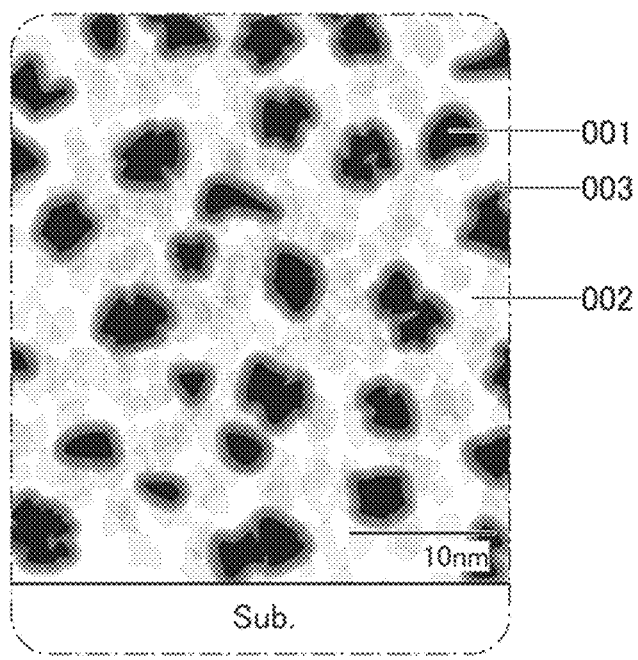
FIG. 1 is a conceptual diagram of a composition of an oxide semiconductor.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an "object having any electric function". There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, a "silicon oxynitride film" refers to a film that includes oxygen at a higher proportion than nitrogen, and a "silicon nitride oxide film" refers to a film that includes nitrogen at a higher proportion than oxygen.

In the description of modes of the present invention in this specification and the like with reference to the drawings, the same components in different drawings are commonly denoted by the same reference numeral in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, the terms "film" and "layer" can be interchanged with each other depending on the case. For example, the term "conductive layer" can be changed into the term "conductive film" in some cases. Also, the term "insulating film" can be changed into the term "insulating layer" in some cases.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that in this specification and the like, "In:Ga:Zn=4:2:3 or a neighborhood of In:Ga:Zn=4:2:3" refers to an atomic ratio where, when In is 4 with respect to the total number of atoms, Ga is greater than or equal to 1 and less than or equal to 3 (1≤Ga≤3) and Zn is greater than or equal to 2 and less than or equal to 4 (2≤Zn≤4). "In:Ga:Zn=5:1:6 or a neighborhood of In:Ga:Zn=5:1:6" refers to an atomic ratio where, when In is 5 with respect to the total number of atoms, Ga is greater than 0.1 and less than or equal to 2 (0.1<Ga≤2) and Zn is greater than or equal to 5 and less than or equal to 7 (5≤Zn≤7). "In:Ga:Zn=1:1:1 or a neighborhood of In:Ga:Zn=1:1:1" refers to an atomic ratio where, when In is 1 with respect to the total number of atoms, Ga is greater than 0.1 and less than or equal to 2 (0.1<Ga≤2) and Zn is greater than 0.1 and less than or equal to 2 (0.1<Zn≤2).

Embodiment 1

In this embodiment, an oxide semiconductor material of one embodiment of the present invention will be described.

Note that an oxide semiconductor material preferably contains at least indium. In particular, indium and zinc are preferably contained. In addition, gallium, aluminum, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor material contains indium, an element M, and zinc is considered. The element M is gallium, aluminum, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M. Note that the terms of the atomic ratio of indium to the element M and zinc in the oxide semiconductor are denoted by [In], [M], and [Zn], respectively.

<Composition of Oxide Semiconductor Material>

Figure 2:
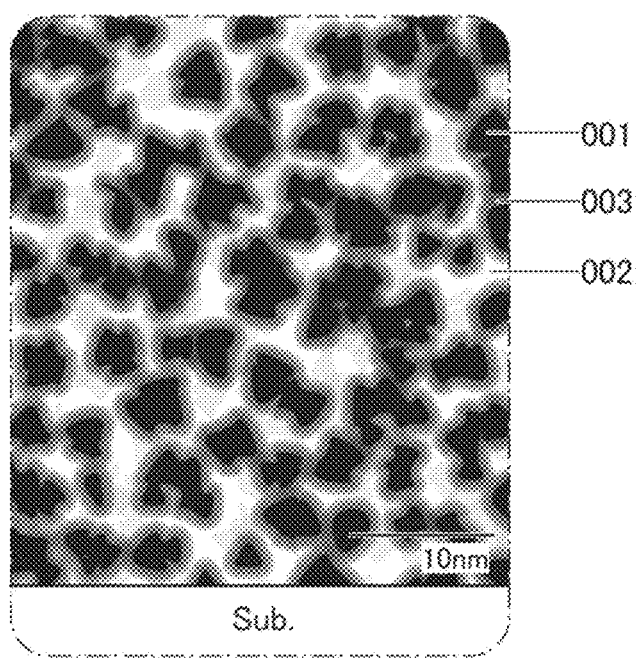
FIG. 2 is a conceptual diagram of a composition of an oxide semiconductor.

FIG. 1 and FIG. 2 are conceptual diagrams of oxide semiconductor materials of the present invention. In this specification, an oxide semiconductor of one embodiment of the present invention is defined as a cloud-aligned composite oxide semiconductor (CAC-OS).

As illustrated in FIG. 1, the CAC has, for example, a composition in which elements included in the oxide semiconductor material are unevenly distributed, and regions 001, regions 002, and regions 003 mainly including the respective elements are formed. The regions 001, 002, and 003 are mixed to form a mosaic pattern. In other words, in the composition of the CAC-OS, materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

For example, an In-M-Zn oxide with the CAC composition has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and an oxide of the element M ($MO_{X3}$, where X3 is a real number greater than 0) or an M-Zn oxide ($M_{X4}Zn_{Y4}O_{Z4}$, where X4, Y4, and Z4 are real numbers greater than 0), and a mosaic pattern is formed. $InO_{X1}$ or $In_{X2}Zn_{Y2}O_{Z2}$ forming the mosaic pattern is uniformly distributed in the film. This composition is also referred to as a cloud-like composition.

Here, suppose that the concept of FIG. 1 is applied to an In-M-Zn oxide with the CAC composition. In this case, it can be said that the region 001 is a region including $MO_{X3}$ as a main component, the region 002 is a region including $In_{X2}Zn_{Y2}O_{Z2}$ or $InO_{X1}$ as a main component, and the region 003 is a region including at least Zn. Surrounding portions of the region including $MO_{X3}$ as a main component, the region including $In_{X2}Zn_{Y2}O_{Z2}$ or $InO_{X1}$ as a main component, and the region including at least Zn are unclear (blurred), so that boundaries are not clearly observed in some cases.

That is, the In-M-Zn oxide with the CAC composition is a composite oxide semiconductor with a composition in which a region including $MO_{X3}$ as a main component and a region including $In_{X2}Zn_{Y2}O_{Z2}$ or $InO_{X1}$ as a main component are mixed. Thus, the oxide semiconductor material is referred to as a composite oxide semiconductor in some cases. Note that in this specification, for example, when the atomic ratio of In to the element M in the region 002 is greater than the atomic ratio of In to the element M in the region 001, the region 002 has higher In concentration than the region 001.

Note that in the CAC composition, a stacked-layer structure including two or more films with different atomic ratios is not included. For example, a two-layer structure of a film including In as a main component and a film including Ga as a main component is not included.

Specifically, of In—Ga—Zn oxide (hereinafter also referred to as IGZO), CAC-IGZO is described. The CAC- IGZO is an oxide material in which materials are separated into $InO_{X1}$ or $In_{X2}Zn_{Y2}O_{Z2}$, and gallium oxide ($GaO_{X5}$, where X5 is a real number greater than 0) or gallium zinc oxide ($Ga_{X6}Zn_{Y6}O_{Z6}$, where X6, Y6, and Z6 are real numbers greater than 0), for example, and a mosaic pattern is formed. $InO_{X1}$ or $In_{X2}Zn_{Y2}O_{Z2}$ forming the mosaic pattern is a cloud-like oxide material.

That is, the CAC-IGZO is a composite oxide semiconductor with a composition in which a region including $GaO_{X5}$ as a main component and a region including $In_{X2}Zn_{Y2}O_{Z2}$ or $InO_{X1}$ as a main component are mixed. Surrounding portions of the region including $GaO_{X5}$ as a main component and the region including $In_{X2}Zn_{Y2}O_{Z2}$ or $InO_{X1}$ as a main component are unclear (blurred), so that boundaries are not clearly observed in some cases.

Note that the sizes of the regions 001 to 003 can be obtained by EDX mapping. For example, the diameter of the region 001 is greater than or equal to 0.5 nm and less than or equal to 10 nm, or greater than or equal to 1 nm and less than or equal to 2 nm in the EDX mapping image of a cross-sectional photograph in some cases. The density of an element which is a main component is gradually lowered from the central portion of the region toward the surrounding portion. For example, when the number (abundance) of atoms of an element countable in an EDX mapping image gradually changes from the central portion toward the surrounding portion, the surrounding portion of the region is unclear (blurred) in the EDX mapping of the cross-sectional photograph. For example, from the central portion toward the surrounding portion in the region including $GaO_{X5}$ as a main component, the number of Ga atoms gradually reduces and the number of Zn atoms gradually increases, so that the region including $Ga_{X6}Zn_{Y6}O_{Z6}$ as a main component gradually appears. Accordingly, the surrounding portion of the region including $GaO_{X5}$ as a main component is unclear (blurred) in the EDX mapping image.

Here, a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a layered crystal structure in which a plurality of IGZO nanocrystals have c-axis alignment and are connected in the a-b plane direction without alignment.

In contrast, the crystal structure is a secondary element for the CAC-IGZO. In this specification, CAC-IGZO can be defined as an oxide material containing In, Ga, Zn, and O in the state where a plurality of regions including Ga as a main component and a plurality of regions including In as a main component are each dispersed randomly in a mosaic pattern.

For example, in the conceptual diagram of FIG. 1, the region 001 and the region 002 correspond to a region including Ga as a main component and a region including In as a main component, respectively. In addition, the region 003 corresponds to a region including Zn. Note that the region including Ga as a main component and the region including In as a main component may each be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that a boundary is not clearly observed in some cases.

In addition, FIG. 2 is a modification example of the conceptual diagram of FIG. 1. As shown in FIG. 2, the shapes and densities of the regions 001, 002, and 003 may change depending on formation conditions of the CAC-OS.

The crystallinity of the CAC-IGZO can be analyzed by electron diffraction. For example, a ring-like region with high luminance is observed in an electron diffraction pattern image. Furthermore, a plurality of spots are observed in the ring-like region in some cases.

As described above, CAC-IGZO has a structure different from that of an IGZO compound in which metal elements are evenly distributed, and has characteristics different from those of the IGZO compound. That is, in CAC-IGZO, regions including $GaO_{X5}$ or the like as a main component and regions including $In_{X2}Zn_{Y2}O_{Z2}$ or $InO_{X1}$ as a main component are separated to form a mosaic pattern. Accordingly, when CAC-IGZO is used for a semiconductor element, the property derived from $GaO_{X5}$ or the like and the property derived from $In_{X2}Zn_{Y2}O_{Z2}$ or $InO_{X1}$ complement each other, whereby high on-state current ($I_{on}$), high field-effect mobility (4 and low off-state current ($I_{off}$) can be achieved.

Note that the conduction mechanism of a semiconductor element including CAC-IGZO that achieves high on-state current ($I_{on}$), high field-effect mobility ($\mu$), and low off-state current ($I_{off}$) can be presumed by a random-resistance-network model in percolation theory.

A semiconductor element including CAC-IGZO has high reliability. Thus, CAC-IGZO is suitably used in a variety of semiconductor devices typified by a display.

<Transistor Including Oxide Semiconductor Material>

Next, the case where the oxide material is used for an oxide semiconductor in a transistor is described.

With the use of the oxide material in a transistor, the transistor can have high field-effect mobility and high switching characteristics. In addition, the transistor can have high reliability.

A semiconductor with a low carrier density is preferably used in a transistor. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide semiconductor has few carrier generation sources, and thus can have a low carrier density. A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor will be described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor which contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor including an oxide semiconductor which contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy (Vo), in some cases. Due to entry of hydrogen into the oxygen vacancy (Vo), an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

Note that oxygen vacancies (Vo) in the oxide semiconductor can be reduced by introduction of oxygen into the oxide semiconductor. That is, the oxygen vacancies (Vo) in the oxide semiconductor disappear when the oxygen vacancies (Vo) are filled with oxygen. Accordingly, diffusion of oxygen in the oxide semiconductor can reduce the oxygen vacancies (Vo) in a transistor and improve the reliability of the transistor.

As a method for introducing oxygen into the oxide semiconductor, for example, an oxide in which oxygen content is higher than that in the stoichiometric composition is provided in contact with the oxide semiconductor. That is, in the oxide, a region including oxygen in excess of that in the stoichiometric composition (hereinafter also referred to as an excess-oxygen region) is preferably formed. In particular, in the case of using an oxide semiconductor in a transistor, an oxide including an excess-oxygen region is provided in a base film, an interlayer film, or the like in the vicinity of the transistor, whereby oxygen vacancies in the transistor are reduced, and the reliability can be improved.

When an oxide semiconductor with sufficiently reduced impurity concentration is used for a channel formation region in a transistor, the transistor can have stable electrical characteristics.

<Method for Forming Oxide Semiconductor Material>

An example of a method for forming the oxide semiconductor material is described below.

The oxide semiconductor is preferably deposited at a temperature higher than or equal to room temperature and lower than 140° C. Note that room temperature includes not only the case where temperature control is not performed but also the case where temperature control is performed, e.g., the case where a substrate is cooled.

As a sputtering gas, a rare gas (typically argon), oxygen, or a mixed gas of a rare gas and oxygen is used as appropriate. When the mixed gas is used, the proportion of the oxygen gas in the whole deposition gas is higher than or equal to 5% and lower than or equal to 30%, preferably higher than or equal to 7% and lower than or equal to 20%.

When the sputtering gas contains oxygen, oxygen can be added to a film under the oxide semiconductor and an excess-oxygen region can be provided at the same time as the deposition of the oxide semiconductor. In addition, increasing the purity of a sputtering gas is necessary. For example, when a gas which is highly purified to have a dew point of −40° C. or lower, preferably −80° C. or lower, further preferably −100° C. or lower, still further preferably −120° C. or lower, is used as a sputtering gas, i.e., the oxygen gas or the argon gas, entry of moisture or the like into the oxide semiconductor can be minimized.

In the case where the oxide semiconductor is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor, as much as possible. Alternatively, a turbo molecular pump and a cold trap are preferably combined so as to prevent a backflow of a gas, especially a gas containing carbon or hydrogen from an exhaust system to the inside of the chamber.

As a target, an In—Ga—Zn metal oxide target can be used. For example, a metal oxide target where an atomic ratio [In]:[Ga]:[Zn] is 4:2:4.1, 5:1:7, or a neighborhood thereof is preferably used.

In the sputtering apparatus, the target may be rotated or moved. For example, a magnet unit is oscillated vertically and/or horizontally during the deposition, whereby the composite oxide semiconductor of the present invention can be formed. For example, the target may be rotated or moved with a beat (also referred to as rhythm, pulse, frequency, period, cycle, or the like) of greater than or equal to 0.1 Hz and less than or equal to 1 kHz. Alternatively, the magnet unit may be oscillated with a beat of greater than or equal to 0.1 Hz and less than or equal to 1 kHz.

The oxide semiconductor of the present invention can be formed, for example, in the following manner: a mixed gas of oxygen and a rare gas in which the proportion of oxygen is approximately 10% is used; the substrate temperature is 130° C.; and an In—Ga—Zn metal oxide target where an atomic ratio [In]:[Ga]:[Zn] is 4:2:4.1 is oscillated during the deposition.

The structure described in this embodiment can be used in appropriate combination with any of the structures described in the other embodiments or examples.

Embodiment 2

In this embodiment, semiconductor devices each including the oxide material of embodiments of the present invention, and manufacturing methods thereof will be described with reference to FIGS. 3A to 3C, FIGS. 4A to 4C, FIGS. 5A and 5B, FIGS. 6A to 6D, FIGS. 7A to 7C, FIGS. 8A to 8C, FIGS. 9A to 9C, FIGS. 10A to 10C, FIGS. 11A to 11C, and FIGS. 12A to 12C.

Structure Example 1 of Transistor

Figure 3A:
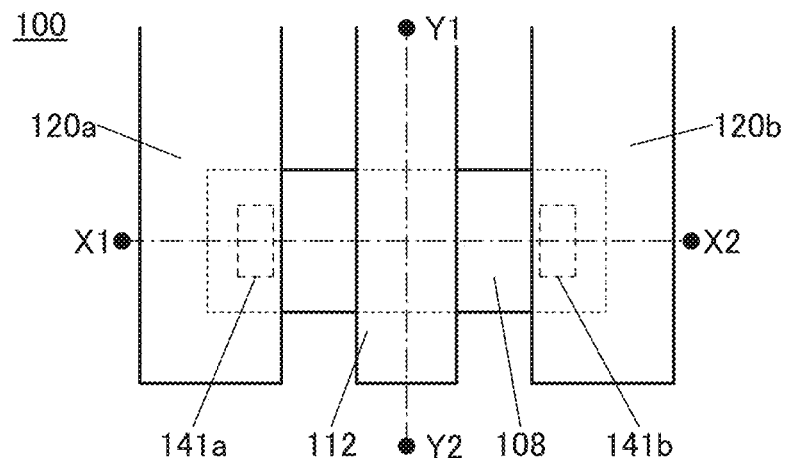
FIGS. 3A to 3C are a top view and cross-sectional views illustrating a semiconductor device.
Figure 3B:
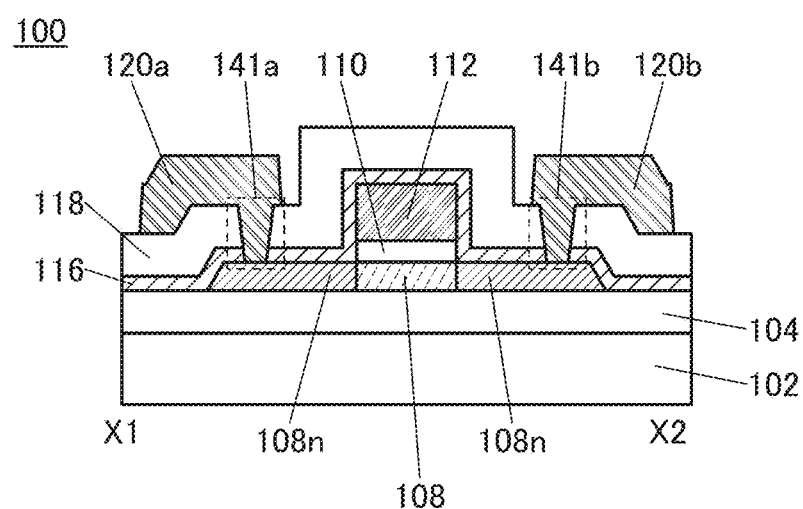
Figure 3C:
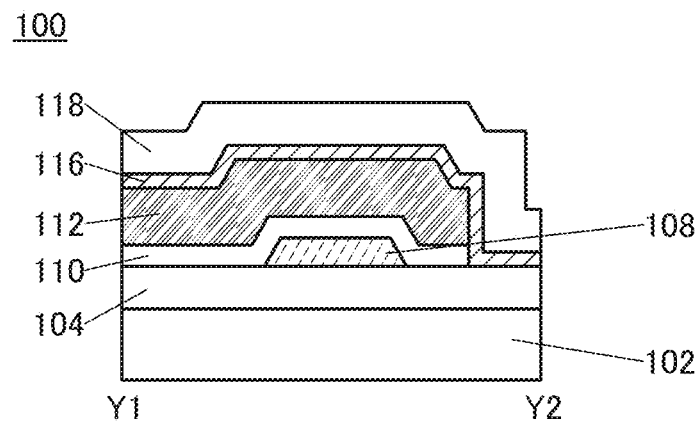

FIG. 3A is a top view of a transistor 100 that is a semiconductor device including the oxide material of one embodiment of the present invention. FIG. 3B is a cross-sectional view taken along dashed-dotted line X1-X2 in FIG. 3A. FIG. 3C is a cross-sectional view taken along dashed-dotted line Y1-Y2 in FIG. 3A. Note that in FIG. 3A, some components of the transistor 100 (e.g., an insulating film functioning as a gate insulating film) are not illustrated to avoid complexity. The direction of the dashed-dotted line X1-X2 may be called a channel length direction, and the direction of the dashed-dotted line Y1-Y2 may be called a channel width direction. As in FIG. 3A, some components are not illustrated in some cases in top views of transistors described below.

The transistor 100 illustrated in FIGS. 3A to 3C is what is called a top-gate transistor.

The transistor 100 includes an insulating film 104 over a substrate 102, an oxide semiconductor film 108 over the insulating film 104, an insulating film 110 over the oxide semiconductor film 108, a conductive film 112 over the insulating film 110, and an insulating film 116 over the insulating film 104, the oxide semiconductor film 108, and the conductive film 112.

In a region which overlaps with the conductive film 112, the oxide semiconductor film 108 is provided over the insulating film 104. For example, the oxide semiconductor film 108 preferably contains In, M (M is Al, Ga, Y, or Sn), and Zn.

The oxide semiconductor film 108 includes regions 108n which do not overlap with the conductive film 112 and are in contact with the insulating film 116. The regions 108n are n-type regions in the oxide semiconductor film 108 described above. The regions 108n are in contact with the insulating film 116, and the insulating film 116 contains nitrogen or hydrogen. Nitrogen or hydrogen in the insulating film 116 is added to the regions 108n to increase the carrier density, thereby making the regions 108n n-type.

The oxide semiconductor film 108 preferably includes a region in which the atomic proportion of In is larger than the atomic proportion of M. For example, the atomic ratio of In to M and Zn in the oxide semiconductor film 108 is preferably In:M:Zn=4:2:3 or in the neighborhood thereof.

Note that the composition of the oxide semiconductor film 108 is not limited to the above. For example, the atomic ratio of In to M and Zn in the oxide semiconductor film 108 is preferably In:M:Zn=5:1:6 or in the neighborhood thereof. The term "neighborhood" includes the following: when In is 5, M is greater than or equal to 0.5 and less than or equal to 1.5, and Zn is greater than or equal to 5 and less than or equal to 7.

When the oxide semiconductor film 108 has a region in which the atomic proportion of In is larger than the atomic proportion of M, the transistor 100 can have high field-effect mobility. Specifically, the field-effect mobility of the transistor 100 can exceed 10 cm$^2$/Vs, preferably exceed 30 cm$^2$/Vs.

For example, the use of the transistor with high field-effect mobility in a gate driver that generates a gate signal allows the display device to have a narrow frame. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

Even when the oxide semiconductor film 108 includes a region in which the atomic proportion of In is higher than the atomic proportion of M, the field-effect mobility might be low if the oxide semiconductor film 108 has high crystallinity.

Note that the crystallinity of the oxide semiconductor film 108 can be determined by analysis by X-ray diffraction (XRD) or with a transmission electron microscope (TEM), for example.

First, oxygen vacancies that might be formed in the oxide semiconductor film 108 will be described.

Oxygen vacancies formed in the oxide semiconductor film 108 adversely affect the transistor characteristics and therefore cause a problem. For example, hydrogen is trapped in oxygen vacancies formed in the oxide semiconductor film 108 to serve as a carrier supply source. The carrier supply source generated in the oxide semiconductor film 108 causes a change in the electrical characteristics, typically, shift in the threshold voltage, of the transistor 100 including the oxide semiconductor film 108. Therefore, it is preferable that the amount of oxygen vacancies in the oxide semiconductor film 108 be as small as possible.

In one embodiment of the present invention, the insulating film in the vicinity of the oxide semiconductor film 108 contains excess oxygen. Specifically, one or both of the insulating film 110 which is formed over the oxide semiconductor film 108 and the insulating film 104 which is formed below the oxide semiconductor film 108 contain excess oxygen. Oxygen or excess oxygen is transferred from the insulating film 104 and/or the insulating film 110 to the oxide semiconductor film 108, whereby oxygen vacancies in the oxide semiconductor film can be reduced.

Impurities such as hydrogen and moisture entering the oxide semiconductor film 108 adversely affect the transistor characteristics and therefore cause a problem. Thus, it is preferable that the amount of impurities such as hydrogen and moisture in the oxide semiconductor film 108 be as small as possible.

Note that it is preferable to use, as the oxide semiconductor film 108, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of 1×10$^6$ μm and a channel length of 10 μm, the off-state current can be less than or equal to the measurement limit of a semiconductor parameter analyzer, that is, less than or equal to $1 \times 10^{-13}$ A, at a voltage (drain voltage) between a source electrode and a drain electrode of from 1 V to 10 V.

As illustrated in FIGS. 3A to 3C, the transistor 100 may further include an insulating film 118 over the insulating film 116, a conductive film 120a electrically connected to the region 108n through an opening 141a formed in the insulating films 116 and 118; and a conductive film 120b electrically connected to the region 108n through an opening 141b formed in the insulating films 116 and 118.

Note that in this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive films 112, 120a, and 120b function as a gate electrode, a source electrode, and a drain electrode, respectively.

The insulating film 110 functions as a gate insulating film. The insulating film 110 includes an excess-oxygen region. Since the insulating film 110 includes the excess-oxygen region, excess oxygen can be supplied to the oxide semiconductor film 108. As a result, oxygen vacancies that might be formed in the oxide semiconductor film 108 can be filled with excess oxygen, and the semiconductor device can have high reliability.

To supply excess oxygen to the oxide semiconductor film 108, excess oxygen may be supplied to the insulating film 104 that is formed below the oxide semiconductor film 108. In that case, excess oxygen contained in the insulating film 104 might also be supplied to the regions 108n, which is not desirable because the resistance of the regions 108n might be increased. In contrast, in the structure in which the insulating film 110 formed over the oxide semiconductor film 108 contains excess oxygen, excess oxygen can be selectively supplied only to a region overlapping with the conductive film 112.

<Components of Semiconductor Device>

Next, components of the semiconductor device in this embodiment will be described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure including an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased. In addition, interface states at the interface between the insulating film 104 and the oxide semiconductor film 108 and oxygen vacancies included in the oxide semiconductor film 108 can be reduced.

For example, the insulating film 104 can be formed to have a single-layer structure or stacked-layer structure including silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure including a silicon nitride film and a silicon oxynitride film. With the insulating film 104 having such a stack-layer structure including a silicon nitride film as a lower layer and a silicon oxynitride film as an upper layer, oxygen can be efficiently introduced into the oxide semiconductor film 108.

[Conductive Film]

The conductive film 112 functioning as a gate electrode and the conductive films 120a and 120b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 112, 120a, and 120b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. oxide semiconductors generally transmit visible light because of their large energy gap. Since an oxide conductor is an oxide semiconductor having a donor level in the vicinity of the conduction band, the influence of absorption due to the donor level is small in an oxide conductor, and an oxide conductor has a visible light transmitting property comparable to that of an oxide semiconductor.

It is particularly preferred to use the oxide conductor described above for the conductive film 112, in which case excess oxygen can be added to the insulating film 110.

A Cu—X alloy film (X is Mn, Ni, Cr, Fe, Co, Mo, Ta, or Ti) may be used as the conductive films 112, 120a, and 120b. The use of a Cu—X alloy film results in lower fabrication costs because the film can be processed by wet etching.

Among the above-mentioned metal elements, any one or more elements selected from titanium, tungsten, tantalum, and molybdenum are preferably included in the conductive films 112, 120a, and 120b. A tantalum nitride film is particularly preferable as each of the conductive films 112, 120a, and 120b. A tantalum nitride film has conductivity and a high barrier property against copper or hydrogen. Because a tantalum nitride film releases little hydrogen from itself, it can be favorably used as the conductive film in contact with the oxide semiconductor film 108 or the conductive film in the vicinity of the oxide semiconductor film 108.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

[Second Insulating Film]

As the insulating film 110 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 110 may have a two-layer structure or a stacked-layer structure including three or more layers.

The insulating film 110 that is in contact with the oxide semiconductor film 108 functioning as a channel region of the transistor 100 is preferably an oxide insulating film and preferably includes a region including oxygen in excess of the stoichiometric composition (excess-oxygen region). In other words, the insulating film 110 is an insulating film capable of releasing oxygen. In order to provide the excess-oxygen region in the insulating film 110, the insulating film 110 is formed in an oxygen atmosphere, or the deposited insulating film 110 is subjected to heat treatment in an oxygen atmosphere, for example.

In the case of using a stacked-layer structure containing hafnium oxide for the insulating film 110, the following effects are attained. Hafnium oxide has higher dielectric constant than silicon oxide and silicon oxynitride. Therefore, by using hafnium oxide, the thickness of the insulating film 110 can be made large as compared with the case of using silicon oxide; thus, leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to obtain a transistor with a low off-state current. Examples of the crystal structure include a monoclinic crystal structure and a cubic crystal structure. Note that one embodiment of the present invention is not limited to the above examples.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3\times10^{17}$ spins/cm$^3$ and preferably lower than or equal to $5\times10^{16}$ spins/cm$^3$ may be used.

In addition to the above-described signal, a signal due to nitrogen dioxide ($NO_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide ($NO_2$) is higher than or equal to $1\times10^{17}$ spins/cm$^3$ and lower than $1\times10^{18}$ spins/cm$^3$ as the insulating film 110, for example.

Note that a nitrogen oxide (NO)) such as nitrogen dioxide ($NO_2$) forms a state in the insulating film 110. The state is positioned in the energy gap of the oxide semiconductor film 108. Thus, when nitrogen oxide (NO)) is diffused to the interface between the insulating film 110 and the oxide semiconductor film 108, an electron might be trapped by the state on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide ($NO_x$), for example, a silicon oxynitride film can be used. The silicon oxynitride film releases more ammonia than nitrogen oxide ($NO_x$) in thermal desorption spectroscopy (TDS) analysis; the typical released amount of ammonia is greater than or equal to $1\times10^{18}$ molecules/cm$^3$ and less than or equal to $5\times10^{19}$ molecules/cm$^3$. Note that the released amount of ammonia is the total amount of ammonia released by heat treatment in a range of 50° C. to 650° C. or 50° C. to 550° C. in TDS analysis.

Since nitrogen oxide ($NO_x$) reacts with ammonia and oxygen in heat treatment, the use of an insulating film that releases a large amount of ammonia reduces nitrogen oxide ($NO_x$).

Note that in the case where the insulating film 110 is analyzed by SIMS, the nitrogen concentration in the film is preferably lower than or equal to $6\times10^{20}$ atoms/cm$^3$.

[Oxide Semiconductor Film]

As the oxide semiconductor film 108, the material described above can be used.

<Atomic Ratio>

Preferred ranges of the atomic ratio of indium, the element M, and zinc contained in the oxide semiconductor according to the present invention are described with reference to FIGS. 13A to 13C. Note that the proportion of oxygen atoms is not illustrated in FIGS. 13A to 13C. The terms of the atomic ratio of indium, the element M, and zinc contained in the oxide semiconductor are denoted by [In], [M], and [Zn], respectively.

Figure 13A:
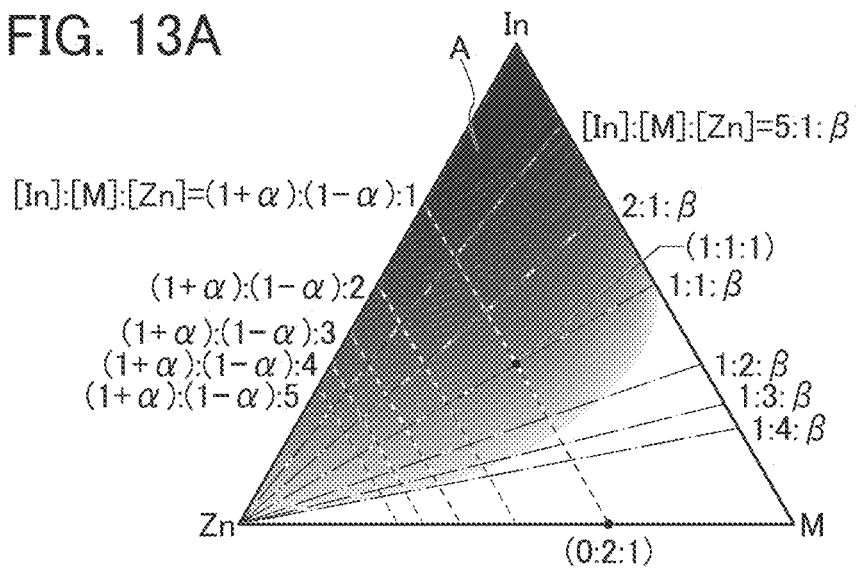
FIGS. 13A to 13C each illustrate an atomic ratio range of an oxide semiconductor of the present invention.
Figure 13B:
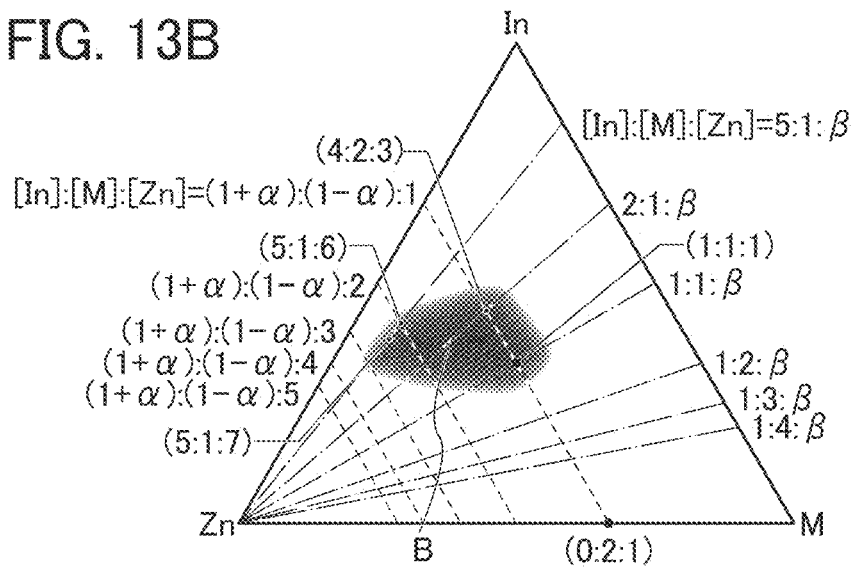
Figure 13C:
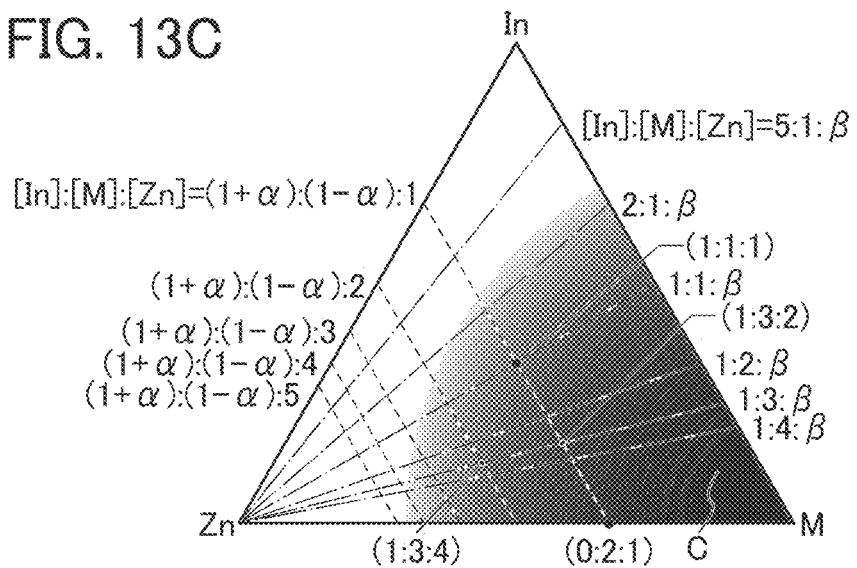

In FIGS. 13A to 13C, dashed lines indicate a line where the atomic ratio [In]:[M]:[Zn] is $(1+\alpha):(1-\alpha):1$ where a is a real number greater than or equal to −1 and less than or equal to 1, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+a):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ where $\beta$ is a real number greater than or equal to 0, a line where the atomic ratio [In]:[M]:[Zn] is $2:1:\beta$, a line representing the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

An oxide semiconductor where the atomic ratio [In]:[M]:[Zn] is 0:2:1 or in the neighborhood thereof in FIGS. 13A to 13C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

A region A in FIG. 13A shows an example of the preferred ranges of the atomic ratio of indium to the element M and zinc contained in an oxide semiconductor.

In addition, the oxide semiconductor containing indium in a higher proportion can have high carrier mobility (electron mobility). Thus, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio [In]:[M]:[Zn] that is 0:1:0 and the neighborhood thereof (e.g., a region C in FIG. 13C), insulation performance becomes better.

Accordingly, the oxide semiconductor of one embodiment of the present invention preferably has an atomic ratio represented by the region A in FIG. 13A. With the atomic ratio, high carrier mobility is obtained.

An oxide semiconductor having an atomic ratio in the region A, particularly in a region B in FIG. 13B, has high carrier mobility and high reliability and is excellent.

Note that the region B includes an atomic ratio [In]:[M]:[Zn] that is 4:2:3 to 4:2:4.1 and the vicinity thereof. The vicinity includes an atomic ratio [In]:[M]:[Zn] that is 5:3:4. Note that the region B includes an atomic ratio [In]:[M]:[Zn] that is 5:1:6 and the vicinity thereof and an atomic ratio [In]:[M]:[Zn] that is 5:1:7 and the vicinity thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide semiconductor tends to have specific characteristics, and boundaries of the regions A to C are not clear.

In the case where the oxide semiconductor film 108 is formed of In-M-Zn oxide, it is preferable to use a target including polycrystalline In-M-Zn oxide as the sputtering target. Note that the atomic ratio of metal elements in the formed oxide semiconductor film 108 varies from the above atomic ratios of metal elements of the sputtering targets in a range of ±40%. For example, when a sputtering target used for the oxide semiconductor film 108 has an atomic ratio In:Ga:Zn that is 4:2:4.1, the atomic ratio of the oxide semiconductor film 108 may be 4:2:3 or in the neighborhood thereof. When a sputtering target used for the oxide semiconductor film 108 has an atomic ratio In:Ga:Zn that is 5:1:7, the atomic ratio of the oxide semiconductor film 108 may be 5:1:6 or in the neighborhood thereof.

The energy gap of the oxide semiconductor film 108 is 2 eV or more, preferably 2.5 eV or more. With the use of an oxide semiconductor having such a wide energy gap, the off-state current of the transistor 100 can be reduced.

Furthermore, the oxide semiconductor film 108 may have a non-single-crystal structure. Examples of the non-single-crystal structure include a c-axis-aligned crystalline oxide semiconductor (CAAC-OS) which will be described later, a polycrystalline structure, a microcrystalline structure, and an amorphous structure. Among the non-single-crystal structures, an amorphous structure has the highest density of defect states.

[Third Insulating Film]

The insulating film 116 contains nitrogen or hydrogen. A nitride insulating film can be used as the insulating film 116, for example. The nitride insulating film can be formed using silicon nitride, silicon nitride oxide, silicon oxynitride, or the like. The hydrogen concentration in the insulating film 116 is preferably higher than or equal to $1\times10^{22}$ atoms/cm$^3$. The insulating film 116 is in contact with the region 108n of the oxide semiconductor film 108. Thus, the concentration of an impurity (nitrogen or hydrogen) in the region 108n in contact with the insulating film 116 is increased, leading to an increase in the carrier density of the region 108n.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

Structure Example 2 of Transistor

Next, a structure of a transistor different from that in FIGS. 3A to 3C will be described with reference to FIGS. 4A to 4C.

Figure 4A:
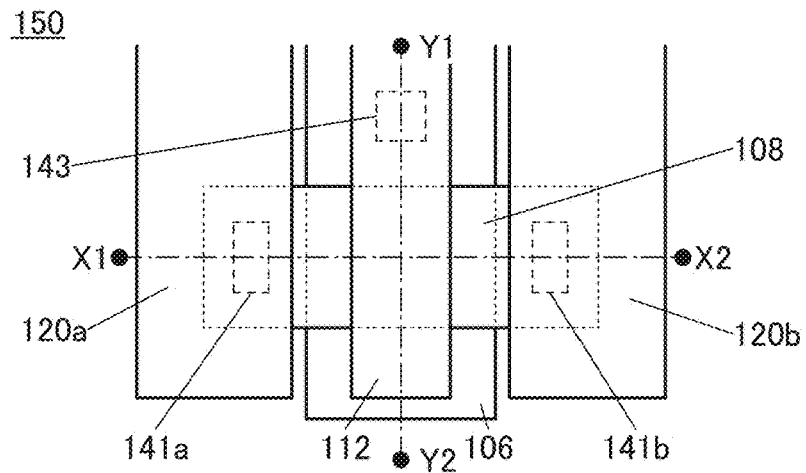
FIGS. 4A to 4C are a top view and cross-sectional views illustrating a semiconductor device.

FIG. 4A is a top view of the transistor 150. FIG. 4B is a cross-sectional view taken along dashed-dotted line X1-X2 in FIG. 4A. FIG. 4C is a cross-sectional view taken along dashed-dotted line Y1-Y2 in FIG. 4A.

Figure 4B:
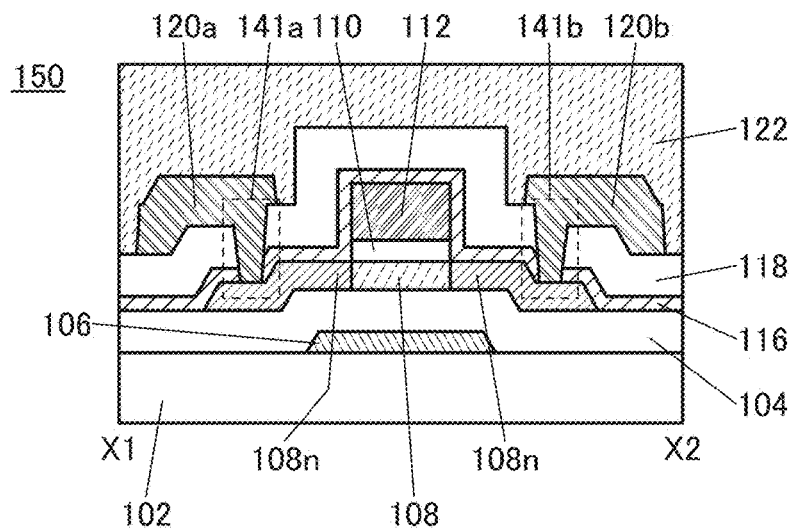
Figure 4C:
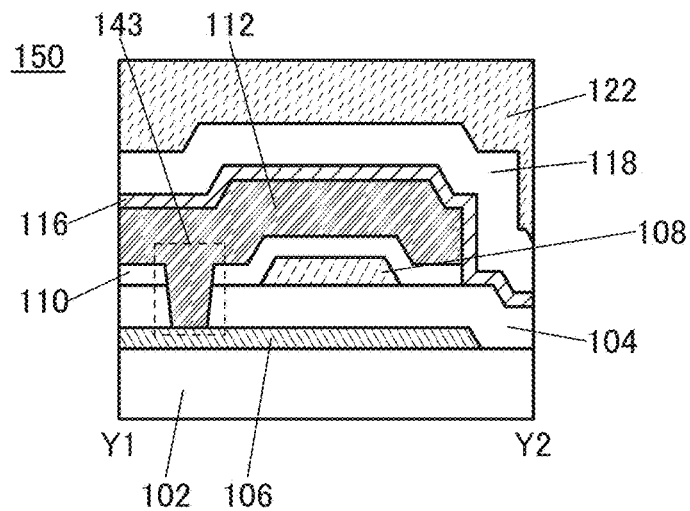

The transistor 150 illustrated in FIGS. 4A to 4C includes the conductive film 106 over the substrate 102; the insulating film 104 over the conductive film 106; the oxide semiconductor film 108 over the insulating film 104; the insulating film 110 over the oxide semiconductor film 108; the conductive film 112 over the insulating film 110; and the insulating film 116 over the insulating film 104, the oxide semiconductor film 108, and the conductive film 112.

Note that the oxide semiconductor film 108 has a structure similar that in the transistor 100 shown in FIGS. 3A to 3C. The transistor 150 shown in FIGS. 4A to 4C includes the conductive film 106 and an opening 143 in addition to the components of the transistor 100 described above.

The opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-blocking film without providing the opening 143. When the conductive film 106 is formed using a light-blocking material, for example, light from the bottom that irradiates a second region can be reduced.

In the case of the structure of the transistor 150, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper as the conductive film 106 because the resistance can be reduced. It is favorable that, for example, each of the conductive films 106, 120a, and 120b has a stacked-layer structure in which a copper film is over a titanium nitride film, a tantalum nitride film, or a tungsten film. In that case, by using the transistor 150 as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 150, but also as power supply wirings, signal supply wirings, connection wirings, or the like of the display device.

In this manner, unlike the transistor 100 described above, the transistor 150 in FIGS. 4A to 4C has a structure in which a conductive film functioning as a gate electrode is provided over and under the oxide semiconductor film 108. As in the transistor 150, a semiconductor device of one embodiment of the present invention may have a plurality of gate electrodes.

As illustrated in FIGS. 4B and 4C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, the conductive film 106 and the conductive film 112 are connected through the opening 143 provided in the insulating films 104 and 110, and each include a region positioned outside an edge portion of the oxide semiconductor film 108.

Such a structure enables the oxide semiconductor film 108 included in the transistor 150 to be electrically surrounded by electric fields of the conductive film 106 functioning as a first gate electrode and the conductive film 112 functioning as a second gate electrode. A device structure of a transistor, like that of the transistor 150, in which electric fields of the first gate electrode and the second gate electrode electrically surround the oxide semiconductor film 108 in which a channel region is formed can be referred to as a surrounded channel (S-channel) structure.

Since the transistor 150 has the S-channel structure, an electric field for inducing a channel can be effectively applied to the oxide semiconductor film 108 by the conductive film 106 or the conductive film 112; thus, the current drive capability of the transistor 150 can be improved and high on-state current characteristics can be obtained. As a result of the high on-state current, it is possible to reduce the size of the transistor 150. Furthermore, since the transistor 150 has a structure in which the oxide semiconductor film 108 is surrounded by the conductive film 106 and the conductive film 112, the mechanical strength of the transistor 150 can be increased.

When seen in the channel width direction of the transistor 150, an opening different from the opening 143 may be formed on the side of the oxide semiconductor film 108 on which the opening 143 is not formed.

When a transistor has a pair of gate electrodes between which a semiconductor film is positioned as in the transistor 150, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential $V_b$ is, for example, a potential for controlling a threshold voltage $V_{thA}$ of the transistor. The fixed potential $V_b$ may be the potential V1 or the potential V2. In that case, a potential generator circuit for generating the fixed potential $V_b$ is not necessary, which is preferable. The fixed potential $V_b$ may be different from the potential V1 or the potential V2. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3–V4) may be larger than the potential amplitude of the signal A (V1–V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

The other components of the transistor 150 are similar to those of the transistor 100 described above and have similar effects.

An insulating film may further be formed over the transistor 150. The transistor 150 illustrated in FIGS. 4A to 4C includes an insulating film 122 over the conductive films 120a and 120b and the insulating film 118.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

Structure Example 3 of Transistor

Next, a structure of a transistor different from that of the transistor 150 in FIGS. 4A to 4C will be described with reference to FIGS. 5A and 5B.

Figure 5A:
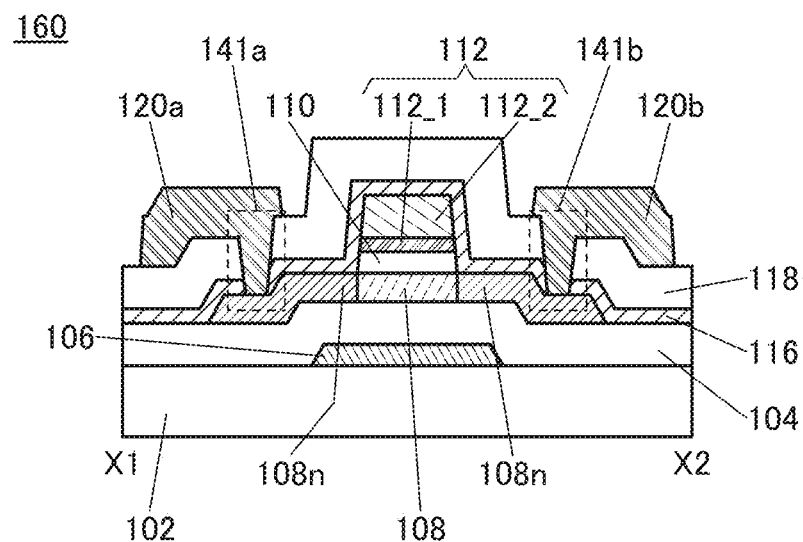
FIGS. 5A and 5B are cross-sectional views illustrating a semiconductor device.
Figure 5B:
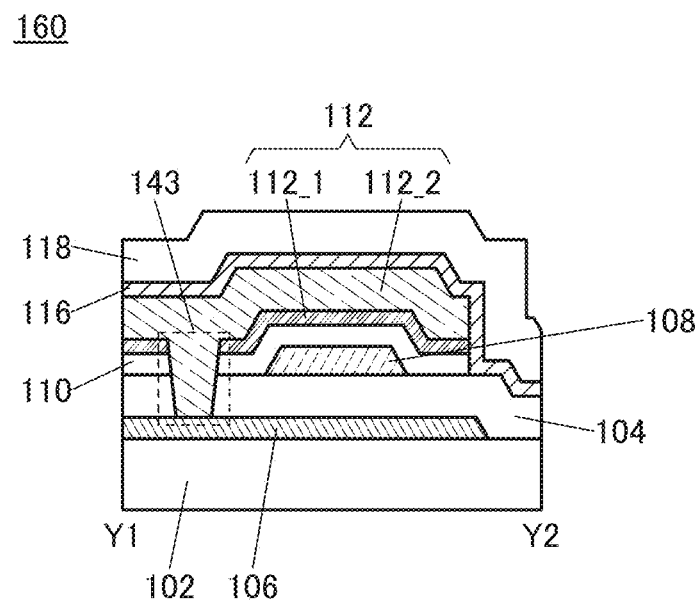

FIGS. 5A and 5B are cross-sectional views of a transistor 160. The top view of the transistor 160 is not illustrated because it is similar to that of the transistor 150 in FIG. 4A.

The transistor 160 illustrated in FIGS. 5A and 5B is different from the transistor 150 in the stacked-layer structure of the conductive film 112, the shape of the conductive film 112, and the shape of the insulating film 110.

The conductive film 112 in the transistor 160 includes a conductive film 112_1 over the insulating film 110 and a conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc, or the like can be used, for example.

As illustrated in FIG. 5B, the conductive film 1122 is connected to the conductive film 106 through the opening 143. By forming the opening 143 after a conductive film to be the conductive film 112_1 is formed, the shape illustrated in FIG. 5B can be obtained. In the case where an oxide conductive film is used as the conductive film 112_1, the structure in which the conductive film 112_2 is connected to the conductive film 106 can decrease the contact resistance between the conductive film 112 and the conductive film 106.

The conductive film 112 and the insulating film 110 in the transistor 160 have a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

As compared with the transistor 160 in which the conductive film 112 and the insulating film 110 have a rectangular shape, the transistor 160 in which the conductive film 112 and the insulating film 110 have a tapered shape is favorable because of better coverage with the insulating film 116.

The other components of the transistor 160 are similar to those of the transistor 150 described above and have similar effects.

<Method for Manufacturing Semiconductor Device>

Next, a method for manufacturing the transistor 150 illustrated in FIGS. 4A to 4C will be described with reference to FIGS. 6A to 6D, FIGS. 7A to 7C, and FIGS. 8A to 8C. Note that FIGS. 6A to 6D, FIGS. 7A to 7C, and FIGS. 8A to 8C are cross-sectional views in the channel length direction and the channel width direction illustrating the method for manufacturing the transistor 150.

First, the conductive film 106 is formed over the substrate 102. Next, the insulating film 104 is formed over the substrate 102 and the conductive film 106, and an oxide semiconductor film is formed over the insulating film 104. Then, the oxide semiconductor film is processed into an island shape, whereby an oxide semiconductor film 108a is formed (see FIG. 6A).

The conductive film 106 can be formed using a material selected from the above-mentioned materials. In this embodiment, for the conductive film 106, a stack including a 50-nm-thick tungsten film and a 400-nm-thick copper film is formed with a sputtering apparatus.

To process a conductive film to be the conductive film 106, a wet etching method and/or a dry etching method can be used. In this embodiment, in the processing of the conductive film into the conductive film 106, the copper film is etched by a wet etching method, and then the tungsten film is etched by a dry etching method.

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a PECVD apparatus.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 104, and then oxygen may be added to the insulating film 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 104 can be increased.

In forming the oxide semiconductor film 108a, an inert gas (such as a helium gas, an argon gas, or a xenon gas) may be mixed into the oxygen gas. Note that the proportion of the oxygen gas in the whole deposition gas (hereinafter also referred to as an oxygen flow rate ratio) in forming the oxide semiconductor film 108a is higher than or equal to 5% and lower than or equal to 30%, preferably higher than or equal to 7% and lower than or equal to 20%.

The oxide semiconductor film 108a is formed at a substrate temperature higher than or equal to room temperature and lower than or equal to 180° C., preferably higher than or equal to room temperature and lower than or equal to 140° C. The substrate temperature when the oxide semiconductor film 108a is formed is preferably, for example, higher than or equal to room temperature and lower than 140° C. because the productivity is increased.

The thickness of the oxide semiconductor film 108a is greater than or equal to 3 nm and less than or equal to 200 nm, preferably greater than or equal to 3 nm and less than or equal to 100 nm, further preferably greater than or equal to 3 nm and less than or equal to 60 nm.

In the case where a large-sized glass substrate (e.g., the 6th generation to the 10th generation) is used as the substrate 102 and the oxide semiconductor film 108a is formed at a substrate temperature higher than or equal to 200° C. and lower than or equal to 300° C., the substrate 102 might be changed in shape (distorted or warped). Therefore, in the case where a large-sized glass substrate is used, the change in the shape of the glass substrate can be suppressed by forming the oxide semiconductor film 108a at a substrate temperature higher than or equal to room temperature and lower than 200° C.

In addition, increasing the purity of the sputtering gas is necessary. For example, when a gas which is highly purified to have a dew point of −40° C. or lower, preferably −80° C. or lower, further preferably −100° C. or lower, still further preferably −120° C. or lower, is used as the sputtering gas, i.e., the oxygen gas or the argon gas, entry of moisture or the like into the oxide semiconductor film can be minimized.

In the case where the oxide semiconductor film is deposited by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor film, as much as possible. In particular, the partial pressure of gas molecules corresponding to $H_2O$ (gas molecules corresponding to m/z=18) in the chamber in the standby mode of the sputtering apparatus is preferably lower than or equal to $1 \times 10^{-4}$ Pa, further preferably lower than or equal to $5 \times 10^{-5}$ Pa.

In this embodiment, the oxide semiconductor film 108a is formed in the following conditions.

The oxide semiconductor film 108a is formed by a sputtering method using an In—Ga—Zn metal oxide target. The substrate temperature and the oxygen flow rate at the time of formation of the oxide semiconductor film 108a can be set as appropriate. An oxide material is formed under the following conditions: the pressure in a chamber is 0.6 Pa;

and an AC power of 2500 W is supplied to the metal oxide target provided in the sputtering apparatus.

To process the formed oxide material into the oxide semiconductor film 108a, a wet etching method and/or a dry etching method can be used.

After the oxide semiconductor film 108a is formed, the oxide semiconductor film 108a may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferable that the above inert gas atmosphere and the above oxygen atmosphere not contain hydrogen, water, or the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor film while it is heated or by performing heat treatment after the deposition of the oxide semiconductor film, the hydrogen concentration in the oxide semiconductor film, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 6A:
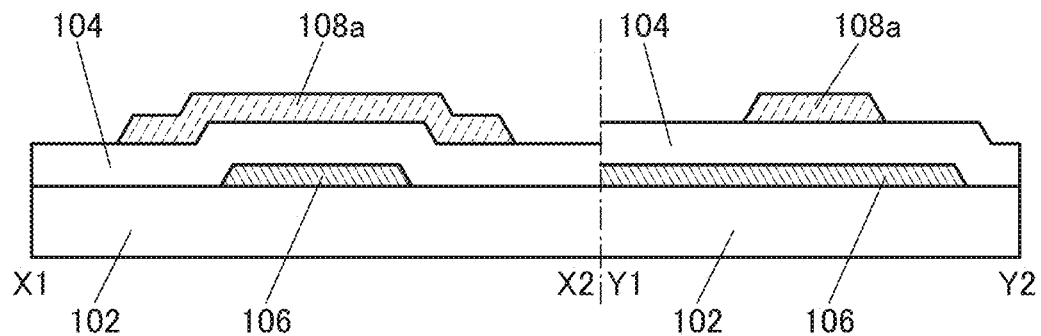
FIGS. 6A to 6D are cross-sectional views illustrating a method for manufacturing a semiconductor device.
Figure 6B:
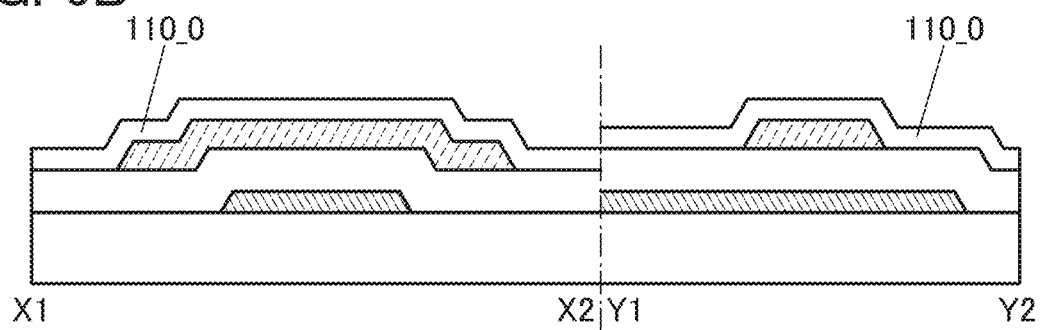

Next, an insulating film 110_0 is formed over the insulating film 104 and the oxide semiconductor film 108a (see FIG. 6B).

For the insulating film 110_0, a silicon oxide film or a silicon oxynitride film can be formed with a plasma-enhanced chemical vapor deposition apparatus (also referred to as a PECVD apparatus or simply a plasma CVD apparatus). In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating film 110_0 with the PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating film 110_0, a dense silicon oxide film or a dense silicon oxynitride film can be formed under the following conditions: the substrate placed in a vacuum-evacuated treatment chamber of the PECVD apparatus is held at a temperature higher than or equal to 280° C. and lower than or equal to 400° C.; the pressure in the treatment chamber into which a source gas is introduced is set to be higher than or equal to 20 Pa and lower than or equal to 250 Pa, preferably higher than or equal to 100 Pa and lower than or equal to 250 Pa; and a high-frequency power is supplied to an electrode provided in the treatment chamber.

The insulating film 110_0 may be formed by a PECVD method using a microwave. A microwave refers to a wave in the frequency range of 300 MHz to 300 GHz. In the case of using a microwave, electron temperature and electron energy are low. Furthermore, in supplied power, the proportion of power used for acceleration of electrons is low, and therefore, much more power can be used for dissociation and ionization of molecules. Thus, plasma with a high density (high-density plasma) can be excited. This method causes little plasma damage to the deposition surface or a deposit, so that the insulating film 110_0 having few defects can be formed.

Alternatively, the insulating film 110_0 can also be formed by a CVD method using an organosilane gas. As the organosilane gas, any of the following silicon-containing compound can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like. The insulating film 110_0 having high coverage can be formed by a CVD method using an organosilane gas.

In this embodiment, as the insulating film 110_0, a 100-nm-thick silicon oxynitride film is formed with the PECVD apparatus.

Figure 6C:
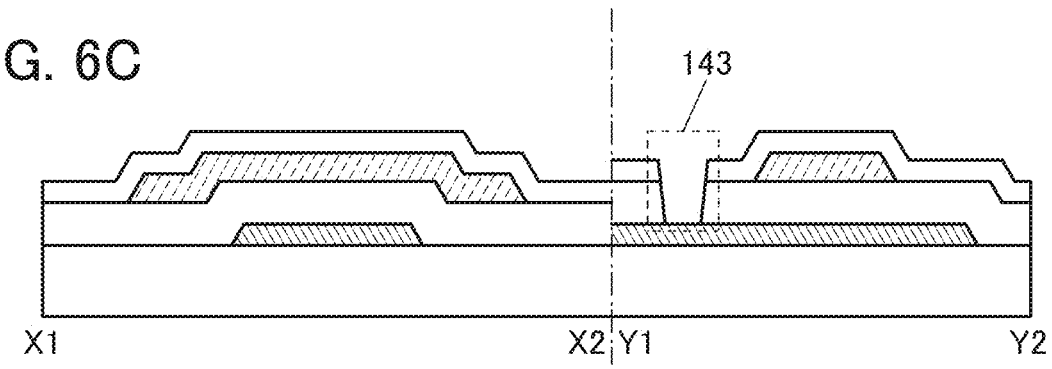

Subsequently, a mask is formed by lithography in a desired position over the insulating film 110_0, and then the insulating film 110_0 and the insulating film 104 are partly etched, so that the opening 143 reaching the conductive film 106 is formed (see FIG. 6C).

To form the opening 143, a wet etching method and/or a dry etching method can be used. In this embodiment, the opening 143 is formed by a dry etching method.

Next, a conductive film 112_0 is formed over the conductive film 106 and the insulating film 110_0 so as to cover the opening 143. In the case where a metal oxide film is used as the conductive film 112_0, for example, oxygen might be added to the insulating film 110_0 during the formation of the conductive film 112_0 (see FIG. 6D).

Figure 6D:
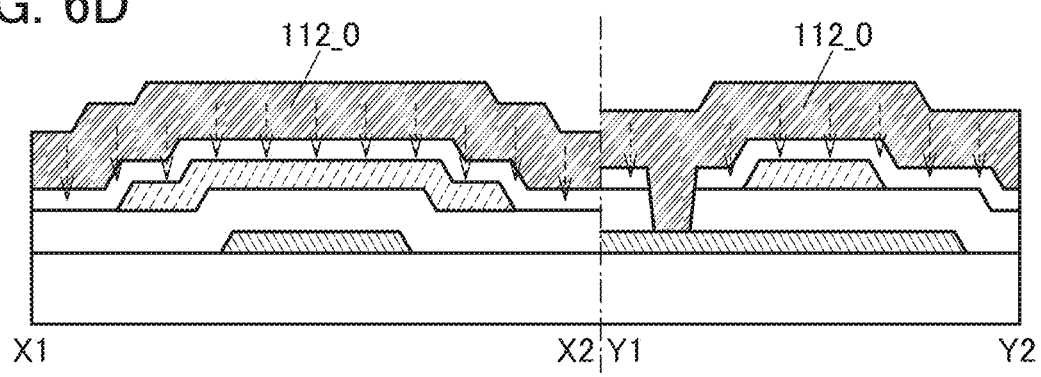

In FIG. 6D, oxygen added to the insulating film 110_0 is schematically shown by arrows. Furthermore, the conductive film 112_0 formed to cover the opening 143 is electrically connected to the conductive film 106.

In the case where a metal oxide film is used as the conductive film 1120, the conductive film 112_0 is preferably formed by a sputtering method in an atmosphere containing an oxygen gas. Formation of the conductive film 112_0 in an atmosphere containing an oxygen gas allows suitable addition of oxygen to the insulating film 110_0. Note that a method for forming the conductive film 112_0 is not limited to a sputtering method, and another method such as an ALD method may be used.

In this embodiment, a 100-nm-thick IGZO film containing an In—Ga—Zn oxide (In:Ga:Zn=4:2:4.1 (atomic ratio)) is formed as the conductive film 112_0 by a sputtering method. Oxygen addition treatment may be performed on the insulating film 110_0 before or after the formation of the conductive film 112_0. The oxygen addition treatment can be performed in a manner similar to that of the oxygen addition treatment that can be performed after the formation of the insulating film 104.

Figure 7A:
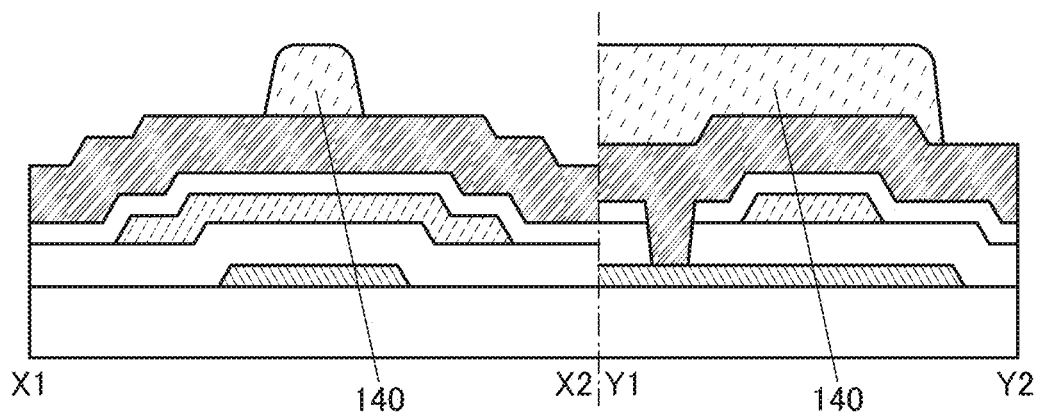
FIGS. 7A to 7C are cross-sectional views illustrating a method for manufacturing a semiconductor device.
Figure 7B:
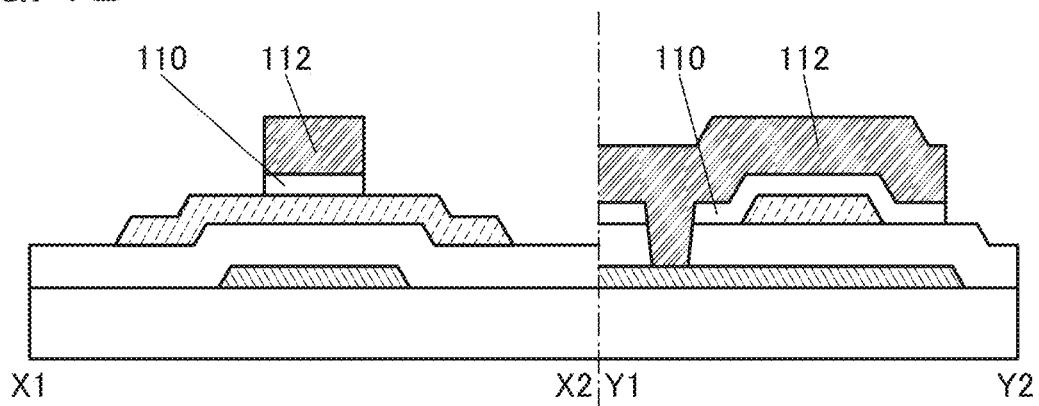
Figure 7C:
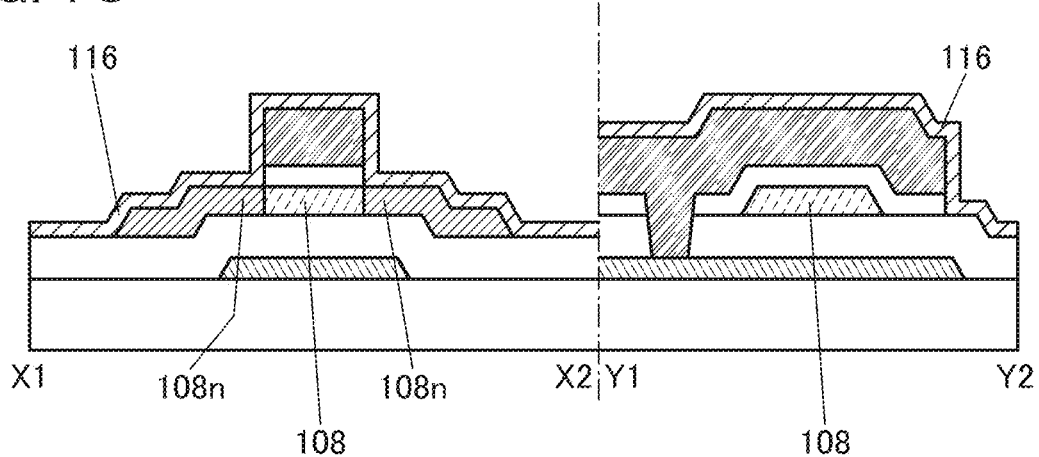

Subsequently, a mask 140 is formed by a lithography process in a desired position over the conductive film 112_0 (see FIG. 7A).

Next, etching is performed from above the mask 140 to process the conductive film 112_0 and the insulating film 110_0. After the processing of the conductive film 112_0 and the insulating film 110_0, the mask 140 is removed. As a result of the processing of the conductive film 112_0 and the insulating film 110_0, the island-shaped conductive film 112 and the island-shaped insulating film 110 are formed (see FIG. 7B).

In this embodiment, the conductive film 112_0 and the insulating film 110_0 are processed by a dry etching method.

In the processing of the conductive film 112_0 and the insulating film 110_0, the thickness of the oxide semiconductor film 108a in a region not overlapping with the conductive film 112 is decreased in some cases. In other cases, in the processing of the conductive film 112_0 and the insulating film 110_0, the thickness of the insulating film 104 in a region not overlapping with the oxide semiconductor film 108a is decreased. In the processing of the conductive film 112_0 and the insulating film 110_0, an etchant or an etching gas (e.g., chlorine) might be added to the oxide semiconductor film 108a or the constituent element of the conductive film 112_0 or the insulating film 110_0 might be added to the oxide semiconductor film 108.

Next, the insulating film 116 is formed over the insulating film 104, the oxide semiconductor film 108, and the conductive film 112. By the formation of the insulating film 116, part of the oxide semiconductor film 108a that is in contact with the insulating film 116 becomes the regions 108n. Here, the oxide semiconductor film 108a overlapping with the conductive film 112 is the oxide semiconductor film 108 (see FIG. 7C).

The insulating film 116 can be formed using a material selected from the above-mentioned materials. In this embodiment, as the insulating film 116, a 100-nm-thick silicon nitride oxide film is formed with a PECVD apparatus. In the formation of the silicon nitride oxide film, two steps, i.e., plasma treatment and deposition treatment, are performed at a temperature of 220° C. The plasma treatment is performed under the following conditions: an argon gas at a flow rate of 100 sccm and a nitrogen gas at a flow rate of 1000 sccm are introduced into a chamber before deposition; the pressure in the chamber is set to 40 Pa; and a power of 1000 W is supplied to an RF power source (27.12 MHz). The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and a power of 1000 W is supplied to the RF power source (27.12 MHz).

When a silicon nitride oxide film is used as the insulating film 116, nitrogen or hydrogen in the silicon nitride oxide film can be supplied to the regions 108n in contact with the insulating film 116. In addition, when the formation temperature of the insulating film 116 is the above temperature, release of excess oxygen contained in the insulating film 110 to the outside can be suppressed.

Figure 8A:
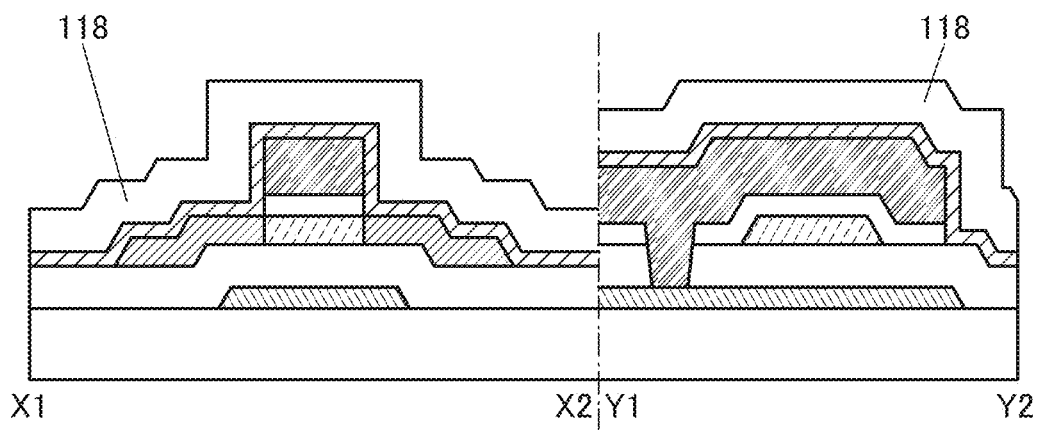
FIGS. 8A to 8C are cross-sectional views illustrating a method for manufacturing a semiconductor device.

Next, the insulating film 118 is formed over the insulating film 116 (see FIG. 8A).

The insulating film 118 can be formed using a material selected from the above-mentioned materials. In this embodiment, as the insulating film 118, a 300-nm-thick silicon oxynitride film is formed with a PECVD apparatus.

Figure 8B:
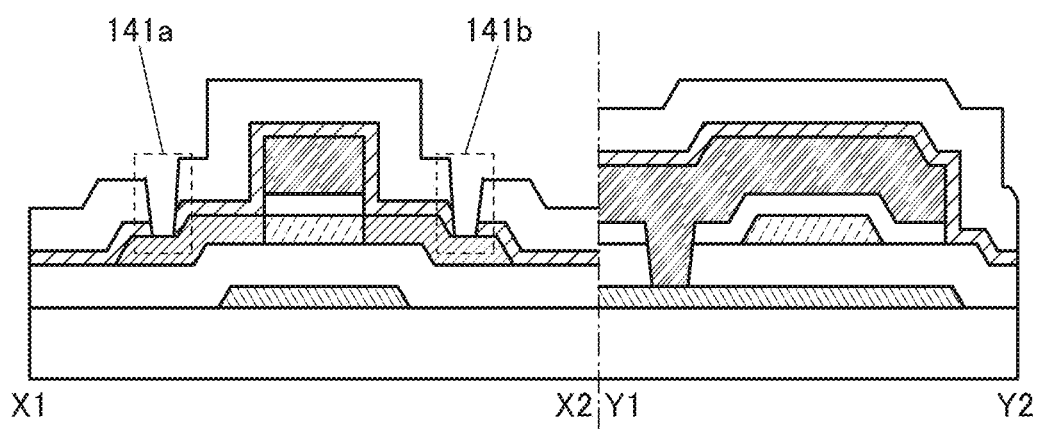

Subsequently, a mask is formed by lithography in a desired position over the insulating film 118, and then the insulating film 118 and the insulating film 116 are partly etched, so that the opening 141a and the opening 141b reaching the regions 108n are formed (see FIG. 8B).

To etch the insulating film 118 and the insulating film 116, a wet etching method and/or a dry etching method can be used. In this embodiment, the insulating film 118 and the insulating film 116 are processed by a dry etching method.

Figure 8C:
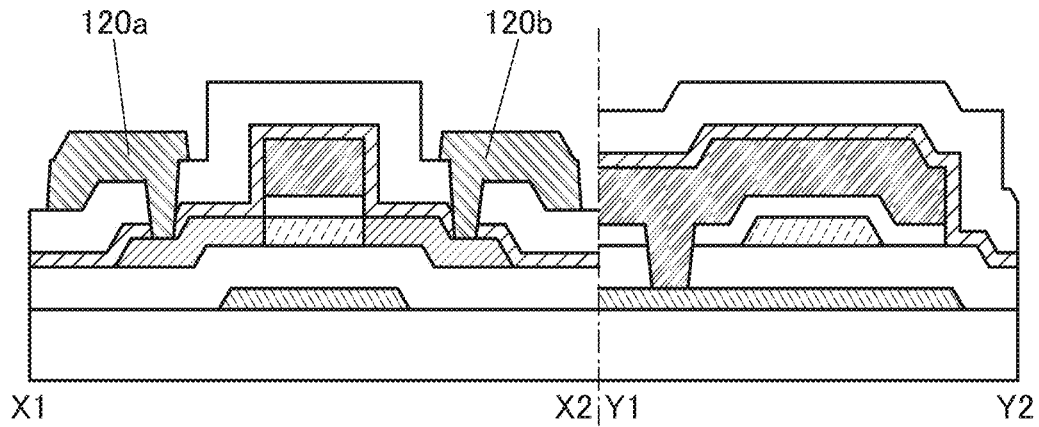

Next, a conductive film is formed over the regions 108n and the insulating film 118 so as to cover the openings 141a and 141b, and the conductive film is processed into a desired shape, whereby the conductive films 120a and 120b are formed (see FIG. 8C).

The conductive films 120a and 120b can be formed using a material selected from the above-mentioned materials. In this embodiment, for the conductive films 120a and 120b, a stack including a 50-nm-thick tungsten film and a 400-nm-thick copper film is formed with a sputtering apparatus.

To process the conductive film to be the conductive films 120a and 120b, a wet etching method and/or a dry etching method can be used. In this embodiment, in the processing of the conductive film into the conductive films 120a and 120b, the copper film is etched by a wet etching method, and then the tungsten film is etched by a dry etching method.

Then, the insulating film 122 is formed to cover the conductive films 120a and 120b and the insulating film 118.

Through the above steps, the transistor 150 in FIGS. 4A to 4C can be manufactured.

Note that the films included in the transistor 150 (the insulating film, the metal oxide film, the oxide semiconductor film, the conductive film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although a sputtering method and a PECVD method are typical examples of the deposition method, a thermal CVD method may be used. As an example of a thermal CVD method, a metal organic chemical vapor deposition (MOCVD) method can be given.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

The films such as the conductive films, the insulating films, the oxide semiconductor films, and the metal oxide films that are described above can be formed by a thermal CVD method such as an MOCVD method.

For example, in the case where a hafnium oxide film is formed with a deposition apparatus employing an ALD method, two kinds of gases are used, namely, ozone ($O_3$) as an oxidizer and a source gas that is obtained by vaporizing liquid containing a solvent and a hafnium precursor (hafnium alkoxide or hafnium amide such as tetrakis(dimethylamide)hafnium (TDMAH, $Hf[N(CH_3)_2]_4$) or tetrakis(ethylmethylamide)hafnium).

In the case where an aluminum oxide film is formed with a deposition apparatus employing an ALD method, two kinds of gases are used, namely, $H_2O$ as an oxidizer and a source gas that is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

In the case where a silicon oxide film is formed with a deposition apparatus employing an ALD method, hexachlorodisilane is adsorbed on a surface on which a film is to be formed, and radicals of an oxidizing gas (02 or dinitrogen monoxide) are supplied to react with the adsorbate.

In the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that an $SiH_4$ gas may be used instead of a $B_2H_6$ gas.

In the case where an oxide semiconductor film such as an In—Ga—Zn—O film is formed with a deposition apparatus employing an ALD method, an $In(CH_3)_3$ gas and an $O_3$ gas) are used to form an In—O layer, a $Ga(CH_3)_3$ gas and an $O_3$ gas) are used to form a Ga—O layer, and then, a $Zn(CH_3)_2$ gas and an $O_3$ gas) are used to form a Zn—O layer. Note that the order of these layers is not limited to this example. A mixed compound layer such as an In—Ga—O layer, an In—Zn—O layer, or a Ga—Zn—O layer may be formed by using these gases. Note that although an $H_2O$ gas that is obtained by bubbling water with an inert gas such as Ar may be used instead of an $O_3$ gas), it is preferable to use an $O_3$ gas), which does not contain H.

Structure Example 4 of Transistor

Figure 9A:
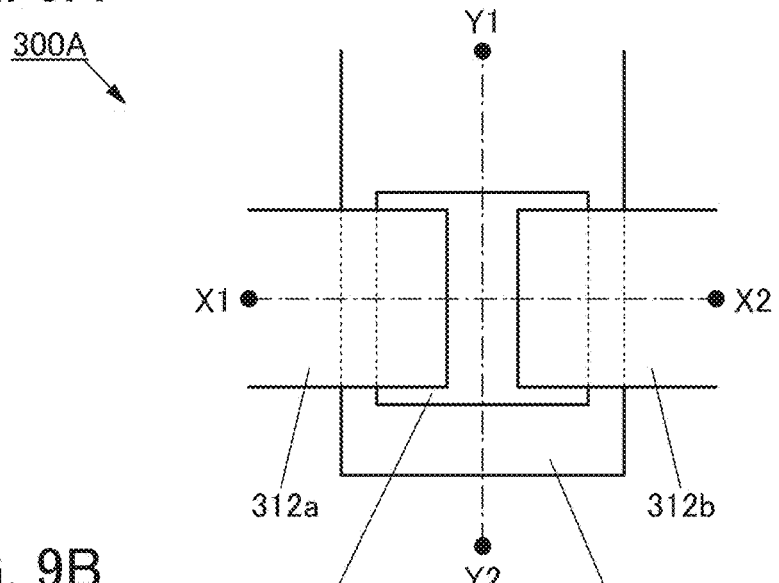
FIGS. 9A to 9C are a top view and cross-sectional views illustrating a semiconductor device.
Figure 9B:
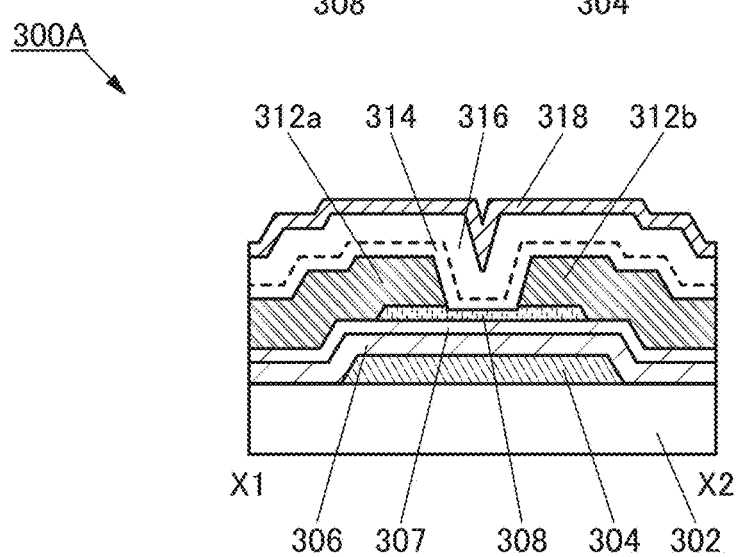
Figure 9C:
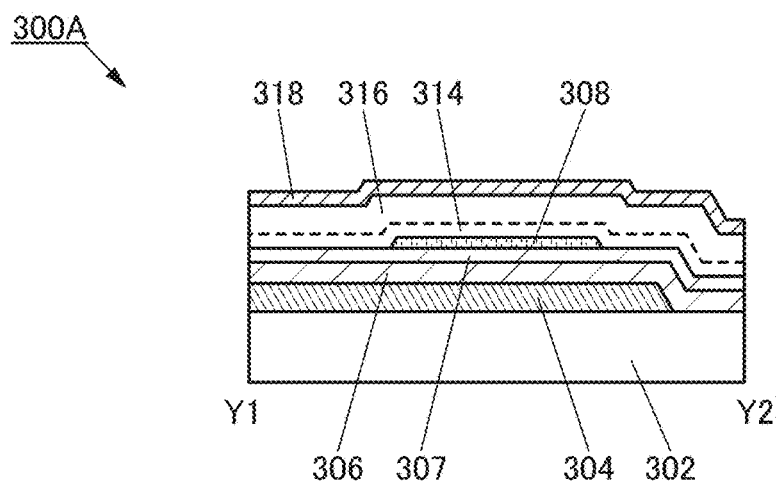

FIG. 9A is a top view of a transistor 300A. FIG. 9B is a cross-sectional view taken along dashed-dotted line X1-X2 in FIG. 9A. FIG. 9C is a cross-sectional view taken along dashed-dotted line Y1-Y2 in FIG. 9A. Note that in FIG. 9A, some components of the transistor 300A (e.g., an insulating film functioning as a gate insulating film) are not illustrated to avoid complexity. The direction of the dashed-dotted line X1-X2 may be referred to as a channel length direction, and the direction of the dashed-dotted line Y1-Y2 may be referred to as a channel width direction. As in FIG. 9A, some components are not illustrated in some cases in top views of transistors described below.

The transistor 300A illustrated in FIGS. 9A to 9C includes a conductive film 304 over a substrate 302, an insulating film 306 over the substrate 302 and the conductive film 304, an insulating film 307 over the insulating film 306, an oxide semiconductor film 308 over the insulating film 307, a conductive film 312a over the oxide semiconductor film 308, and a conductive film 312b over the oxide semiconductor film 308. Over the transistor 300A, specifically, over the conductive films 312a and 312b and the oxide semiconductor film 308, an insulating film 314, an insulating film 316, and an insulating film 318 are provided.

In the transistor 300A, the insulating films 306 and 307 function as the gate insulating films of the transistor 300A, and the insulating films 314, 316, and 318 function as protective insulating films of the transistor 300A. Furthermore, in the transistor 300A, the conductive film 304 functions as a gate electrode, the conductive film 312a functions as a source electrode, and the conductive film 312b functions as a drain electrode.

In this specification and the like, the insulating films 306 and 307 may be referred to as a first insulating film, the insulating films 314 and 316 may be referred to as a second insulating film, and the insulating film 318 may be referred to as a third insulating film.

The transistor 300A illustrated in FIGS. 9A to 9C is a channel-etched transistor. The oxide semiconductor film of one embodiment of the present invention is suitable for a channel-etched transistor.

Structure Example 5 of Transistor

Figure 10A:
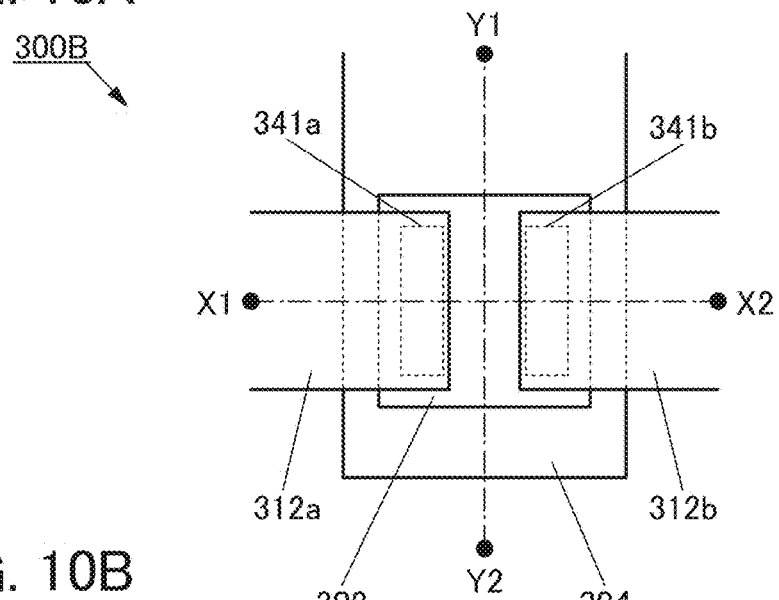
FIGS. 10A to 10C are a top view and cross-sectional views illustrating a semiconductor device.
Figure 10B:
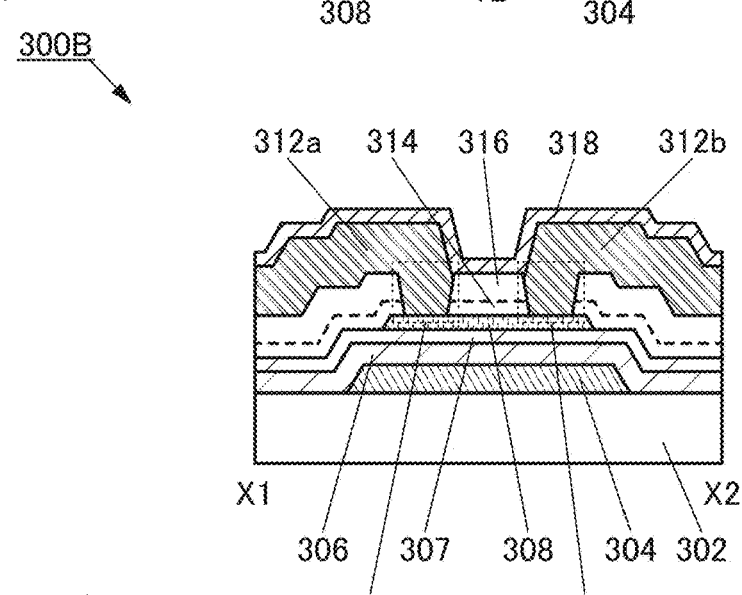
Figure 10C:
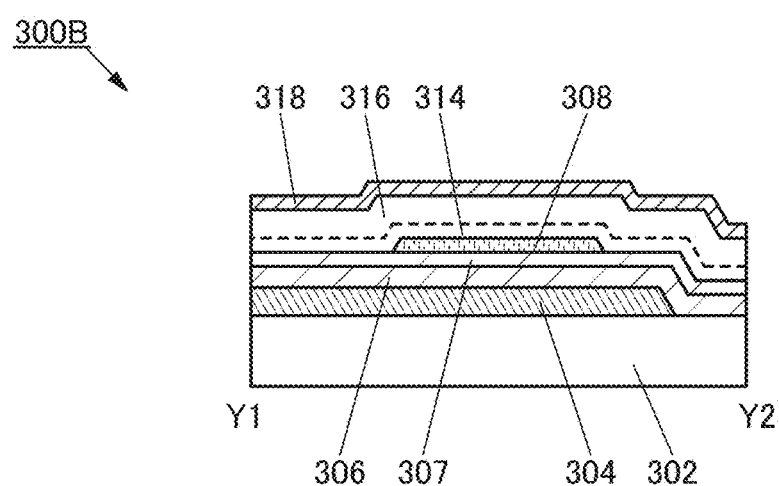

FIG. 10A is a top view of a transistor 300B. FIG. 10B is a cross-sectional view taken along dashed-dotted line X1-X2 in FIG. 10A. FIG. 10C is a cross-sectional view taken along dashed-dotted line Y1-Y2 in FIG. 10A.

The transistor 300B illustrated in FIGS. 10A to 10C includes the conductive film 304 over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a electrically connected to the oxide semiconductor film 308 through an opening 341a provided in the insulating films 314 and 316, and the conductive film 312b electrically connected to the oxide semiconductor film 308 through an opening 341b provided in the insulating films 314 and 316. Over the transistor 300B, specifically, over the conductive films 312a and 312b and the insulating film 316, the insulating film 318 is provided.

In the transistor 300B, the insulating films 306 and 307 each function as a gate insulating film of the transistor 300B, the insulating films 314 and 316 each function as a protective insulating film of the oxide semiconductor film 308, and the insulating film 318 functions as a protective insulating film of the transistor 300B. Moreover, in the transistor 300B, the conductive film 304 functions as a gate electrode, the conductive film 312a functions as a source electrode, and the conductive film 312b functions as a drain electrode.

The transistor 300A illustrated in FIGS. 9A to 9C has a channel-etched structure, whereas the transistor 300B in FIGS. 10A to 10C has a channel-protective structure. The oxide semiconductor film of one embodiment of the present invention is suitable for a channel-protective transistor as well.

Structure Example 6 of Transistor

Figure 11A:
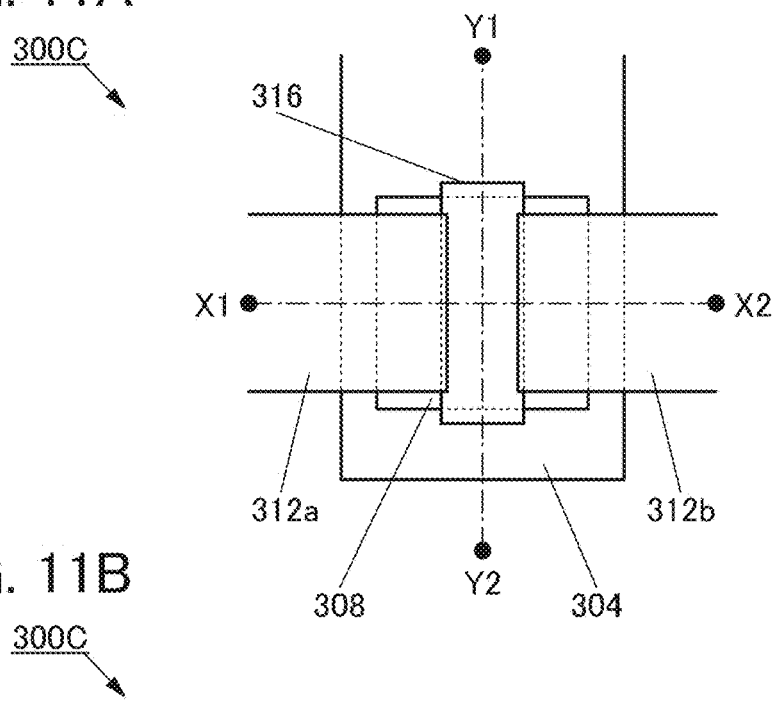
FIGS. 11A to 11C are a top view and cross-sectional views illustrating a semiconductor device.
Figure 11B:
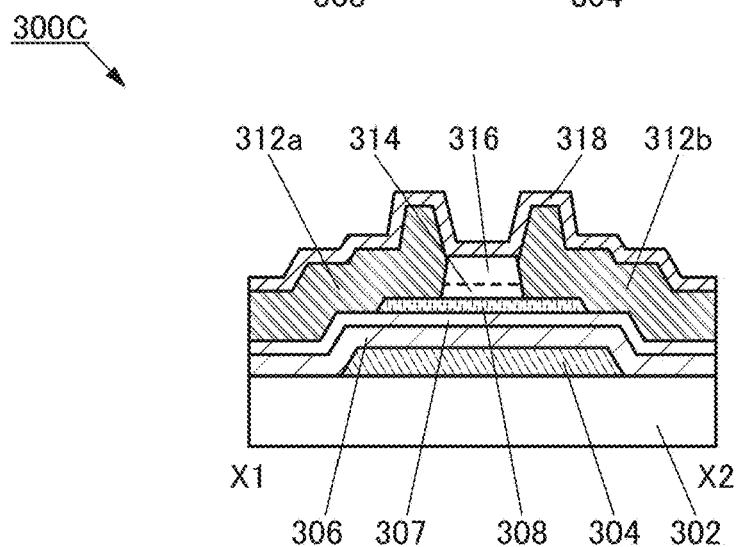
Figure 11C:
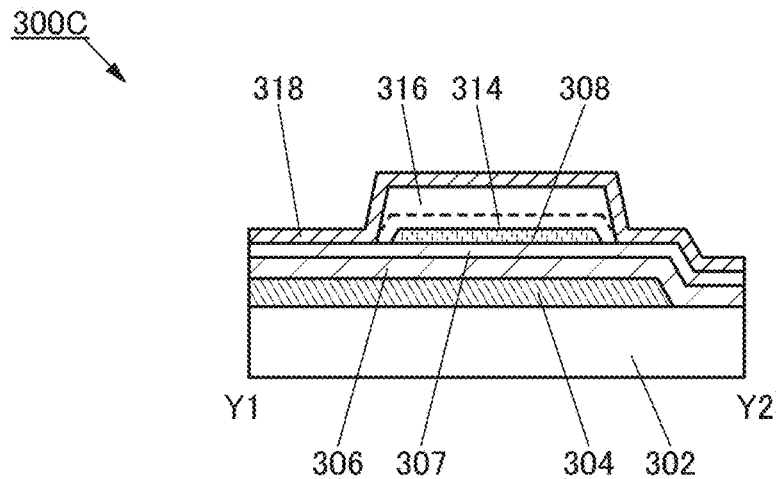

FIG. 11A is a top view of a transistor 300C. FIG. 11B is a cross-sectional view taken along dashed-dotted line X1-X2 in FIG. 11A. FIG. 11C is a cross-sectional view taken along dashed-dotted line Y1-Y2 in FIG. 11A.

The transistor 300C illustrated in FIGS. 11A to 11C is different from the transistor 300B in FIGS. 10A to 10C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

Structure Example 7 of Transistor

Figure 12A:
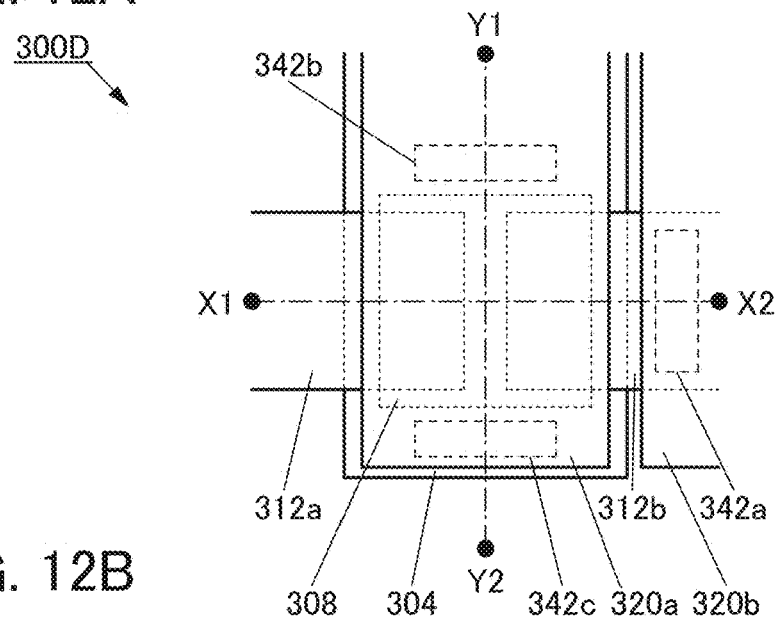
FIGS. 12A to 12C are a top view and cross-sectional views illustrating a semiconductor device.
Figure 12B:
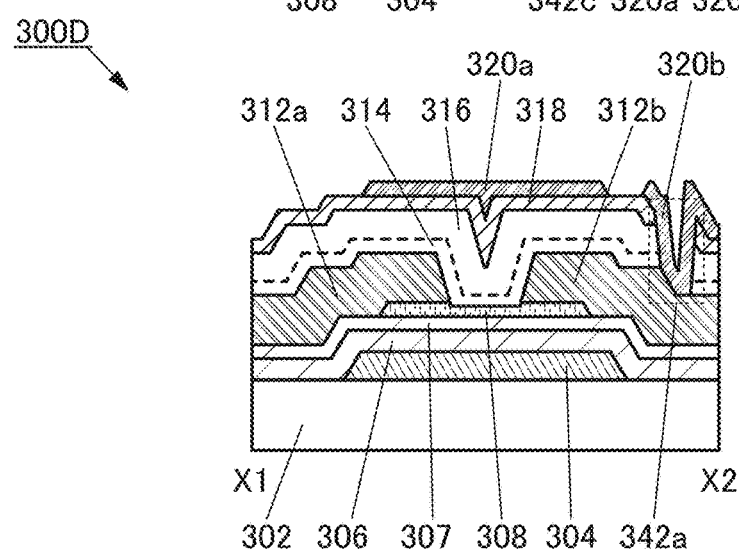
Figure 12C:
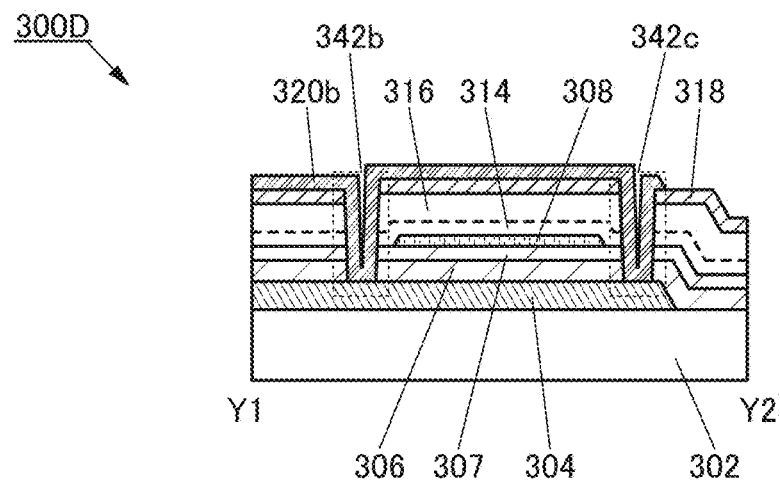

FIG. 12A is a top view of a transistor 300D. FIG. 12B is a cross-sectional view taken along dashed-dotted line X1-X2 in FIG. 12A. FIG. 12C is a cross-sectional view taken along dashed-dotted line Y1-Y2 in FIG. 12A.

The transistor 300D illustrated in FIGS. 12A to 12C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the insulating film 318 over the insulating film 316, and conductive films 320a and 320b over the insulating film 318.

In the transistor 300D, the insulating films 306 and 307 function as first gate insulating films of the transistor 300D, and the insulating films 314, 316, and 318 function as second gate insulating films of the transistor 300D. Furthermore, in the transistor 300D, the conductive film 304 functions as a first gate electrode, the conductive film 320a functions as a second gate electrode, and the conductive film 320b functions as a pixel electrode used for a display device. The conductive film 312a functions as a source electrode, and the conductive film 312b functions as a drain electrode.

As illustrated in FIG. 12C, the conductive film 320b is connected to the conductive film 304 in an opening 342b and an opening 342c provided in the insulating films 306, 307, 314, 316, and 318. Thus, the same potential is applied to the conductive film 320b and the conductive film 304.

The structure of the transistor 300D is not limited to that described above, in which the openings 342b and 342c are provided so that the conductive film 320b is connected to the conductive film 304. For example, a structure in which only one of the openings 342b and 342c is provided so that the conductive film 320b is connected to the conductive film 304, or a structure in which the conductive film 320b is not connected to the conductive film 304 without providing the openings 342b and 342c may be employed. Note that in the case where the conductive film 320b is not connected to the conductive film 304, it is possible to apply different potentials to the conductive film 320b and the conductive film 304.

The conductive film 320b is connected to the conductive film 312b through an opening 342a provided in the insulating films 314, 316, and 318.

Note that the transistor 300D has the S-channel structure described above.

At least part of this embodiment can be implemented in combination with any of the other embodiments described in this specification as appropriate.

Example 1

In this example, measurement results of an oxide semiconductor of one embodiment of the present invention over a substrate are described. A variety of methods were used for the measurement. Note that in this example, Samples 1A, 1B, 1C, 1D, 1E, 1F, 1G, 1H, and 1J were fabricated.

<<Structure of Samples and Fabrication Method Thereof>>

Samples 1A to 1H and 1J relating to one embodiment of the present invention are described below. Samples 1A to 1H and 1J each include a substrate and an oxide semiconductor over the substrate.

Samples 1A to 1H and 1J were fabricated at different temperatures and different oxygen flow rate ratios in formation of the oxide semiconductor. The temperatures and the oxygen flow rate ratios in formation of the oxide semiconductors of Samples 1A to 1H and 1J are shown in Table 1 below.

TABLE 1

|  | Flow rate [sccm] | | Percentage of $O_2$ [%] | Deposition temperature [° C.] |
|---|---|---|---|---|
|  | $O_2$ | Ar | | |
| Sample 1A | 30 | 270 | 10 | R.T. |
| Sample 1B | 90 | 210 | 30 | R.T. |
| Sample 1C | 300 | 0 | 100 | R.T. |
| Sample 1D | 30 | 270 | 10 | 130 |
| Sample 1E | 90 | 210 | 30 | 130 |
| Sample 1F | 300 | 0 | 100 | 130 |
| Sample 1G | 30 | 270 | 10 | 170 |

TABLE 1-continued

|  | Flow rate [sccm] | | Percentage of $O_2$ [%] | Deposition temperature [° C.] |
|---|---|---|---|---|
|  | $O_2$ | Ar | | |
| Sample 1H | 90 | 210 | 30 | 170 |
| Sample 1J | 300 | 0 | 100 | 170 |

Next, methods for fabricating the samples will be described.

A glass substrate was used as the substrate. Over the substrate, a 100-nm-thick In—Ga—Zn oxide was formed as an oxide semiconductor with a sputtering apparatus. The formation conditions were as follows: the pressure in a chamber was 0.6 Pa; and a metal oxide target (where an atomic ratio In:Ga:Zn is 4:2:4.1) was used as a target. The metal oxide target provided in the sputtering apparatus was supplied with an AC power of 2500 W to form the oxide semiconductor.

The formation temperatures and oxygen flow rate ratios shown in the above table were used as the conditions for forming oxide semiconductors to fabricate Samples 1A to 1H and 1J.

Through the above steps, Samples 1A to 1H and 1J of this example were fabricated.

<Analysis by X-Ray Diffraction>

In this section, results of X-ray diffraction (XRD) measurement performed on the oxide semiconductors over the glass substrates are described. As an XRD apparatus, D8 ADVANCE manufactured by Bruker AXS was used. The conditions were as follows: scanning was performed by an out-of-plane method at θ/2θ; the scanning range was 15 deg. to 50 deg.; the step width was 0.02 deg.; and the scanning speed was 3.0 deg./min.

Figure 14:
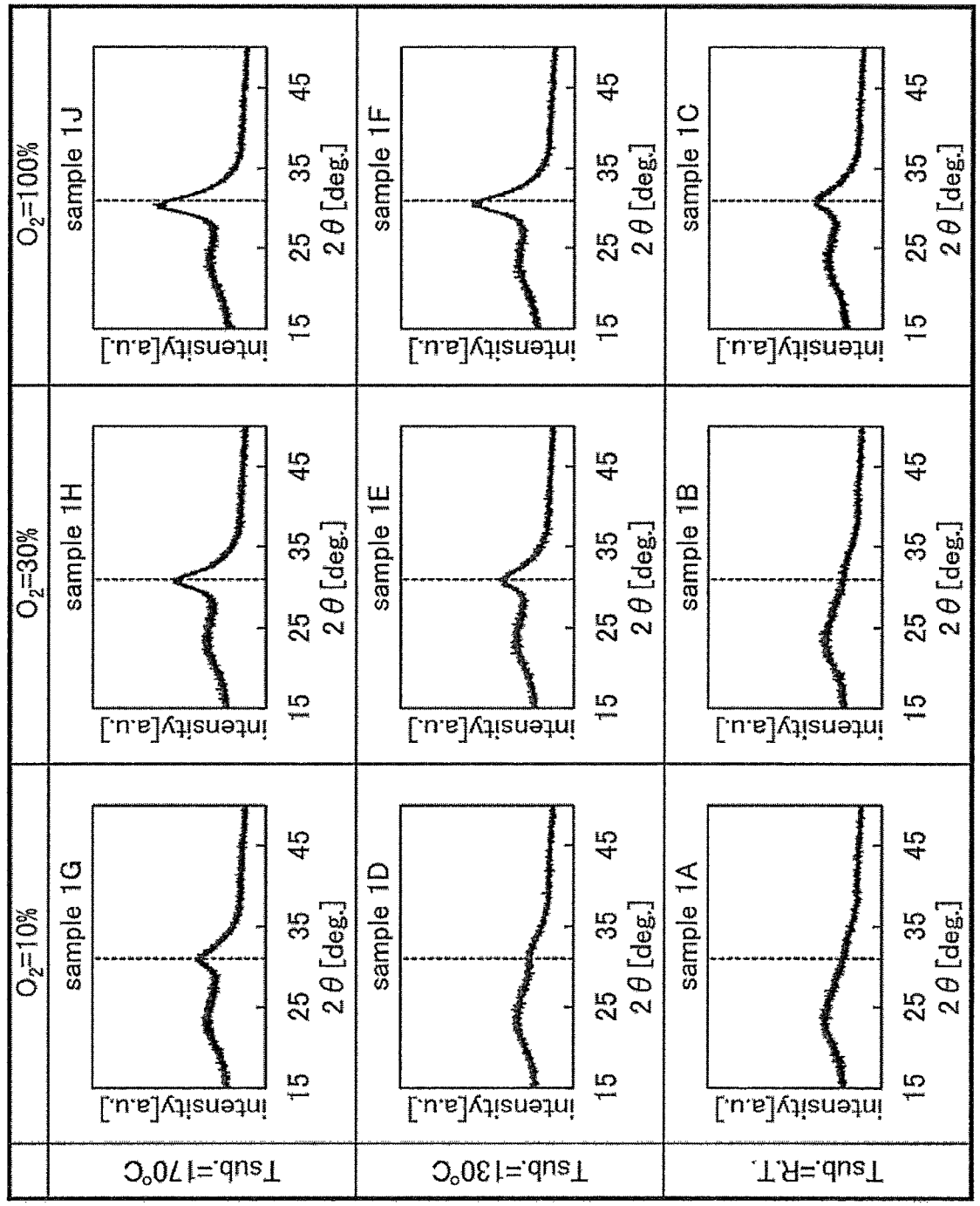
FIG. 14 shows measurement results of XRD spectra of samples of Example.

FIG. 14 shows an XRD spectrum of the samples measured by an out-of-plane method.

In the XRD spectra shown in FIG. 14, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as CAAC-IGZO).

As shown in the XRD spectra in FIG. 14, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<TEM Images and Electron Diffraction>

This section describes the observation and analysis results of Samples 1A, 1D, and 1J with a high-angle annular dark-field scanning transmission electron microscope (HAADF-STEM). An image obtained with an HAADF-STEM is also referred to as a TEM image.

This section describes electron diffraction patterns obtained by irradiation of Samples 1A, 1D, and 1J with an electron beam with a probe diameter of 1 nm (also referred to as a nanobeam).

The plan-view TEM images were observed with a spherical aberration corrector function. The HAADF-STEM images were obtained using an atomic resolution analytical electron microscope JEM-ARM200F manufactured by JEOL Ltd. under the following conditions: the acceleration voltage was 200 kV; and irradiation with an electron beam with a diameter of approximately 0.1 nmφ was performed.

Note that the electron diffraction patterns were observed while an electron beam irradiation was performed at a constant rate for 35 seconds.

Figure 15A:
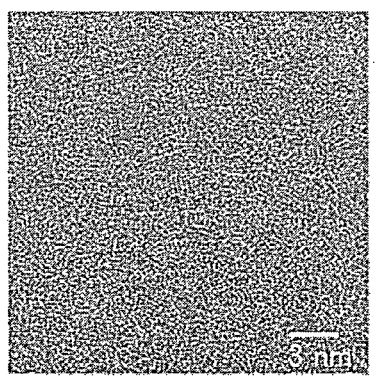
FIGS. 15A to 15F show cross-sectional TEM images and electron diffraction patterns of samples of Example.
Figure 15B:
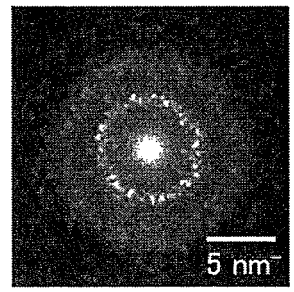
Figure 15C:
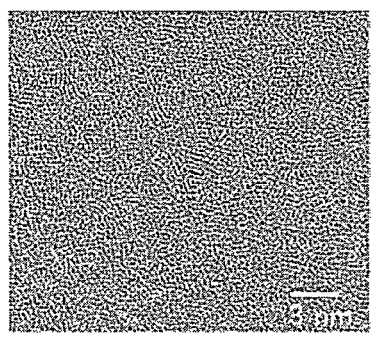
Figure 15D:
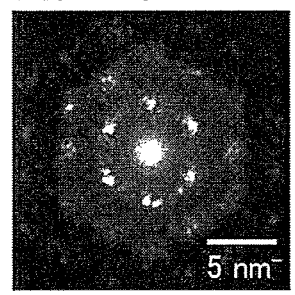
Figure 15E:
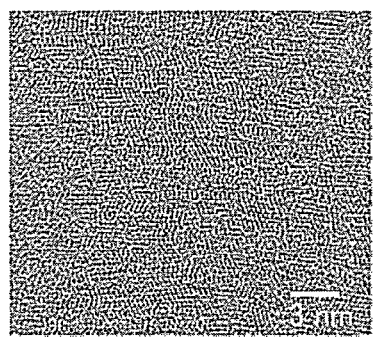
Figure 15F:
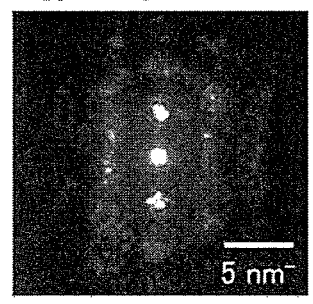

FIG. 15A shows a cross-sectional TEM image of Sample 1A, and FIG. 15B shows an electron diffraction pattern of Sample 1A. FIG. 15C shows a cross-sectional TEM image of Sample 1D, and FIG. 15D shows an electron diffraction pattern of Sample 1D. FIG. 15E shows a cross-sectional TEM image of Sample 1J, and FIG. 15F shows an electron diffraction pattern of Sample 1J.

It is known that, for example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (hereinafter referred to as nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

As shown in FIG. 15A, a nanocrystal (hereinafter, also referred to as nc) is observed in Sample 1A by cross-sectional TEM. In addition, as shown in FIG. 15B, the observed electron diffraction pattern of Sample 1A has a region with high luminance in a circular (ring) pattern. Furthermore, a plurality of spots can be shown in the ring-shaped region.

As shown in FIG. 15C, a CAAC structure and a nanocrystal are observed in Sample 1D by cross-sectional TEM. In addition, as shown in FIG. 15D, the observed electron diffraction pattern of Sample 1D has a region with high luminance in a circular (ring) pattern. Furthermore, a plurality of spots can be shown in the ring-shaped region. In the diffraction pattern, spots derived from the (009) plane are slightly observed.

In contrast, as shown in FIG. 15E, layered arrangement of a CAAC structure is observed in Sample 1J by cross-sectional TEM.

The features observed in the cross-sectional TEM images and the plan-view TEM images are one aspect of a structure of an oxide semiconductor.

Next, electron diffraction patterns obtained by irradiation of Sample 1A with an electron beam with a probe diameter of 1 nm (also referred to as a nanobeam) are shown in FIGS. 16A to 16L.

Electron diffraction patterns of points indicated by black dots a1, a2, a3, a4, and a5 in the plan-view TEM image of Sample 1A in FIG. 16A are observed. Note that the electron diffraction patterns are observed while electron beam irradiation is performed at a constant rate for 35 seconds. FIGS. 16C, 16D, 16E, 16F, and 16G show the results of the points indicated by the black dots a1, a2, a3, a4, and a5, respectively.

In FIGS. 16C to 16G, regions with high luminance in a ring pattern were shown. Furthermore, a plurality of spots are shown in the ring-shaped regions.

Electron diffraction patterns of points indicated by black dots b1, b2, b3, b4, and b5 in the cross-sectional TEM image of Sample 1A in FIG. 16B are observed. FIGS. 16H, 16I, 16J, 16K, and 16L show the results of the points indicated by the black dots b1, b2, b3, b4, and b5, respectively.

In FIGS. 16H to 16L, regions with high luminance in a ring pattern are shown. Furthermore, a plurality of spots are shown in the ring-shaped regions.

In other words, it is found that Sample 1A has an nc structure and has characteristics distinctly different from those of an oxide semiconductor film having an amorphous structure and an oxide semiconductor film having a single crystal structure.

According to the above description, the electron diffraction patterns of Sample 1A and Sample 1D each have the region with high luminance in a ring pattern and the plurality of bright spots appear in the ring-shaped region. Thus, it is found that Sample 1A exhibits an electron diffraction pattern of the nc-OS and does not show alignment in the plane direction and the cross-sectional direction. In addition, it is found that Sample 1D has an nc structure and a CAAC structure.

In the electron diffraction pattern of Sample 1J, spots derived from the (009) plane of an $InGaZnO_4$ crystal are included. Thus, Sample 1J has c-axis alignment and the c-axes are aligned in the direction substantially perpendicular to the formation surface or the top surface of Sample 1J.

<Analysis of TEM Image>

This section describes the observation and analysis results of Samples 1A, 1C, 1D, 1F, 1G, and 1J with an HAADF-STEM.

The results of image analysis of plan-view TEM images are described. The plan-view TEM images were obtained with a spherical aberration corrector function. The plan-view TEM images were obtained using an atomic resolution analytical electron microscope JEM-ARM200F manufactured by JEOL Ltd. under the following conditions: the acceleration voltage was 200 kV; and irradiation with an electron beam with a diameter of approximately 0.1 nmφ was performed.

Figure 17:
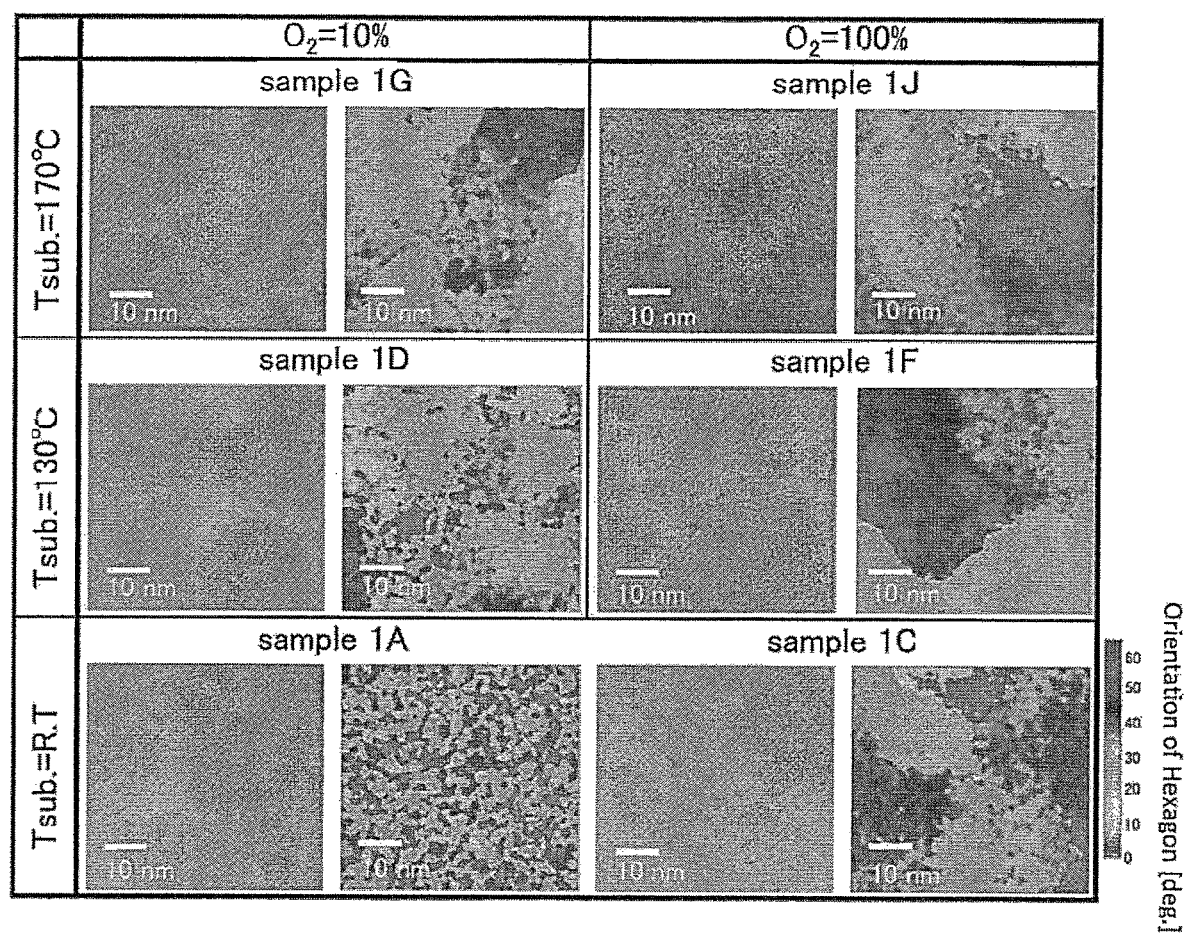
FIG. 17 shows plan-view TEM images of samples of Example and images obtained through analysis thereof.

In FIG. 17, the plan-view TEM images of Samples 1A, 1C, 1D, 1F, 1G, and 1J and images obtained through image processing of the plan-view TEM images are shown. Note that in a table in FIG. 17, left views are the plan-view TEM images and right views are the images obtained through image processing of the plan-view TEM images on the left side.

Image processing and image analyzing methods are described. Image processing was performed as follows. The plan-view TEM image in FIG. 17 was subjected to fast Fourier transform (FFT), so that an FFT image was obtained. Then, the obtained FFT image was subjected to mask processing except for a range from 2.8 $nm^{-1}$ to 5.0 $nm^{-1}$. After that, the FFT image subjected to mask processing was subjected to inverse fast Fourier transform (IFFT) to obtain an FFT filtering image.

To conduct the image analysis, lattice points were extracted from the FFT filtering image in the following manner. First, noise in the FFT filtering image was removed. To remove the noise, the luminance of a region within a 0.05-nm radius was smoothed using Formula 1.

[Formula 1]

$$S\_Int(x, y) = \sum_{r \leq 0.05} \frac{Int(x', y')}{r} \quad (1)$$

Note that S_Int(x,y) represents the smoothed luminance at the coordinates (x,y), r represents the distance between the coordinates (x,y) and the coordinates (x',y'), and Int(x',y') represents the luminance at the coordinates (x',y'). In the calculation, r is regarded as 1 when it is 0.

Then, a search for lattice points was conducted. The coordinates with the highest luminance among candidate lattice points within a 0.22-nm radius were regarded as the lattice point. At this point, a candidate lattice point was extracted. Within a 0.22-nm radius, detection errors of lattice points due to noise can be less frequent. Note that adjacent lattice points are a certain distance away from each other in the TEM image; thus, two or more lattice points are unlikely to be observed within a 0.22-nm radius.

Subsequently, coordinates with the highest luminance within a 0.22-nm radius from the extracted candidate lattice point were extracted to redetermine a candidate lattice point. The extraction of a candidate lattice point was repeated in this manner until no new candidate lattice point appeared; the coordinates at that point were determined as a lattice point. Similarly, determination of another lattice point was performed at a position 0.22 nm or more away from the determined lattice point; thus, lattice points were determined in the entire region. The determined lattice points are collectively called a lattice point group.

Figure 18A:
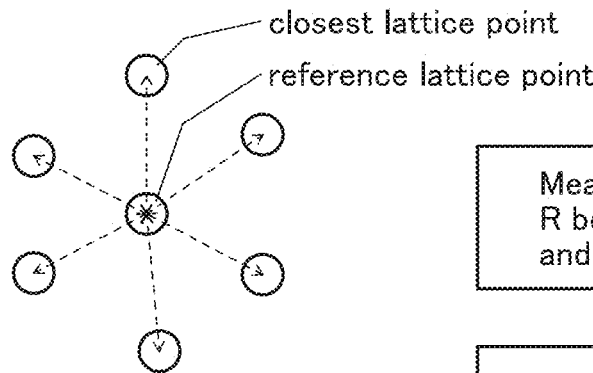
FIGS. 18A to 18D illustrate a method for deriving a rotation angle of a hexagon.
Figure 18B:
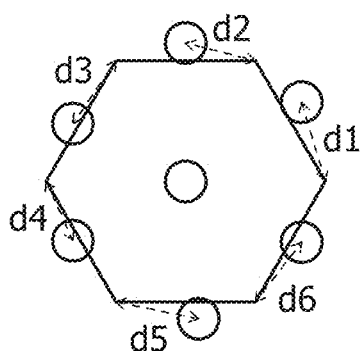
Figure 18C:
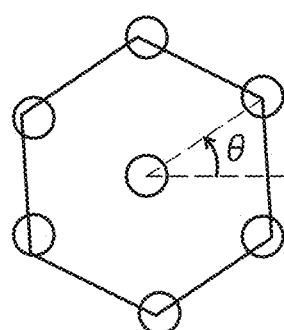
Figure 18D:
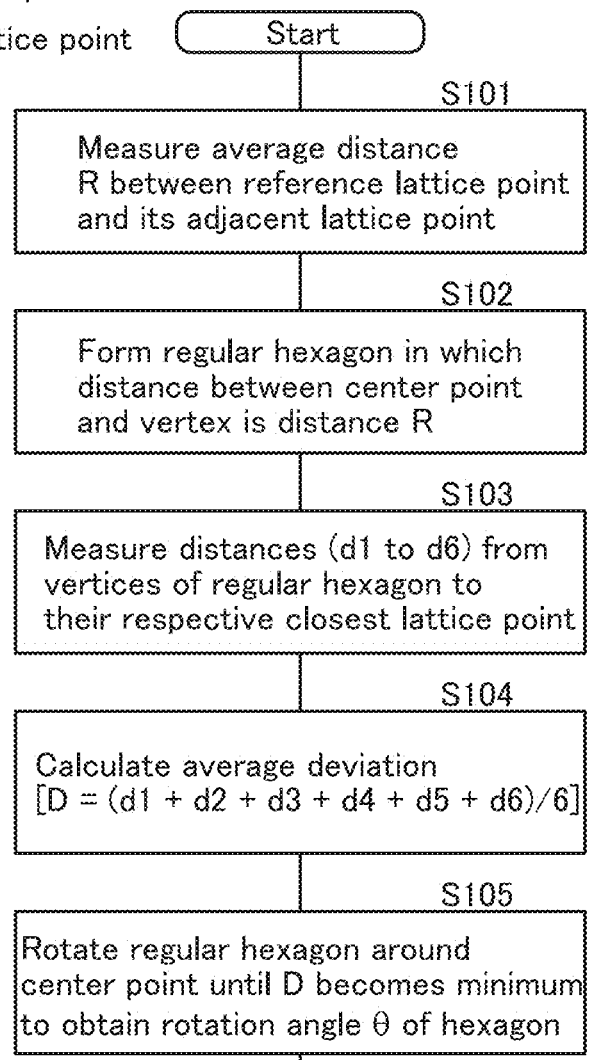

Here, a method for deriving an orientation of a hexagonal lattice from the extracted lattice point group is described with reference to schematic diagrams in FIGS. 18A to 18C and a flow chart in FIG. 18D. First, a reference lattice point was determined and the six closest lattice points to the reference lattice point were connected to form a hexagonal lattice (see FIG. 18A and Step S101 in FIG. 18D). After that, an average distance R between the reference lattice point, which was the center point of the hexagonal lattice, and each of the lattice points, which is a vertex, was calculated. Then, a regular hexagon was formed with the use of the reference lattice point as the center point and the calculated distance R as the distance from the center point to each vertex (see Step S102 in FIG. 18D). The distances from the vertices of the regular hexagon to their respective closest lattice points were regarded as a distance d1, a distance d2, a distance d3, a distance d4, a distance d5, and a distance d6 (see FIG. 18B and Step S103 in FIG. 18D). Next, the regular hexagon was rotated around the center point through 60° by 0.1°, and the average deviation between the hexagonal lattice and the rotated regular hexagon [D=(d1+d2+d3+d4+d5+d6)/6] was calculated (see Step S104 in FIG. 18D). Then, a rotation angle θ of the regular hexagon when the average deviation D becomes minimum was calculated as the orientation of the hexagonal lattice (see FIG. 18C and Step S105 in FIG. 18D).

Next, an observation area of the plan-view TEM image was adjusted so that hexagonal lattices whose orientations were 30° account for the highest percentage. In such a condition, the average orientation of hexagonal lattice within a 1-nm radius was calculated. The plan-view TEM image obtained through image processing was shown where color or gradation changes in accordance with the angle of the hexagonal lattice in the region. The image obtained through image processing of the plan-view TEM image in FIG. 17 is an image obtained by performing image analysis on the plan-view TEM image in FIG. 17 by the above method and applying color in accordance with the angle of the hexagonal lattice. In other words, the image obtained through the image processing of the plan-view TEM image is an image in which the orientations of lattice points in certain wavenumber ranges are extracted by color-coding the certain wavenumber ranges in an FFT filtering image of the plan-view TEM image.

As shown in FIG. 17, in Samples 1A and 1D in which nc is observed, the hexagons are oriented randomly and distributed in a mosaic pattern. In Sample 1J in which a layered structure is observed in the cross-sectional TEM image, regions with uniformly oriented hexagons exist in a large area of several tens of nanometers. In Sample 1D, it is found that an nc region in a random mosaic pattern and a large-area region with uniformly oriented hexagons as in Sample 1J are included.

It is found from FIG. 17 that as the substrate temperature at the time of formation is lower or the oxygen gas flow rate ratio at the time of formation is lower, regions in which the hexagons are oriented randomly and distributed in a mosaic pattern are likely to exist.

Through the analysis of a plan-view TEM image of a CAAC-OS, a boundary portion where angles of hexagonal lattices change can be examined.

Next, Voronoi diagrams were formed using lattice point groups in Sample 1A. A Voronoi diagram is an image partitioned by regions including a lattice point group. Each lattice point is closer to regions surrounding the lattice point than to any other lattice point. A method for forming a Voronoi diagram is described below in detail using schematic diagrams in FIGS. 19A to 19D and a flow chart in FIG. 19E.

First, a lattice point group was extracted by the method described using FIGS. 18A to 18D or the like (see FIG. 19A and Step S111 in FIG. 19E). Next, adjacent lattice points were connected with segments (see FIG. 19B and Step S112 in FIG. 19E). Then, perpendicular bisectors of the segments were drawn (see FIG. 19C and Step S113 in FIG. 19E). Subsequently, points where three perpendicular bisectors intersect were extracted (see Step S114 in FIG. 19E). The points are called Voronoi points. After that, adjacent Voronoi points were connected with segments (see FIG. 19D and Step S115 in FIG. 19E). A polygonal region surrounded by the segments at this point is called a Voronoi region. In the above method, a Voronoi diagram was formed.

Figure 20:
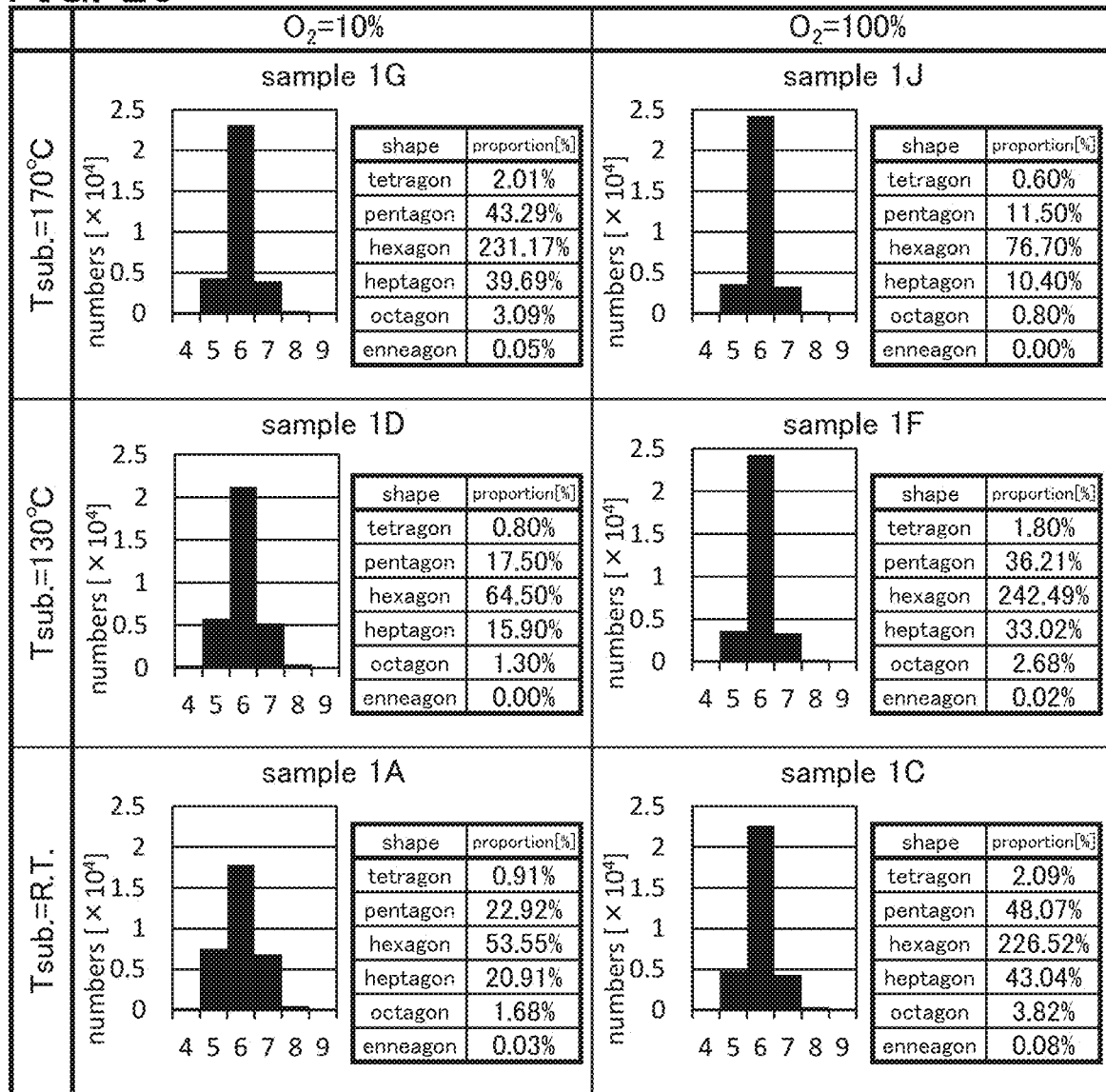
FIG. 20 shows the number and proportions of shapes of Voronoi regions of Example.

FIG. 20 shows the proportions of the shapes of Voronoi regions (tetragon, pentagon, hexagon, heptagon, octagon, and enneagon) in Samples 1A, 1C, 1D, 1F, 1G, and 1J. Bar graphs show the numbers of the shapes of Voronoi regions (tetragon, pentagon, hexagon, heptagon, octagon, and enneagon) in the samples. Furthermore, tables show the proportions of the shapes of Voronoi regions (tetragon, pentagon, hexagon, heptagon, octagon, and enneagon) in the samples.

It is found from FIG. 20 that there is a tendency that the proportion of hexagons is high in Sample 1J with a high degree of crystallinity and the proportion of hexagons is low in Sample 1A with a low degree of crystallinity. The proportion of hexagons in Sample 1D is between those in Samples 1J and 1A. Accordingly, it is found from FIG. 20 that the crystal state of the oxide semiconductor significantly differs under different formation conditions.

It is found from FIG. 20 that as the substrate temperature at the time of formation is lower or the oxygen gas flow rate ratio at the time of formation is lower, the degree of crystallinity is lower and the proportion of hexagons is lower.

<Elementary Analysis>

This section describes the analysis results of elements included in Sample 1A. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this example, peaks of an EDX spectrum of the point were attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

FIGS. 21A to 21H show a cross-sectional TEM image, a plan-view TEM image, and EDX mapping images of Sample 1A. In the EDX mapping images, the proportion of an element is indicated by grayscale: the more measured atoms exist in a region, the brighter the region is; the less measured atoms exist in a region, the darker the region is. The magnification of the EDX mapping images in FIGS. 21B to 21D and 21F to 21H is 7,200,000 times.

FIG. 21A shows a cross-sectional TEM image, and FIG. 21E shows a plan-view TEM image. FIG. 21B shows a cross-sectional EDX mapping image of In atoms, and FIG. 21F shows a plan-view EDX mapping image of In atoms. In the EDX mapping image in FIG. 21B, the proportion of the In atoms in all the atoms is 9.28 atomic % to 33.74 atomic %. In the EDX mapping image in FIG. 21F, the proportion of the In atoms in all the atoms is 12.97 atomic % to 38.01 atomic %.

FIG. 21C shows a cross-sectional EDX mapping image of Ga atoms, and FIG. 21G shows a plan-view EDX mapping image of Ga atoms. In the EDX mapping image in FIG. 21C, the proportion of the Ga atoms in all the atoms is 1.18 atomic % to 18.64 atomic %. In the EDX mapping image in FIG. 21G, the proportion of the Ga atoms in all the atoms is 1.72 atomic % to 19.82 atomic %.

FIG. 21D shows a cross-sectional EDX mapping image of Zn atoms, and FIG. 21H shows a plan-view EDX mapping image of Zn atoms. In the EDX mapping image in FIG. 21D, the proportion of the Zn atoms in all the atoms is 6.69 atomic % to 24.99 atomic %. In the EDX mapping image in FIG. 21H, the proportion of the Zn atoms in all the atoms is 9.29 atomic % to 28.32 atomic %.

Note that FIGS. 21A to 21D show the same region in the cross section of Sample 1A. FIGS. 21E to 21H show the same region in the plane of Sample 1A.

Figure 22A:
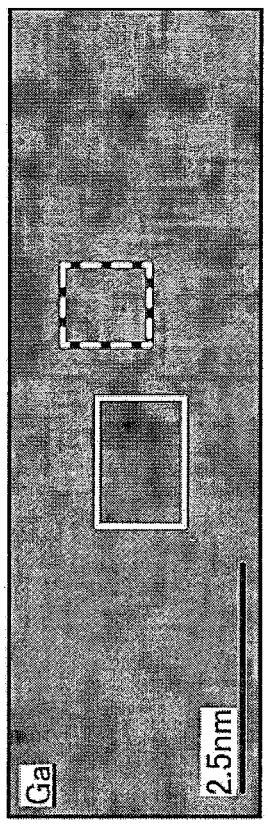
FIGS. 22A to 22C show EDX mapping images of a sample of Example.
Figure 22B:
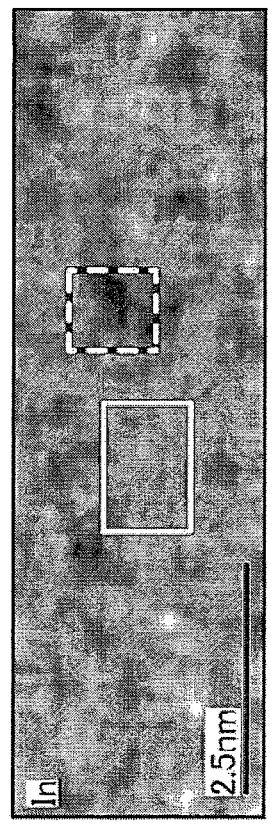
Figure 22C:
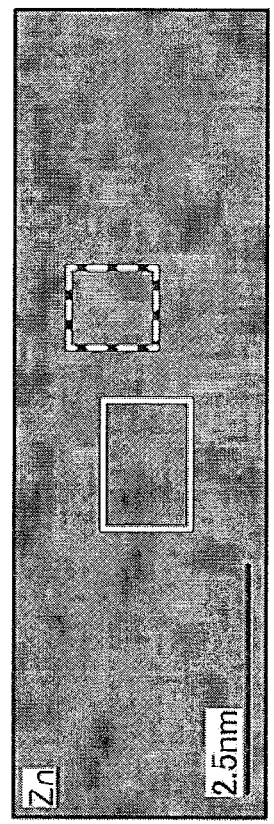

FIGS. 22A to 22C show enlarged cross-sectional EDX mapping images of Sample 1A. FIG. 22A is an enlarged view of a part in FIG. 21B. FIG. 22B is an enlarged view of a part in FIG. 21C. FIG. 22C is an enlarged view of a part in FIG. 21D.

The EDX mapping images in FIGS. 22A to 22C show relative distribution of bright and dark areas, indicating that the atoms have distributions in Sample 1A. Areas surrounded by solid lines and areas surrounded by dashed lines in FIGS. 22A to 22C are examined.

As shown in FIG. 22A, a relatively dark region occupies a large area in the area surrounded by the solid line and a relatively bright region occupies in a large area in the area surrounded by the dashed line. As shown in FIG. 22B, a relatively bright region occupies a large area in the area surrounded by the solid line and a relatively dark region occupies a large area in the area surrounded by the dashed line.

That is, it is found that the areas surrounded by the solid lines are regions including a relatively large number of In atoms and the areas surrounded by the dashed lines are regions including a relatively small number of In atoms. FIG. 22C shows that a right portion of the area surrounded by the solid line is relatively bright and a left portion thereof is relatively dark. Thus, it is found that the area surrounded by the solid line is a region including $In_{X2}Zn_{Y2}O_{Z2}$, $InO_{X1}$, or the like as a main component.

It is found that the area surrounded by the solid line is a region including a relatively small number of Ga atoms and the area surrounded by the dashed line is a region including a relatively large number of Ga atoms. FIG. 22C shows that an upper left portion of the area surrounded by the dashed line is relatively dark and a lower right portion thereof is relatively bright. Thus, it is found that the area surrounded by the dashed line is a region including $GaO_{X3}$, $Ga_{X4}Zn_{Y4}O_{Z4}$, or the like as a main component.

Furthermore, as shown in FIGS. 22A to 22C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. It can be thus guessed that the regions including $In_{X2}Zn_{Y2}O_{Z2}$ or $InO_{X1}$ as a main component extend like a cloud.

An In—Ga—Zn oxide having a composition in which the regions including $GaO_{X3}$ as a main component and the regions including $In_{X2}Zn_{Y2}O_{Z2}$ or $InO_{X1}$ as a main component are unevenly distributed and mixed can be referred to as CAC-IGZO.

As shown in FIGS. 22A to 22C, each of the regions including $GaO_{X3}$ as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm.

As described above, it is confirmed that the CAC-IGZO has a structure different from that of an IGZO compound in which metal elements are evenly distributed, and has characteristics different from those of the IGZO compound. That is, it can be confirmed that in the CAC-IGZO, regions including $GaO_{X3}$ or the like as a main component and regions including $In_{X2}Zn_{Y2}O_{Z2}$ or $InO_{X1}$ as a main component are separated to form a mosaic pattern.

Accordingly, it can be expected that when CAC-IGZO is used for a semiconductor element, the property derived from $GaO_{X3}$ or the like and the property derived from $In_{X2}Zn_{Y2}O_{Z2}$ or $InO_{X1}$ complement each other, whereby high on-state current ($I_{on}$), high field-effect mobility ($\mu$), and low off-state current ($I_{off}$) can be achieved. A semiconductor element including CAC-IGZO has high reliability. Thus, CAC-IGZO is suitably used in a variety of semiconductor devices typified by a display.

At least part of this example can be implemented in combination with any of embodiments and the other examples described in this specification as appropriate.

Example 2

In this example, the transistor 150 including the oxide semiconductor film 108 of one embodiment of the present invention was fabricated and subjected to tests for electrical characteristics and reliability. In this example, nine transistors, i.e., Samples 2A, 2B, 2C, 2D, 2E, 2F, 2G, 2H, and 2J, were fabricated as the transistor 150 including the oxide semiconductor 108.

<Structure of Samples and Fabrication Method Thereof>

Samples 2A to 2H and 2J relating to one embodiment of the present invention are described below. As Samples 2A to 2H and 2J, the transistors 150 having the structure illustrated in FIGS. 3A to 3C were fabricated by the fabrication method described in Embodiment 2 with reference to FIGS. 6A to 6D, FIGS. 7A to 7C, and FIGS. 8A to 8C.

Samples 2A to 2H and 2J were fabricated at different temperatures and different oxygen flow rate ratios in formation of the oxide semiconductor 108. The temperatures and the oxygen flow rate ratios in formation of the oxide semiconductors of Samples 2A to 2H and 2J are shown in Table 2 below.

TABLE 2

| | Formation conditions of oxide semiconductor film 108 | | | |
|---|---|---|---|---|
| | Flow rate [sccm] | | Percentage of $O_2$ [%] | Deposition temperature [° C.] |
| | $O_2$ | Ar | | |
| Sample 2A | 30 | 270 | 10 | R.T. |
| Sample 2B | 90 | 210 | 30 | R.T. |
| Sample 2C | 300 | 0 | 100 | R.T. |
| Sample 2D | 30 | 270 | 10 | 130 |
| Sample 2E | 90 | 210 | 30 | 130 |
| Sample 2F | 300 | 0 | 100 | 130 |
| Sample 2G | 30 | 270 | 10 | 170 |
| Sample 2H | 90 | 210 | 30 | 170 |
| Sample 2J | 300 | 0 | 100 | 170 |

The samples were fabricated by the fabrication method described in Embodiment 2. The oxide semiconductor 108 was formed using a metal oxide target (In:Ga:Zn=4:2:4.1 [atomic ratio]).

The transistor 150 had a channel length of 2 μm and a channel width of 3 μm (hereinafter, also referred to as L/W=2/3 μm) or a channel length of 2 μm and a channel width of 50 μm (hereinafter, also referred to as L/W=2/50 μm).

<$I_d$-$V_g$ Characteristics of Transistors>

Next, $I_d$-$V_g$ characteristics of the transistors (L/W=2/3 μm) in Samples 2A to 2H and 2J were measured. As conditions for measuring the $I_d$-$V_g$ characteristics of each transistor, a voltage applied to the conductive film 112 serving as a first gate electrode (hereinafter the voltage is also referred to as gate voltage ($V_g$)) and a voltage applied to the conductive film 106 serving as a second gate electrode (hereinafter the voltage is also referred to as back gate voltage ($V_{bg}$)) were changed from −10 V to +10 V in increments of 0.25 V. A voltage applied to the conductive film 120a serving as a source electrode (the voltage is also referred to as source voltage ($V_s$)) was 0 V (comm), and a voltage applied to the conductive film 120b serving as a drain electrode (the voltage is also referred to as drain voltage ($V_d$)) was 0.1 V and 20 V.

Figure 23:
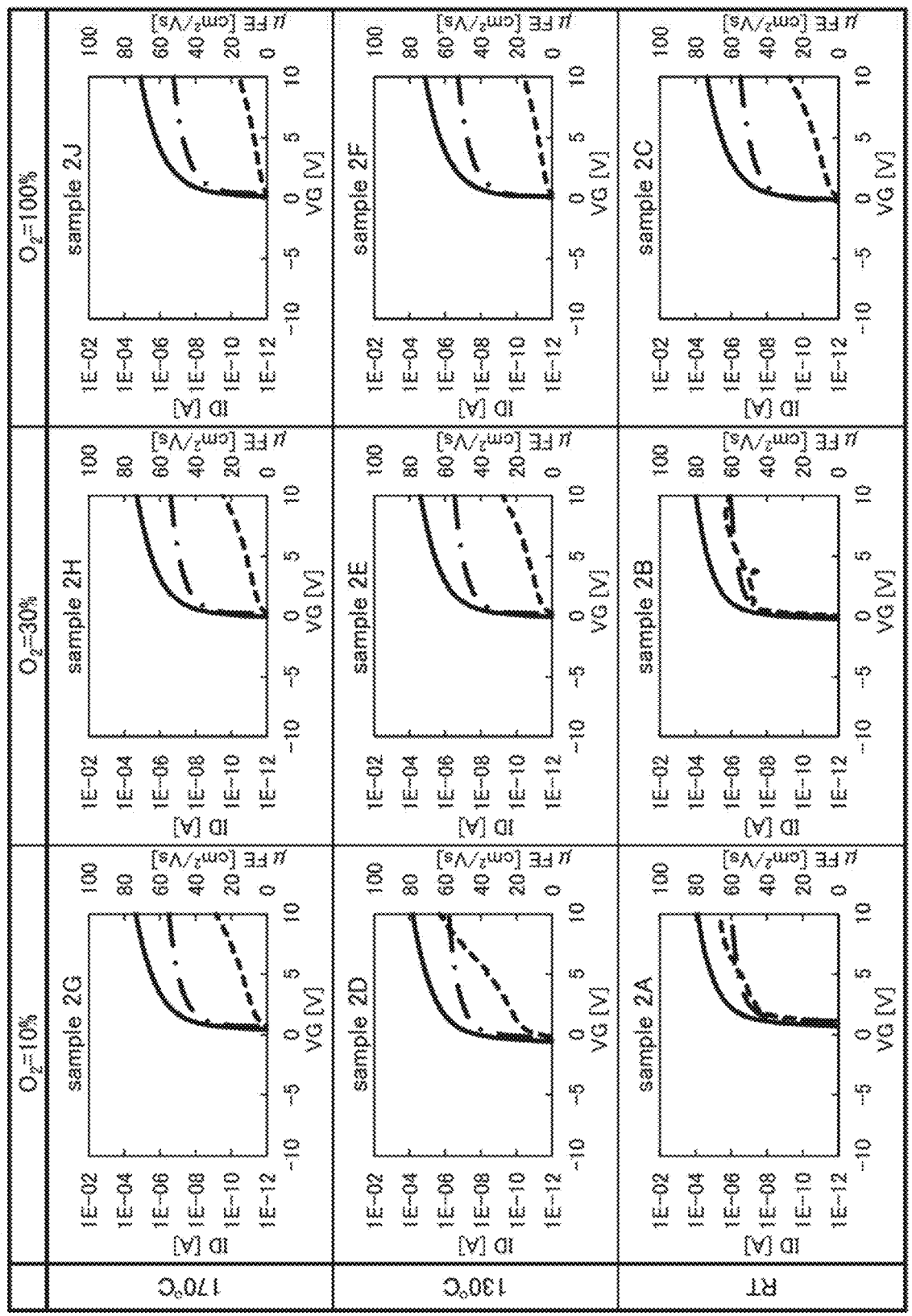
FIG. 23 shows $I_d$-$V_g$ curves of samples of Example.

In FIG. 23, the results of $I_d$-$V_g$ characteristics and field-effect mobilities of Samples 2A to 2H and 2J are shown. The solid line and the dashed-dotted line represent $I_d$ at $V_d$=20 V and $I_d$ at $V_d$=0.1 V, respectively. The dashed line represents field-effect mobility. In FIG. 23, the first vertical axis represents $I_d$ [A], the second vertical axis represents field-effect mobility (μFE) [cm$^2$/Vs], and the horizontal axis represents $V_g$ [V]. The field-effect mobility was calculated from the value measured at $V_d$=20 V.

As shown in FIG. 23, it is found that Samples 2A to 2H and 2J have different on-state currents ($I_{on}$) and different field effect mobilities, particularly different field effect mobilities in saturation regions. In particular, the maximum saturation mobilities and the rising characteristics of the field-effect mobilities around 0 V differ distinctly.

It is found from FIG. 23 that as the substrate temperature at the time of formation is lower or the oxygen flow rate ratio at the time of formation is lower, the on-state current ($I_{on}$) becomes higher and the field effect mobility rises more steeply around 0 V. In particular, Sample 2A has a maximum field-effect mobility close to 70 cm$^2$/Vs.

<Gate Bias-Temperature Stress Test (GBT Test)>

Next, the reliability of the transistors (L/W=2/50 μm) of Samples 2A to 2H and 2J was evaluated. As the reliability evaluation, GBT tests were used.

The conditions for GBT tests in this example were as follows. A voltage applied to the conductive film 112 serving as the first gate electrode and the conductive film 106 serving as the second gate electrode (hereinafter referred to as gate voltage ($V_g$)) was ±30 V, and a voltage applied to the conductive film 120a serving as the source electrode and the conductive film 120b serving as a drain electrode (hereinafter referred to as source voltage ($V_s$) and drain voltage ($V_d$), respectively) was 0 V (COMMON). The stress temperature was 60° C., the time for stress application was 1 hour, and two kinds of measurement environments, a dark environment and a photo environment (irradiation with light at approximately 10,000 lx from a white LED), were employed.

In other words, the conductive film 120a serving as the source electrode of the transistor 150 and the conductive film 120b serving as the drain electrode of the transistor 150 were set at the same potential, and a potential different from that of the conductive film 120a serving as the source electrode and the conductive film 120b serving as the drain electrode was applied to the conductive film 112 serving as the first gate electrode and the conductive film 106 serving as the second gate electrode for a certain time (here, one hour).

A case where the potential applied to the conductive film 112 serving as the first gate electrode and the conductive film 106 serving as the second gate electrode is higher than the potential applied to the conductive film 120a serving as the source electrode and the conductive film 120b serving as the drain electrode is called positive stress, and a case where the potential applied to the conductive film 112 serving as the first gate electrode and the conductive film 106 serving as the second gate electrode is lower than the potential applied to the conductive film 120a serving as the source electrode and the conductive film 120b serving as the drain electrode is called negative stress. Thus, the reliability evaluation was performed under four conditions in total, i.e., positive GBT (dark), negative GBT (dark), positive GBT (light irradiation), and negative GBT (light irradiation).

Note that the positive GBT (dark) can be referred to as positive bias temperature stress (PBTS), the negative GBT (dark) as negative bias temperature stress (NBTS), the positive GBT (light irradiation) as positive bias illumination temperature stress (PBITS), and the negative GBT (light irradiation) as negative bias illumination temperature stress (NBITS).

Figure 24:
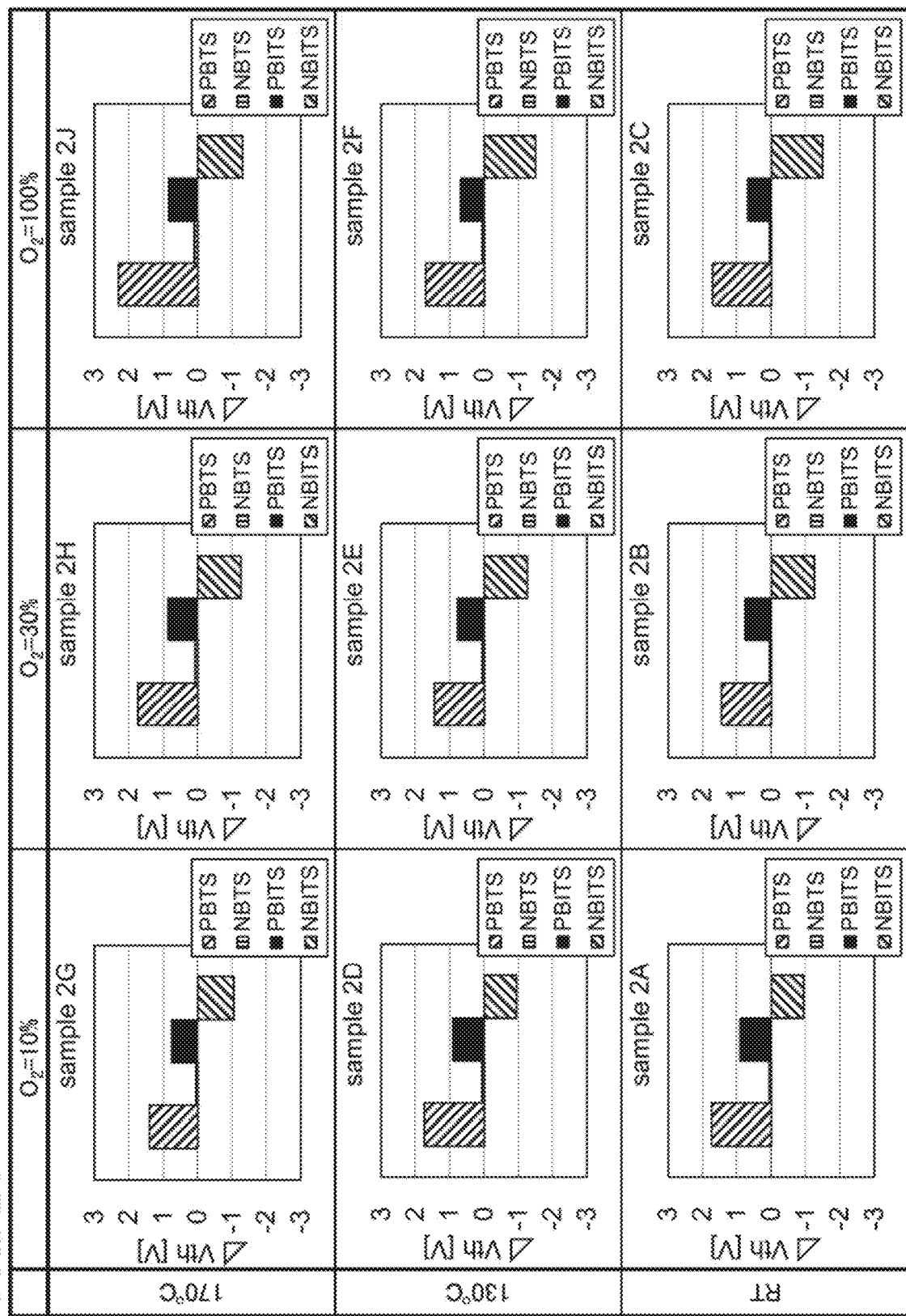
FIG. 24 shows $I_d$-$V_g$ characteristics of samples of Example after +GBT stress tests.

FIG. 24 shows the GBT test results of Samples 2A to 2H and 2J. In FIG. 24, the vertical axis represents the amount of shift in the threshold voltage ($\Delta V_{th}$) of the transistors.

The results in FIG. 24 indicate that the amount of shift in the threshold voltage ($\Delta V_{th}$) of each of the transistors included in Samples 2A to 2H and 2J was within ±3 V in the GBT tests. Thus, it is confirmed that the transistors included in Samples 2A to 2H and 2J each have high reliability.

Thus, even the IGZO film having low crystallinity is presumed to have a low density of defect states like an IGZO film having high crystallinity.

At least part of this example can be implemented in combination with any of embodiments and the other examples described in this specification as appropriate.

Example 3

In this example, measurement results of an oxide semiconductor of one embodiment of the present invention formed over a substrate are described. A variety of methods were used for the measurement. Note that in this example, Samples 3A, 3D, and 3J were fabricated.

<<Structure of Samples and Fabrication Method Thereof>>

Samples 3A, 3D, and 3J relating to one embodiment of the present invention are described below. Samples 3A, 3D, and 3J each include a substrate and an oxide semiconductor over the substrate.

Samples 3A, 3D, and 3J were fabricated at different temperatures and different oxygen flow rate ratios in formation of the oxide semiconductor. The temperatures and the oxygen flow rate ratios in formation of the oxide semiconductors of Samples 3A, 3D, and 3J are shown in Table 3 below.

TABLE 3

|  | Flow rate [sccm] | | Percentage of $O_2$ [%] | Deposition temperature [° C.] |
| --- | --- | --- | --- | --- |
|  | $O_2$ | Ar | | |
| Sample 3A | 30 | 270 | 10 | R.T. |
| Sample 3D | 30 | 270 | 10 | 130 |
| Sample 3J | 150 | 150 | 50 | 170 |

Next, methods for fabricating the samples will be described.

A glass substrate was used as the substrate. Over the substrate, a 100-nm-thick In—Ga—Zn oxide semiconductor was formed as an oxide semiconductor with a sputtering apparatus. The formation conditions were as follows: the pressure in a chamber was 0.6 Pa, and a metal oxide target (where an atomic ratio In:Ga:Zn is 1:1:1.2) was used as a target. The metal oxide target provided in the sputtering apparatus was supplied with an AC power of 2500 W.

The formation temperatures and oxygen flow rate ratios shown in the above table were used as the conditions for forming oxide semiconductors to fabricate Samples 3A, 3D, and 3J.

Through the above steps, Samples 3A, 3D, and 3J of this example were fabricated.

<TEM Images and Electron Diffraction>

This section describes the TEM observation and analysis results of Samples 3A, 3D, and 3J.

This section describes electron diffraction patterns obtained by irradiation of Samples 3A, 3D, and 3J with an electron beam with a probe diameter of 1 nm (also referred to as a nanobeam).

The plan-view TEM images were observed with a spherical aberration corrector function. The HAADF-STEM images were obtained using an atomic resolution analytical electron microscope JEM-ARM200F manufactured by JEOL Ltd. under the following conditions: the acceleration voltage was 200 kV, and irradiation with an electron beam with a diameter of approximately 0.1 nmφ was performed.

Note that the electron diffraction patterns were observed while an electron beam irradiation was performed at a constant rate for 35 seconds.

Figure 25A:
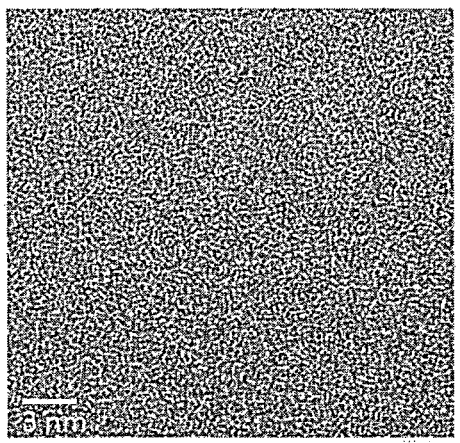
FIGS. 25A to 25F show cross-sectional TEM images and electron diffraction patterns of samples of Example.
Figure 25B:
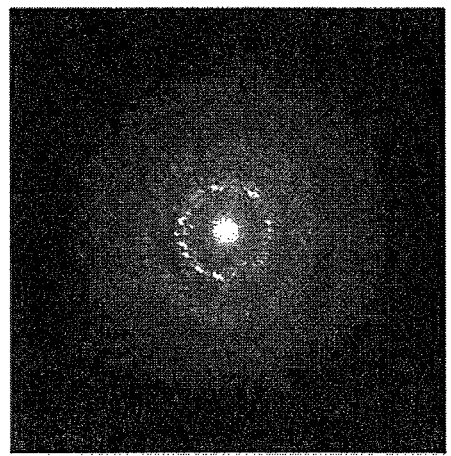
Figure 25C:
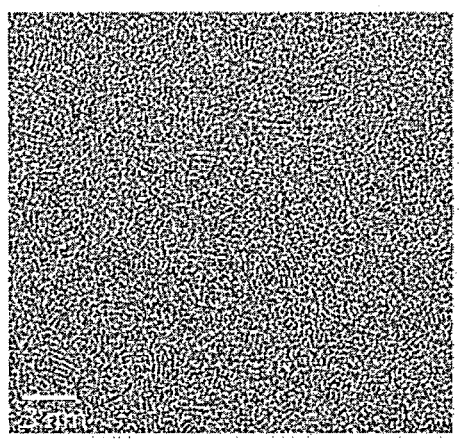
Figure 25D:
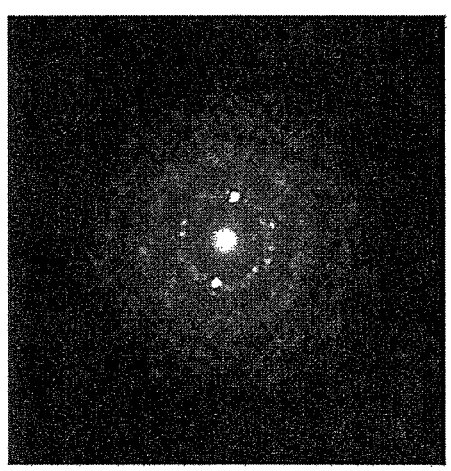
Figure 25E:
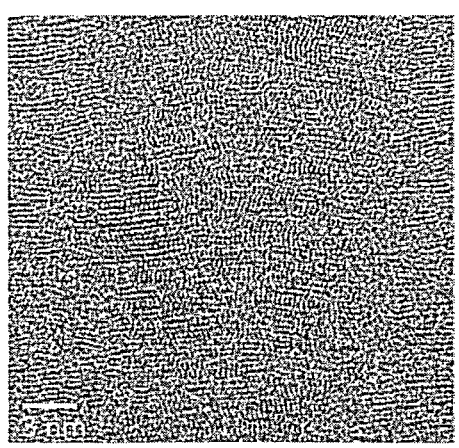
Figure 25F:
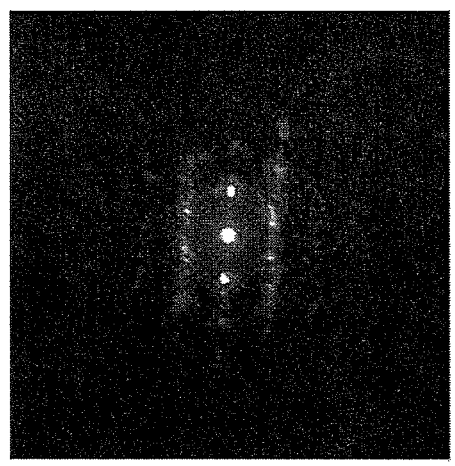

FIG. 25A shows a cross-sectional TEM image of Sample 3A, and FIG. 25B shows an electron diffraction pattern of Sample 3A. FIG. 25C shows a cross-sectional TEM image of Sample 3D, and FIG. 25D shows an electron diffraction pattern of Sample 3D. FIG. 25E shows a cross-sectional TEM image of Sample 3J, and FIG. 25F shows an electron diffraction pattern of Sample 3J.

As shown in FIG. 25A, a nanocrystal is observed in Sample 3A by cross-sectional TEM. In addition, as shown in FIG. 25B, the observed electron diffraction pattern of Sample 3A has a region with high luminance in a circular (ring) pattern. Furthermore, a plurality of spots can be shown in the ring-shaped region.

As shown in FIG. 25C, a CAAC structure and a nanocrystal are observed in Sample 3D by cross-sectional TEM. In addition, as shown in FIG. 25D, the observed electron diffraction pattern of Sample 3D has a region with high luminance in a circular (ring) pattern. Furthermore, a plurality of spots can be shown in the ring-shaped region. In the diffraction pattern, spots derived from the (009) plane are slightly observed.

In contrast, as shown in FIG. 25E, layered arrangement of a CAAC structure is observed in Sample 3J by cross-sectional TEM. Furthermore, spots derived from the (009) plane are included in the electron diffraction pattern of Sample 3J in FIG. 25F.

The features observed in the cross-sectional TEM images and the plan-view TEM images are one aspect of a structure of an oxide semiconductor.

According to the above description, the electron diffraction patterns of Sample 3A and Sample 3D each have a region with high luminance in a ring pattern and a plurality of bright spots appear in the ring-shaped region. Accordingly, Samples 3A and 3D each exhibit an electron diffraction pattern of the nc-OS and do not show alignment in the plane direction and the cross-sectional direction. Sample 3D is found to be a mixed material of the nc structure and the CAAC structure.

In the electron diffraction pattern of Sample 3J, spots derived from the (009) plane of an InGaZnO$_4$ crystal are included. Thus, Sample 3J has c-axis alignment and the c-axes are aligned in the direction substantially perpendicular to the formation surface or the top surface of Sample 3J.

<Analysis of TEM Image>

This section describes the observation and analysis results of Samples 3A, 3D, and 3J with an HAADF-STEM.

The results of image analysis of plan-view TEM images are described. The plan-view TEM images were obtained with a spherical aberration corrector function. The plan-view TEM images were obtained using an atomic resolution analytical electron microscope JEM-ARM200F manufactured by JEOL Ltd. under the following conditions: the acceleration voltage was 200 kV, and irradiation with an electron beam with a diameter of approximately 0.1 nmφ was performed.

Figure 26A:
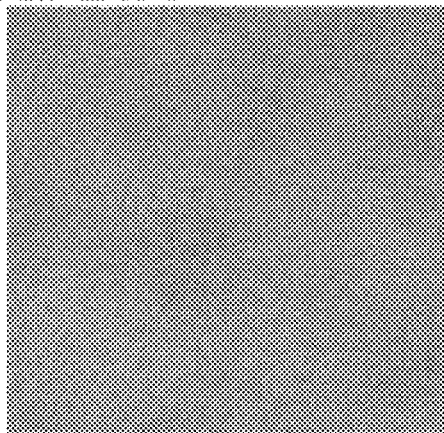
FIGS. 26A to 26F show plan-view TEM images of samples of Example and images obtained through analysis thereof.
Figure 26B:
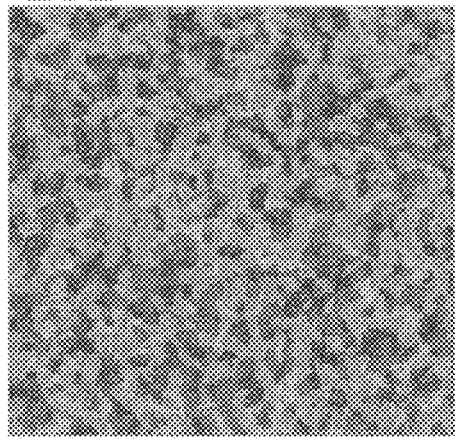
Figure 26C:
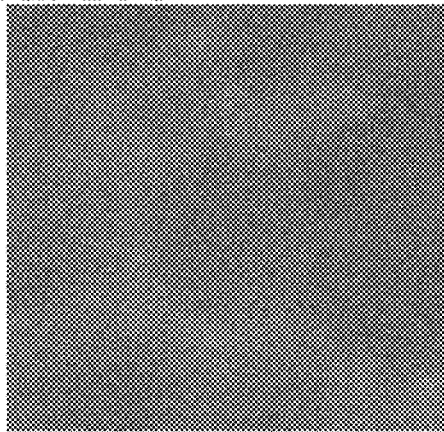
Figure 26D:
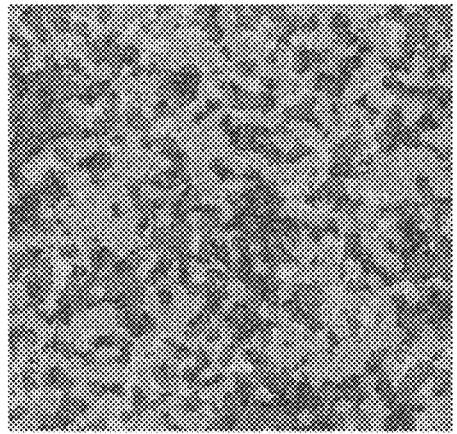
Figure 26E:
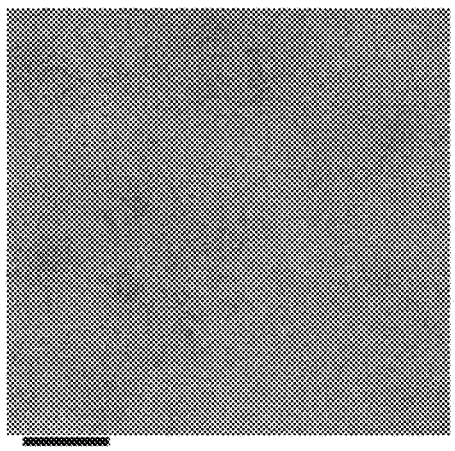

FIG. 26A shows a plan-view TEM image of Sample 3A, and FIG. 26B shows an image obtained through image processing of the plan-view TEM image of Sample 3A. FIG. 26C shows a plan-view TEM image of Sample 3D and FIG. 26D shows an image obtained through image processing of the plan-view TEM image of Sample 3D. FIG. 26E shows a plan-view TEM image of Sample 3J and FIG. 26F shows an image obtained through image processing of the plan-view TEM image of Sample 3J.

Figure 26F:
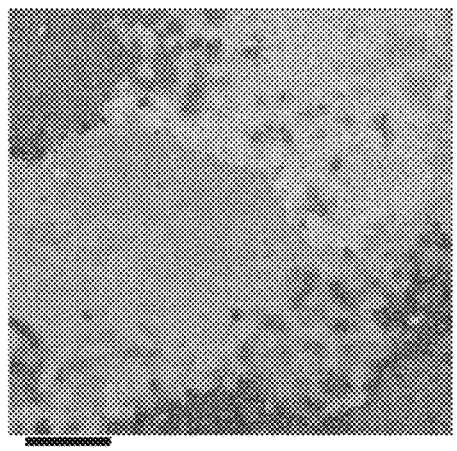

The images obtained through image processing of the plan-view TEM images in FIGS. 26B, 26D, and 26F are images obtained through image analysis of the plan-view TEM images in FIGS. 26A, 26C, and 26E by the method described in Example 1 and applying color in accordance with the angle of the hexagonal lattice. In other words, the images obtained through the image processing of the plan-view TEM images are each an image in which the orientations of lattice points in certain wavenumber ranges are extracted by color-coding the certain wavenumber ranges and providing gradation in the ranges in an FFT filtering image of the plan-view TEM image.

As shown in FIGS. 26A to 26F, in Samples 3A and 3D in which nc is observed, the hexagons are oriented randomly and distributed in a mosaic pattern. In Sample 3J in which a layered structure is observed in the cross-sectional TEM image, regions with uniformly oriented hexagons exist in a large area of several tens of nanometers. In Sample 3D, it is found that an nc region in a random mosaic pattern and a large-area region with uniformly oriented hexagons as in Sample 3J are included.

It is found from FIGS. 26A to 26F that as the substrate temperature at the time of formation is lower or the oxygen gas flow rate ratio at the time of formation is lower, regions in which the hexagons are oriented randomly and distributed in a mosaic pattern are likely to exist.

Through the analysis of a plan-view TEM image of a CAAC-OS, a boundary portion where angles of hexagonal lattices change can be examined.

Next, Voronoi diagrams were formed using lattice point groups in Sample 3A. The Voronoi diagrams were obtained by the method described in Example 1.

Figure 27A:
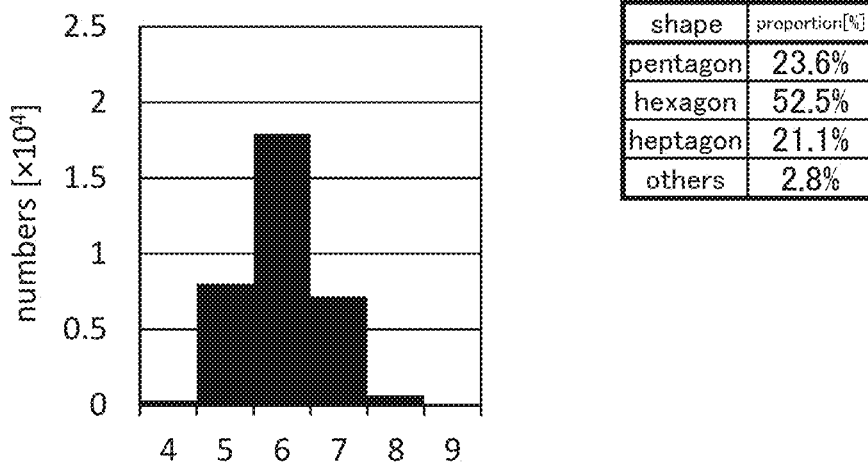
FIGS. 27A to 27C show the number and proportions of shapes of Voronoi regions of Example.
Figure 27B:
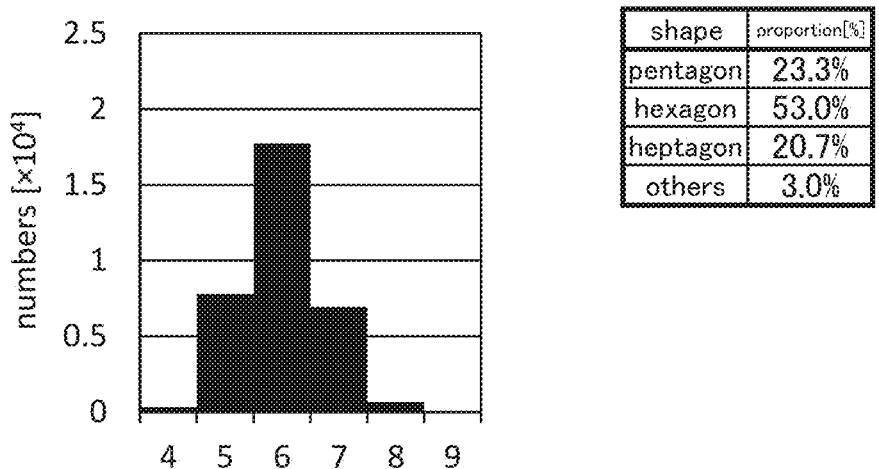
Figure 27C:
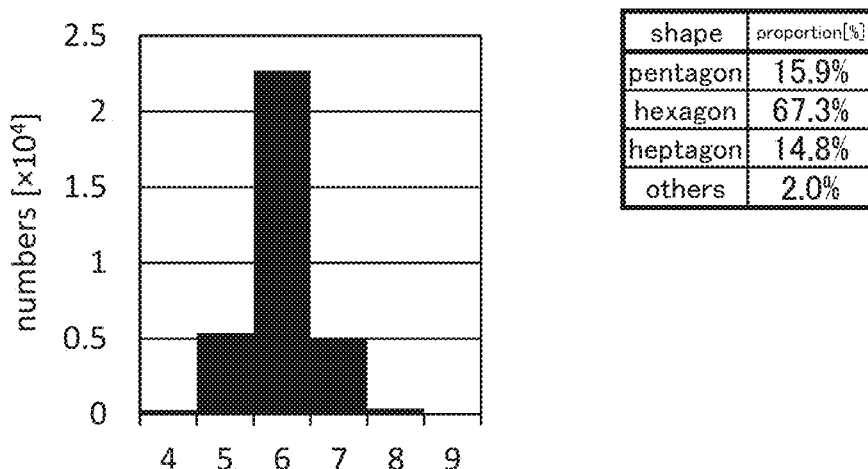

FIGS. 27A to 27C show the proportions of the shapes of Voronoi regions (tetragon, pentagon, hexagon, heptagon, octagon, and enneagon) in Samples 3A, 3D, and 3J, respectively. Bar graphs show the numbers of the shapes of Voronoi regions (tetragon, pentagon, hexagon, heptagon, octagon, and enneagon) in the samples. Furthermore, tables show the proportions of the shapes of Voronoi regions (tetragon, pentagon, hexagon, heptagon, octagon, and enneagon) in the samples.

It is found from FIGS. 27A to 27C that there is a tendency that the proportion of hexagons is high in Sample 3J with a high degree of crystallinity and the proportion of hexagons is low in Sample 3A with a low degree of crystallinity. The proportion of hexagons in Sample 3D is between those in Samples 3J and 3A. Accordingly, it is found from FIGS. 27A to 27C that the crystal state of the oxide semiconductor significantly differs under different formation conditions.

It is found from FIGS. 27A to 27C that as the substrate temperature at the time of formation is lower or the oxygen gas flow rate ratio at the time of formation is lower, the degree of crystallinity is lower and the proportion of hexagons is lower.

<Elementary Analysis>

This section describes the analysis results of elements included in Sample 3A. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this example, peaks of an EDX spectrum of the point were attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

FIGS. 28A to 28H show a cross-sectional TEM image, a plan-view TEM image, and EDX mapping images of Sample 3A. In the EDX mapping images, the proportion of an element is indicated by grayscale: the more measured atoms exist in a region, the brighter the region is; the less measured atoms exist in a region, the darker the region is. The magnification of the EDX mapping images in FIGS. 28B to 28D and 28F to 28H is 7,200,000 times.

Figure 28D:
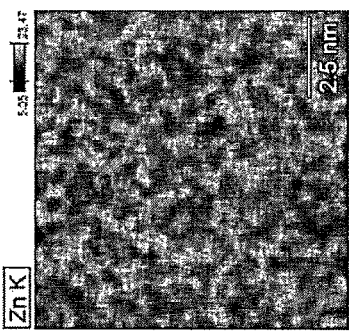
FIGS. 28A to 28H show a plan-view TEM image, a cross-sectional TEM image, and EDX mapping images of a sample of Example.
Figure 28C:
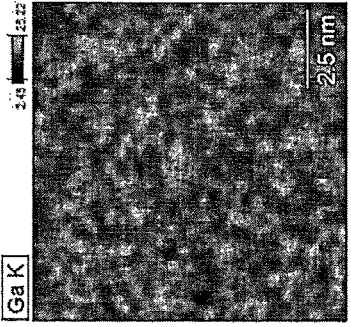
Figure 28B:
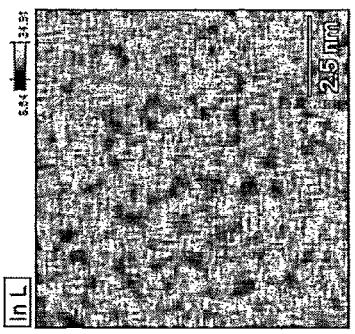
Figure 28A:
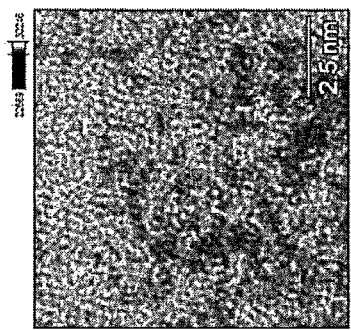
Figure 28H:
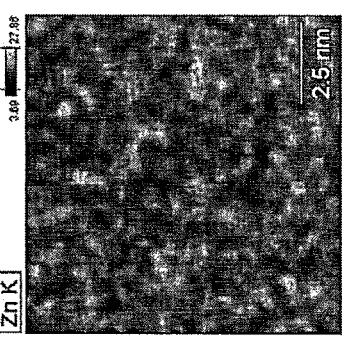
Figure 28G:
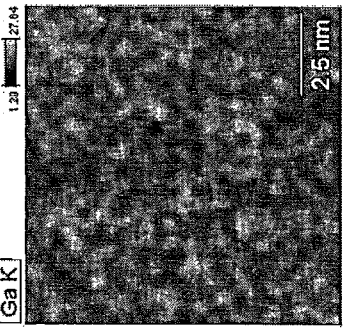
Figure 28F:
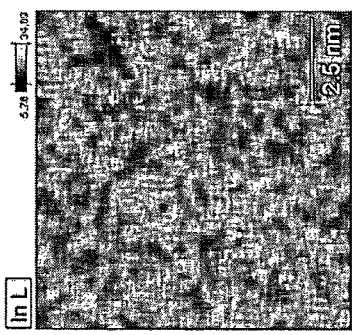
Figure 28E:
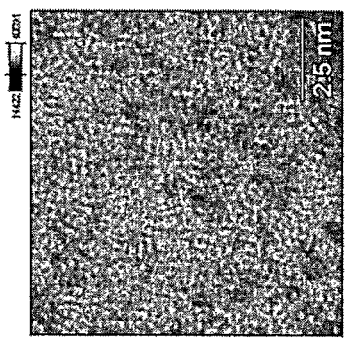

FIG. 28A shows a cross-sectional TEM image, and FIG. 28E shows a plan-view TEM image. FIG. 28B shows a cross-sectional EDX mapping image of In atoms, and FIG. 28F shows a plan-view EDX mapping image of In atoms. In the EDX mapping image in FIG. 28B, the proportion of the In atoms in all the atoms is 8.64 atomic % to 34.91 atomic %. In the EDX mapping image in FIG. 28F, the proportion of the In atoms in all the atoms is 5.76 atomic % to 34.69 atomic %.

FIG. 28C shows a cross-sectional EDX mapping image of Ga atoms, and FIG. 28G shows a plan-view EDX mapping image of Ga atoms. In the EDX mapping image in FIG. 28C, the proportion of the Ga atoms in all the atoms is 2.45 atomic % to 25.22 atomic %. In the EDX mapping image in FIG. 28G, the proportion of the Ga atoms in all the atoms is 1.29 atomic % to 27.64 atomic %.

FIG. 28D shows a cross-sectional EDX mapping image of Zn atoms, and FIG. 28H shows a plan-view EDX mapping image of Zn atoms. In the EDX mapping image in FIG. 28D, the proportion of the Zn atoms in all the atoms is 5.05 atomic % to 23.47 atomic %. In the EDX mapping image in FIG. 28H, the proportion of the Zn atoms in all the atoms is 3.69 atomic % to 27.86 atomic %.

Note that FIGS. 28A to 28D show the same region in the cross section of Sample 3A. FIGS. 28E to 28H show the same region in the plane of Sample 3A.

Figure 29A:
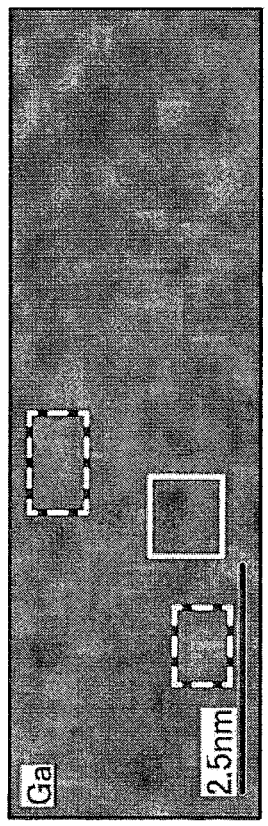
FIGS. 29A to 29C show EDX mapping images of a sample of Example.
Figure 29B:
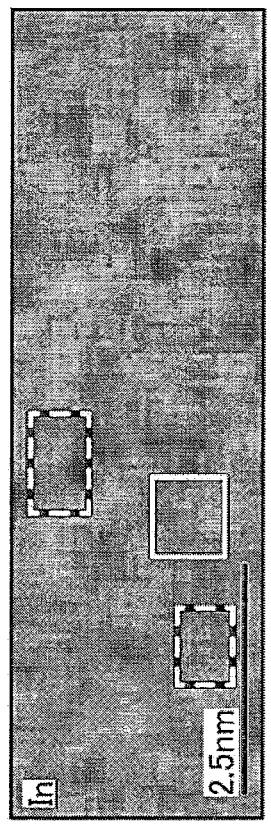
Figure 29C:
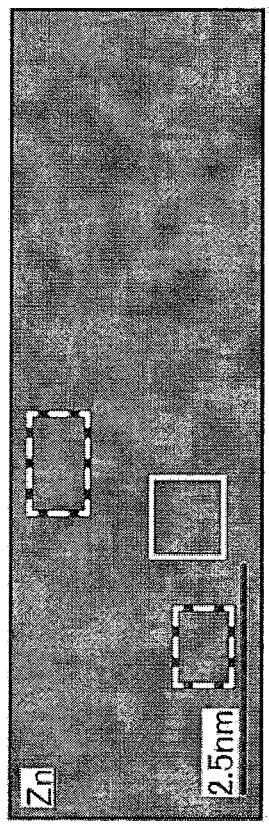

FIGS. 29A to 29C show enlarged cross-sectional EDX mapping images of Sample 3A. FIG. 29A is an enlarged view of a part in FIG. 28B. FIG. 29B is an enlarged view of a part in FIG. 28C. FIG. 29C is an enlarged view of a part in FIG. 28D.

The EDX mapping images in FIGS. 29A to 29C show relative distribution of bright and dark areas, indicating that the atoms have distributions in Sample 3A. Areas surrounded by solid lines and areas surrounded by dashed lines in FIGS. 29A to 29C are examined.

As shown in FIG. 29A, a relatively dark region occupies a large area in the area surrounded by the solid line and a relatively bright region occupies a large area in the area surrounded by the dashed line. As shown in FIG. 29B, a relatively bright region occupies a large area in the area surrounded by the solid line and a relatively dark region occupies a large area in the area surrounded by the dashed line.

That is, it is found that the areas surrounded by the solid lines are regions including a relatively large number of In atoms and the areas surrounded by the dashed lines are regions including a relatively small number of In atoms. FIG. 29C shows that an upper portion of the area surrounded by the solid line is relatively bright and a lower portion thereof is relatively dark. Thus, it is found that the area surrounded by the solid line is a region including $In_{X2}Zn_{Y2}O_{Z2}$, $InO_{X1}$, or the like as a main component.

It is found that the area surrounded by the solid line is a region including a relatively small number of Ga atoms and the area surrounded by the dashed line is a region including a relatively large number of Ga atoms. As shown in FIG. 29C, a relatively bright region occupies a large area in a right portion in the area surrounded by the upper dashed line and a dark region occupies a large area in a left portion therein. As shown in FIG. 29C, a relatively bright region occupies a large area in an upper left portion in the area surrounded by the lower dashed line and a dark region occupies a large area in a lower right portion therein. Thus, it is found that the area surrounded by the dashed line is a region including $GaO_{X3}$, $Ga_{X4}Zn_{Y4}O_{Z4}$, or the like as a main component.

Furthermore, as shown in FIGS. 29A to 29C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. It can be thus guessed that the regions including $In_{X2}Zn_{Y2}O_{Z2}$ or $InO_{X1}$ as a main component extend like a cloud.

An In—Ga—Zn oxide having a composition in which the regions including $GaO_{X3}$ as a main component and the regions including $In_{X2}Zn_{Y2}O_{Z2}$ or $InO_{X1}$ as a main component are unevenly distributed and mixed can be referred to as CAC-IGZO.

As shown in FIGS. 29A to 29C, each of the regions including $GaO_{X3}$ as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm.

As described above, it is confirmed that the CAC-IGZO has a structure different from that of an IGZO compound in which metal elements are evenly distributed, and has characteristics different from those of the IGZO compound. That is, it can be confirmed that in the CAC-IGZO, regions including $GaO_{X3}$ or the like as a main component and regions including $In_{X2}Zn_{Y2}O_{Z2}$ or $InO_{X1}$ as a main component are separated to form a mosaic pattern.

Accordingly, it can be expected that when CAC-IGZO is used for a semiconductor element, the property derived from $GaO_{X3}$ or the like and the property derived from $In_{X2}Zn_{Y2}O_{Z2}$ or $InO_{X1}$ complement each other, whereby high on-state current ($I_{on}$), high field-effect mobility ($\mu$), and low off-state current ($I_{off}$) can be achieved. A semiconductor element including CAC-IGZO has high reliability. Thus, CAC-IGZO is suitably used in a variety of semiconductor devices typified by a display.

At least part of this example can be implemented in combination with any of embodiments and the other examples described in this specification as appropriate.

Example 4

In this example, the transistor 150 including the oxide semiconductor 108 of one embodiment of the present invention was fabricated and subjected to tests for electrical characteristics and reliability. In this example, nine transistors, i.e., Samples 4A, 4B, 4C, 4D, 4E, 4F, 4G, 4H, and 4J, were fabricated as the transistor 150 including the oxide semiconductor 108.

<<Structure of Samples and Fabrication Method Thereof>>

Samples 4A to 4H and 4J relating to one embodiment of the present invention are described below. As Samples 4A to 4H and 4J, the transistors 150 having the structure illustrated in FIGS. 3A to 3C were fabricated by the fabrication method described in Embodiment 2 with reference to FIGS. 6A to 6D, FIGS. 7A to 7C, and FIGS. 8A to 8C.

Samples 4A to 4H and 4J were fabricated at different temperatures and different oxygen flow rate ratios in formation of the oxide semiconductor 108. The temperatures and the oxygen flow rates in formation of the oxide semiconductor of Samples 4A to 4H and 4J are shown in Table 4 below.

TABLE 4

| | Formation conditions of oxide semiconductor film 108 | | | |
|---|---|---|---|---|
| | Flow rate [sccm] | | Percentage of $O_2$ | Deposition temperature |
| | $O_2$ | Ar | [%] | [° C.] |
| Sample 4A | 30 | 270 | 10 | R.T. |
| Sample 4B | 90 | 210 | 30 | R.T. |
| Sample 4C | 150 | 150 | 50 | R.T. |
| Sample 4D | 30 | 270 | 10 | 130 |
| Sample 4E | 90 | 210 | 30 | 130 |
| Sample 4F | 150 | 150 | 50 | 130 |
| Sample 4G | 30 | 270 | 10 | 170 |
| Sample 4H | 90 | 210 | 30 | 170 |
| Sample 4J | 150 | 150 | 50 | 170 |

The samples were fabricated by the fabrication method described in Embodiment 2. The oxide semiconductor 108 was formed using a metal oxide target (In:Ga:Zn=1:1:1.2 [atomic ratio]).

The transistor 150 had a channel length of 2 μm and a channel width of 3 μm (hereinafter, also referred to as L/W=2/3 μm).

<$I_d$-$V_g$ Characteristics of Transistors>

Next, $I_d$-$V_g$ characteristics of the transistors (L/W=2/3 μm) in Samples 4A to 4J were measured. As conditions for measuring the $I_d$-$V_g$ characteristics of each transistor, a voltage applied to the conductive film 112 serving as a first gate electrode (hereinafter the voltage is also referred to as gate voltage ($V_g$)) and a voltage applied to the conductive film 106 serving as a second gate electrode (hereinafter the voltage is also referred to as back gate voltage ($V_{bg}$)) were changed from −10 V to +10 V in increments of 0.25 V. A voltage applied to the conductive film 120a serving as a source electrode (the voltage is also referred to as source voltage ($V_s$)) was 0 V (comm), and a voltage applied to the conductive film 120b serving as a drain electrode (the voltage is also referred to as drain voltage ($V_d$)) was 0.1 V and 20 V.

Figure 30:
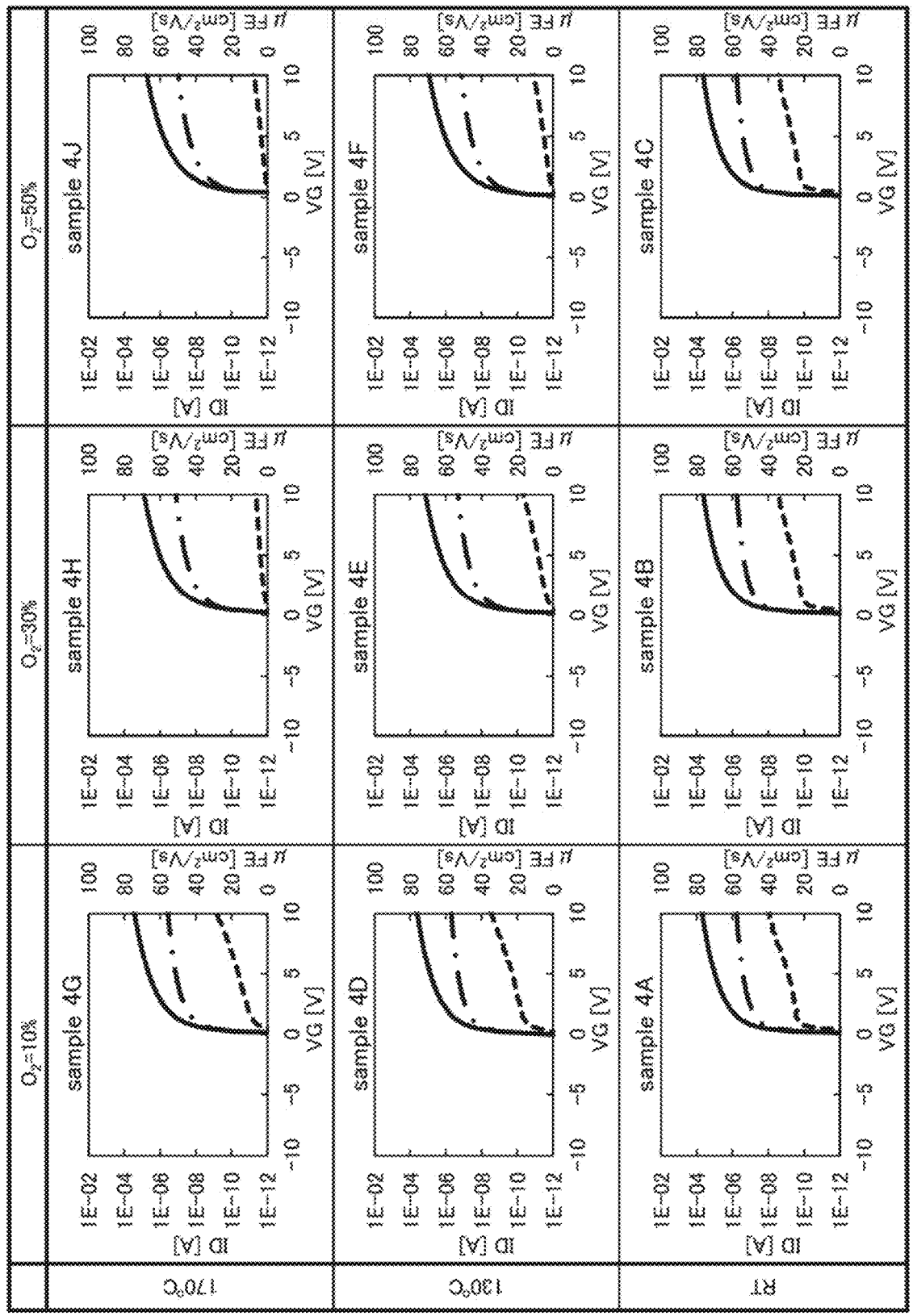
FIG. 30 shows $I_d$-$V_g$ curves of samples of Example.

In FIG. 30, the results of $I_d$-$V_g$ characteristics and field-effect mobilities of Samples 4A to 4H and 4J are shown. The solid line and the dashed-dotted line represent $I_d$ at $V_d$=20 V and $I_d$ at $V_d$=0.1 V, respectively. The dashed line represents field-effect mobility. In FIG. 30, the first vertical axis represents $I_d$ [A], the second vertical axis represents field-effect mobility (μFE) [cm²/Vs], and the horizontal axis represents $V_g$ [V]. The field-effect mobility is calculated from a value measured at $V_d$=20 V.

As shown in FIG. 30, the transistors 150 of Samples 4A to 4H and 4J have normally-off characteristics. As shown in FIG. 30, it is found that Samples 4A to 4H and 4J have different on-state currents ($I_{on}$) and different field effect mobilities, particularly different field effect mobilities in saturation regions. In particular, the maximum saturation mobilities and the rising characteristics of the field-effect mobilities around 0 V differ distinctly.

It is found from FIG. 30 that as the substrate temperature at the time of formation is lower or the oxygen gas flow rate ratio at the time of formation is lower, the field-effect mobility at low $V_g$ is significantly higher. In particular, Sample 4A has a maximum field-effect mobility close to 40 cm²/Vs. Having high mobility at low $V_g$ means being suitable for high-speed driving at low voltage; therefore, application to a variety of semiconductor devices typified by a display can be expected.

At least part of this example can be implemented in combination with any of embodiments and the other examples described in this specification as appropriate.

REFERENCE NUMERALS

001: region, 002: region, 003: region, 100: transistor, 102: substrate, 104: insulating film, 106: conductive film, 108: oxide semiconductor film, 108a: oxide semiconductor film, 108n: region, 110: insulating film, 110_0: insulating film, 112: conductive film, 112_0: conductive film, 112_1: conductive film, 112_2: conductive film, 116: insulating film, 118: insulating film, 120a: conductive film, 120b: conductive film, 122: insulating film, 140: mask, 141a: opening, 141b: opening, 143: opening, 150: transistor, 160: transistor, 300A: transistor, 300B: transistor, 300C: transistor, 300D: transistor, 302: substrate, 304: conductive film, 306: insulating film, 307: insulating film, 308: oxide semiconductor film, 312a: conductive film, 312b: conductive film, 314: insulating film, 316: insulating film, 318: insulating film, 320a: conductive film, 320b: conductive film, 341a: opening, 341b: opening, 342a: opening, 342b: opening, 342c: opening.

This application is based on Japanese Patent Application Serial No. 2016-100939 filed with Japan Patent Office on May 19, 2016, the entire contents of which are hereby incorporated by reference.

The invention claimed is:

1. A semiconductor device comprising:
   a substrate;
   an oxide semiconductor layer over the substrate, the oxide semiconductor layer comprising:
      a plurality of first regions; and
      a plurality of second regions;
   a gate insulating layer over the oxide semiconductor layer;
   a gate electrode over the gate insulating layer; and
   a source electrode and a drain electrode over the gate insulating layer,
   wherein the oxide semiconductor layer comprises In, Zn, and element M,
   wherein element M is one of Ga, Al, Hf, Y and Sn,
   wherein each of In concentrations in the plurality of first regions is higher than each of In concentrations in the plurality of second regions,
   wherein the plurality of first regions comprise two first regions arranged in a parallel direction to a top surface of the substrate in a cross-sectional image of the semiconductor device,
   wherein the plurality of second regions comprise two second regions arranged in a parallel direction to the top surface of the substrate in the cross-sectional image of the semiconductor device,
   wherein one of the plurality of first regions is interposed between the two second regions,
   wherein the one of the plurality of first regions has a diameter greater than or equal to 0.5 nm and less than or equal to 10 nm in the cross-sectional image,
   wherein one of the plurality of second regions is interposed between the two first regions, and
   wherein the one of the plurality of second regions has a diameter greater than or equal to 0.5 nm and less than or equal to 10 nm in the cross-sectional image.

2. The semiconductor device according to claim 1, wherein the oxide semiconductor layer further comprises one of Ga, Al, Hf, Y and Sn other than element M.

3. The semiconductor device according to claim 1, wherein the oxide semiconductor layer shows a nanobeam electron diffraction pattern with a plurality of bright spots arranged in a ring-like shape.

4. The semiconductor device according to claim 1, wherein the plurality of first regions and the plurality of second regions are dispersed randomly in the oxide semiconductor layer.

5. The semiconductor device according to claim 1, wherein the cross-sectional image is an image obtained by a high-angle annular dark-field scanning transmission electron microscope.

6. The semiconductor device according to claim 1,
   wherein the one of the plurality of first regions comprises one of $InO_{X1}$ and $In_{X2}Zn_{Y2}O_{Z2}$,
   wherein the one of the plurality of second regions comprises one of $MO_{X3}$ and $M_{X4}Zn_{Y4}O_{Z4}$, and
   wherein each of X1, X2, Y2, Z2, X3, X4, Y4 and Z4 is a real number greater than 0.

7. A semiconductor device comprising:
   a substrate;
   a gate electrode over the substrate;
   a gate insulating layer over the gate electrode;
   an oxide semiconductor layer over the gate insulating layer, the oxide semiconductor layer comprising:
      a plurality of first regions; and
      a plurality of second regions; and
   a source electrode and a drain electrode over the oxide semiconductor layer,
   wherein the oxide semiconductor layer comprises In, Zn, and element M,
   wherein element M is one of Ga, Al, Hf, Y and Sn,
   wherein each of In concentrations in the plurality of first regions is higher than each of In concentrations in the plurality of second regions,
   wherein the plurality of first regions comprise two first regions arranged in a parallel direction to a top surface of the substrate in a cross-sectional image of the semiconductor device,
   wherein the plurality of second regions comprise two second regions arranged in a parallel direction to the top surface of the substrate in the cross-sectional image of the semiconductor device, wherein one of the plurality of first regions is interposed between the two second regions, wherein the one of the plurality of first regions has a diameter greater than or equal to 0.5 nm and less than or equal to 10 nm in the cross-sectional image, wherein one of the plurality of second regions is interposed between the two first regions, and wherein the one of the plurality of second regions has a diameter greater than or equal to 0.5 nm and less than or equal to 10 nm in the cross-sectional image.

8. The semiconductor device according to claim 7, wherein the oxide semiconductor layer further comprises one of Ga, Al, Hf, Y and Sn other than element M.

9. The semiconductor device according to claim 7, wherein the oxide semiconductor layer shows a nanobeam electron diffraction pattern with a plurality of bright spots arranged in a ring-like shape.

10. The semiconductor device according to claim 7, wherein the plurality of first regions and the plurality of second regions are dispersed randomly in the oxide semiconductor layer.

11. The semiconductor device according to claim 7, wherein the cross-sectional image is an image obtained by a high-angle annular dark-field scanning transmission electron microscope.

12. The semiconductor device according to claim 7,
wherein the one of the plurality of first regions comprises one of $InO_{X1}$ and $In_{X2}Zn_{Y2}O_{Z2}$,
wherein the one of the plurality of second regions comprises one of $MO_{X3}$ and $M_{X4}Zn_{Y4}O_{Z4}$, and
wherein each of X1, X2, Y2, Z2, X3, X4, Y4 and Z4 is a real number greater than 0.

13. A semiconductor device comprising:
a substrate;
an oxide semiconductor layer comprising:
a plurality of first regions; and
a plurality of second regions;
a gate insulating layer;
a gate electrode overlapping with the oxide semiconductor layer with the gate insulating layer inbetween; and
a source electrode and a drain electrode electrically connected to the oxide semiconductor layer,
wherein the oxide semiconductor layer comprises In, Zn, and element M,
wherein element M is one of Ga, Al, Hf, Y and Sn,
wherein each of In concentrations in the plurality of first regions is higher than each of In concentrations in the plurality of second regions, wherein the plurality of first regions comprise two first regions arranged in a parallel direction to a top surface of the substrate in a cross-sectional image of the semiconductor device, wherein the plurality of second regions comprise two second regions arranged in a parallel direction to the top surface of the substrate in the cross-sectional image of the semiconductor device, wherein one of the plurality of first regions is interposed between the two second regions, wherein the one of the plurality of first regions has a diameter greater than or equal to 0.5 nm and less than or equal to 10 nm in the cross-sectional image, wherein one of the plurality of second regions is interposed between the two first regions, and wherein the one of the plurality of second regions has a diameter greater than or equal to 0.5 nm and less than or equal to 10 nm in the cross-sectional image.

14. The semiconductor device according to claim 13, wherein the oxide semiconductor layer further comprises one of Ga, Al, Hf, Y and Sn other than element M.

15. The semiconductor device according to claim 13, wherein the oxide semiconductor layer shows a nanobeam electron diffraction pattern with a plurality of bright spots arranged in a ring-like shape.

16. The semiconductor device according to claim 13, wherein the plurality of first regions and the plurality of second regions are dispersed randomly in the oxide semiconductor layer.

17. The semiconductor device according to claim 13, wherein the cross-sectional image is an image obtained by a high-angle annular dark-field scanning transmission electron microscope.

18. The semiconductor device according to claim 13,
wherein the one of the plurality of first regions comprises one of $InO_{X1}$ and $In_{X2}Zn_{Y2}O_{Z2}$,
wherein the one of the plurality of second regions comprises one of $MO_{X3}$ and $M_{X4}Zn_{Y4}O_{Z4}$, and
wherein each of X1, X2, Y2, Z2, X3, X4, Y4 and Z4 is a real number greater than 0.

* * * * *